US012588411B2

(12) United States Patent
Baek et al.

(10) Patent No.: US 12,588,411 B2
(45) Date of Patent: Mar. 24, 2026

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Jang Yeol Baek, Yongin-si (KR); Seran Kim, Suwon-si (KR); Taeil Kim, Hwaseong-si (KR); Sun Young Pak, Suwon-si (KR); Junha Park, Gwacheon-si (KR); Kyoung Sunwoo, Hwaseong-si (KR); Mun-Ki Sim, Seoul (KR); Chanseok Oh, Seoul (KR); Minjung Jung, Gangwon-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 1021 days.

(21) Appl. No.: 17/690,678

(22) Filed: Mar. 9, 2022

(65) Prior Publication Data

US 2023/0050214 A1 Feb. 16, 2023

(30) Foreign Application Priority Data

Jun. 30, 2021 (KR) ........................ 10-2021-0085934

(51) Int. Cl.

| | |
|---|---|
| ***H01L 51/00*** | (2006.01) |
| ***C09K 11/06*** | (2006.01) |

(Continued)

(52) U.S. Cl.

CPC ............ *H10K 85/658* (2023.02); *C09K 11/06* (2013.01); *H10K 85/631* (2023.02);

(Continued)

(58) Field of Classification Search

None

See application file for complete search history.

(56) References Cited

U.S. PATENT DOCUMENTS

| | | | |
|---|---|---|---|
| 10,374,166 | B2 | 8/2019 | Hatakeyama et al. |
| 11,588,120 | B2 | 2/2023 | Sim et al. |

(Continued)

FOREIGN PATENT DOCUMENTS

| | | | |
|---|---|---|---|
| CA | 2547799 | A1 * | 11/2006 |
| FR | 2990058 | A1 * | 11/2013 |

(Continued)

OTHER PUBLICATIONS

Anton Pershin et al., "Highly emissive excitons with reduced exchange energy in thermally activated delayed fluorescent molecules", Nature Communications, Feb. 5, 2019, pp. 1-5, vol. 10, No. 597.

(Continued)

*Primary Examiner* — Tae H Yoon

(74) *Attorney, Agent, or Firm* — Womble Bond Dickinson (US) LLP

(57) ABSTRACT

An organic electroluminescence device of an embodiment includes a first electrode, a second electrode facing the first electrode, and organic layers disposed between the first electrode and the second electrode, wherein the organic (Continued)

layers include at least one organic layer that includes a fused polycyclic compound represented by Formula 1, thereby showing improved emission efficiency.

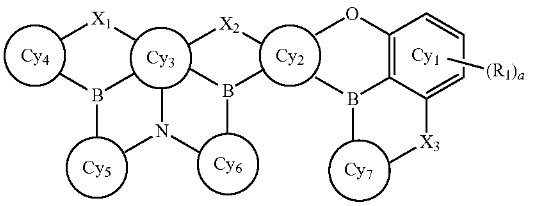

20 Claims, 6 Drawing Sheets

(51) Int. Cl.

| | |
|---|---|
| ***H10K 85/60*** | (2023.01) |
| *H10K 50/11* | (2023.01) |
| *H10K 50/15* | (2023.01) |
| *H10K 101/10* | (2023.01) |

(52) U.S. Cl.
CPC ........ *C09K 2211/188* (2013.01); *H10K 50/11* (2023.02); *H10K 50/15* (2023.02); *H10K 2101/10* (2023.02)

(56) References Cited

U.S. PATENT DOCUMENTS

| | | | | |
|---|---|---|---|---|
| 11,800,793 | B2 * | 10/2023 | Pak | C09K 11/06 |
| 2020/0044159 | A1 | 2/2020 | Yamatani | |
| 2020/0190115 | A1 | 6/2020 | Hatakeyama et al. | |
| 2021/0159411 | A1 | 5/2021 | Sim et al. | |
| 2021/0391540 | A1 | 12/2021 | Lee et al. | |

FOREIGN PATENT DOCUMENTS

| | | |
|---|---|---|
| KR | 10-2016-0119683 | 10/2016 |
| KR | 10-2019-0114999 | 10/2019 |
| KR | 10-2020-0014451 | 2/2020 |
| KR | 10-2020-0121228 | 10/2020 |
| KR | 2021-0064496 A | 6/2021 |
| KR | 10-2021-0154288 | 12/2021 |
| WO | 2018/212169 | 11/2018 |

OTHER PUBLICATIONS

Yasuhiro Kondo et al., "Narrowband deep-blue organic light-emitting diode featuring an organoboron-based emitter", Nature Photonics, Jul. 15, 2019, pp. 678-682, vol. 13, https://doi.org/10.1038/s41566-019-0476-5.

* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application No. 10-2021-0085934 under 35 U.S.C. § 119, filed on Jun. 30, 2021 in the Korean Intellectual Property Office, the entire contents of which are incorporated herein by reference.

BACKGROUND

1. Technical Field

The disclosure relates to a fused polycyclic compound used as a light-emitting material and an organic electroluminescence device including the same.

2. Description of the Related Art

Active development continues for an organic electroluminescence display as an image display. In contrast to a liquid crystal display, the organic electroluminescence display is a so-called self-luminescent display in which holes and electrons respectively injected from a first electrode and a second electrode recombine in an emission layer, and a light-emitting material including an organic compound in the emission layer emits light to achieve display.

In the application of an organic electroluminescence device to an image display, there is a demand for decreasing driving voltage, and for increasing emission efficiency and the life of the organic electroluminescence device, and continuous development is required on materials for an organic electroluminescence device which stably achieves such characteristics.

Recently, in order to achieve an organic electroluminescence device with high efficiency, techniques on phosphorescence emission which uses energy in a triplet state or techniques on delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organic electroluminescence device having improved emission efficiency.

The disclosure also provides a fused polycyclic compound capable of improving the emission efficiency of an organic electroluminescence device.

An embodiment provides an organic electroluminescence device which may include a first electrode, a second electrode facing the first electrode, and organic layers disposed between the first electrode and the second electrode. The organic layers may include at least one organic layer that includes a fused polycyclic compound which may be represented by Formula 1, and at least one organic layer that includes an amine compound represented by Formula H-1:

[Formula 1]

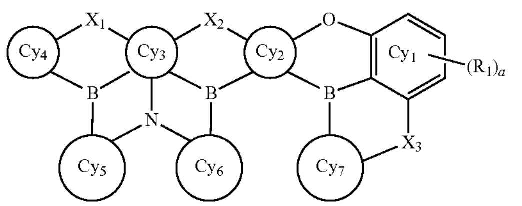

[Formula H-1]

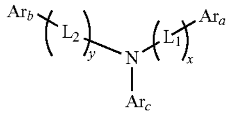

In Formula 1, $Cy_2$ to $Cy_7$ may each independently be a substituted or unsubstituted aromatic hydrocarbon ring, or a substituted or unsubstituted aromatic heterocycle, $X_1$ to $X_3$ may each independently be $N(Ar_1)$, O, S, or Se, $Ar_1$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_1$ may be a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a may be an integer from 1 to 3, and an atom in $R_1$ that is bonded to $Cy_1$ may not be nitrogen.

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms, x and y may each independently be an integer from 0 to 10, $Ar_a$ and $Ar_b$, may each independently be a substituted or unsubstituted aryl group of 6 to 30 ring-forming carbon atoms, or a substituted or unsubstituted heteroaryl group of 2 to 30 ring-forming carbon atoms, and $Ar_c$ may be a substituted or unsubstituted aryl group of 6 to 30 ring-forming carbon atoms.

In an embodiment, the organic layers may include a hole transport region disposed on the first electrode, an emission layer disposed on the hole transport region, and an electron transport region disposed on the emission layer, and the emission layer may include the fused polycyclic compound represented by Formula 1.

In an embodiment, the emission layer may emit delayed fluorescence.

In an embodiment, the emission layer may be a delayed fluorescence emission layer including a first compound and a second compound, and the first compound may include the fused polycyclic compound represented by Formula 1.

In an embodiment, the hole transport region may include a hole transport layer disposed on the first electrode, and an electron blocking layer disposed on the hole transport layer, and the hole transport layer may include the amine compound represented by Formula H-1.

In an embodiment, the fused polycyclic compound represented by Formula 1 may be represented by Formula 2:1

[Formula 2]

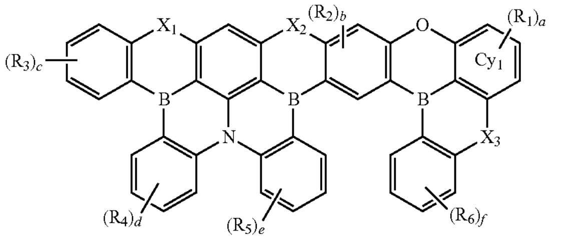

In Formula 2, $R_2$ to $R_6$ may each independently be a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, b may be an integer from 0 to 2, c to f may each independently be an integer from 0 to 4, and $X_1$ to $X_3$, $R_1$, and a may be the same as defined in Formula 1.

In an embodiment, the fused polycyclic compound represented by Formula 2 may be represented by Formula 3:

[Formula 3]

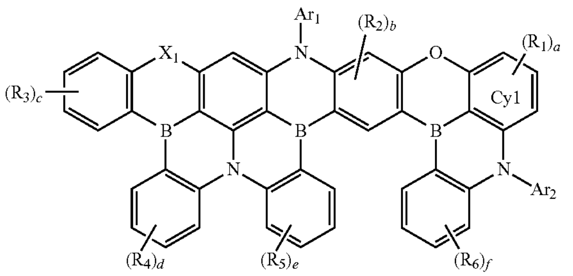

In Formula 3, $Ar_1$ and $Ar_2$ may each independently be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $R_1$ to $R_6$, and a to f may be the same as defined in Formula 1 and Formula 2.

In an embodiment, the fused polycyclic compound represented by Formula 2 may be represented by Formula 4:

[Formula 4]

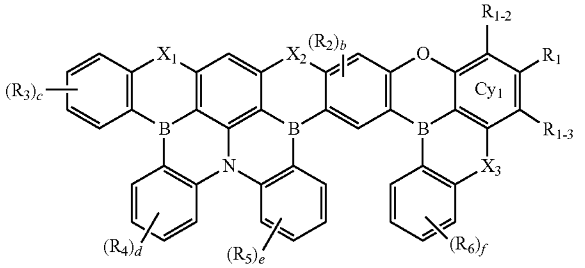

In Formula 4, $R_1$ may be a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_{1-2}$ and $R_{1-3}$ may each independently be a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, an atom in $R_1$ that is bonded to $Cy_1$ may not be nitrogen, an atom in $R_{1-2}$ that is bonded to $Cy_1$ may not be nitrogen, an atom in $R_{1-3}$ that is bonded to $Cy_1$ may not be nitrogen, and $X_1$ to $X_3$, $R_2$ to $R_6$, and b to f may be the same as defined in) Formula 1 and Formula 2.

In an embodiment, in Formula 4, $R_1$ may be a substituted or unsubstituted aryl group of 6 to 60 ring-forming carbon atoms, or a substituted or unsubstituted heteroaryl group of 2 to 60 ring-forming carbon atoms.

In an embodiment, $R_1$ may be a group represented by any one of Formula 6-1 to Formula 6-3:

6-1

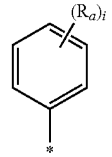

6-2

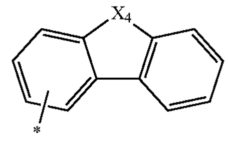

6-3

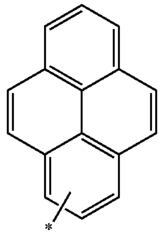

In Formula 6-1 to Formula 6-3, $R_a$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, i may be an integer from 0 to 5, $X_4$ may be $N(R_{10})$, O, S or $C(R_{11})(R_{12})$, $R_{10}$ to $R_{12}$ may each independently be a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and * represents a binding site to a neighboring atom.

In an embodiment, in Formula 1, if $X_1$ to $X_3$ are each independently $N(Ar_1)$, then $Ar_1$ may be a substituted or unsubstituted aryl group of 6 to 60 ring-forming carbon atoms.

In an embodiment, the fused polycyclic compound represented by Formula 3 may be represented by Formula 5:

[Formula 5]

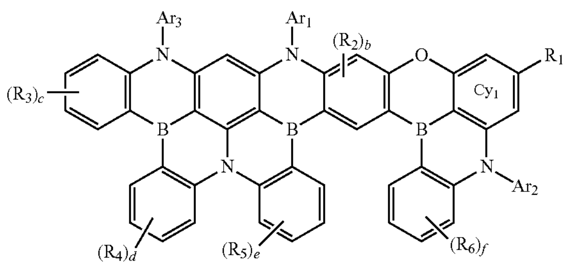

In Formula 5, $Ar_3$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $Ar_1$, $Ar_2$, $X_1$, $R_1$ to $R_6$, and b to f may be the same as defined in Formula 1, Formula 2, and Formula 3.

In an embodiment, the fused polycyclic compound represented by Formula 1 may include at least one selected from Compound Group 1.

Another embodiment provides an organic electroluminescence device which may include a first electrode, a hole transport region disposed on the first electrode, an emission layer disposed on the hole transport region, an electron transport region disposed on the emission layer, and a second electrode disposed on the electron transport region, wherein the emission layer may include the fused polycyclic compound represented by Formula 1.

In an embodiment, the emission layer may be a delayed fluorescence emission layer including a host and a dopant, and the dopant may include the fused polycyclic compound represented by Formula 1.

In an embodiment, the organic electroluminescence device may further include an encapsulating layer disposed on the second electrode, wherein the encapsulating layer may include at least one organic layer and at least one inorganic layer.

In an embodiment, the at least one inorganic layer may include at least one selected from silicon nitride, silicon oxynitride, silicon oxide, titanium oxide, and aluminum oxide, and the at least one organic layer may include at least one selected from an acrylic compound, an epoxy-based compound, and a photopolymerizable organic compound.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
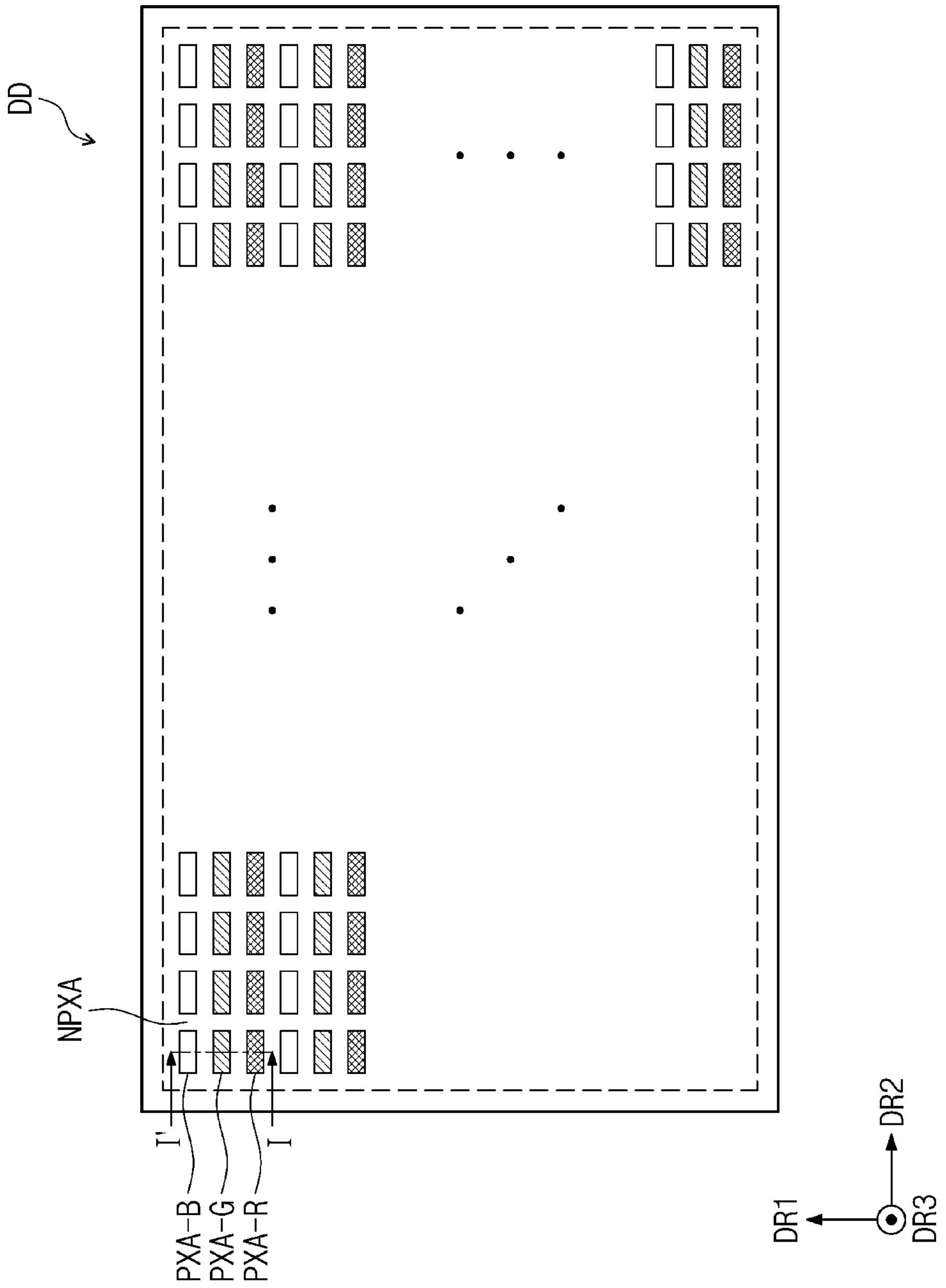
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be/used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be explained with reference to the drawings.

Figure 2:
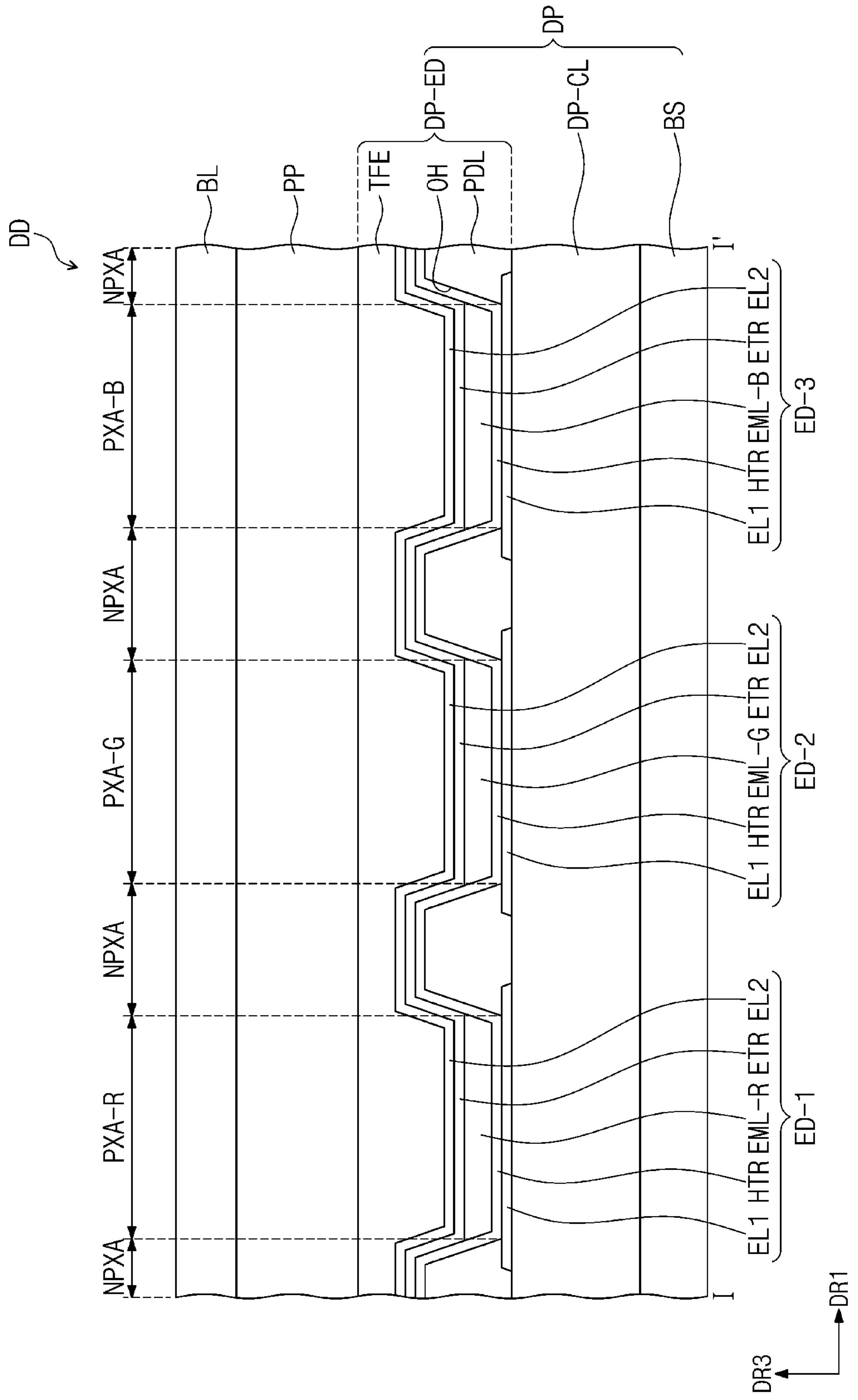
FIG. 2 is a schematic cross-sectional view showing a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I' of FIG. 1.

The display apparatus DD may include a display panel DP and an optical layer PP disposed on the display panel DP. The display panel DP includes organic electroluminescence devices ED-1, ED-2, and ED-3. The display apparatus DD may include multiples of each of the organic electroluminescence devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface where the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, organic electroluminescence devices ED-1, ED-2 and ED-3 disposed in the pixel definition layer PDL, and an encapsulating layer TFE disposed on the organic electroluminescence devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the organic electroluminescence devices ED-1, ED-2, and ED-3 of the display device layer DP-ED.

Each of the organic electroluminescence devices ED-1, ED-2, and ED-3 may have the structures of an organic electroluminescence device ED of embodiments according to FIG. 3 to FIG. 6, which will be explained later. Each of the organic electroluminescence devices ED-1, ED-2, and ED-3 may include a first electrode EL1, a hole transport region HTR, emission layers EML-R, EML-G, and EML-B, an electron transport region ETR and a second electrode EL2.

FIG. 2 shows an embodiment where the emission layers EML-R, EML-G, and EML-B of the organic electroluminescence devices ED-1, ED-2, and ED-3 are disposed in openings OH defined in a pixel definition layer PDL, and a hole transport region HTR, an electron transport region ETR, and a second electrode EL2 are each provided as common layers in all organic electroluminescence devices ED-1, ED-2, and ED-3. However, embodiments are not limited thereto. Although not shown in FIG. 2, in an embodiment, the hole transport region HTR and the electron transport region ETR may each be patterned and provided in the opening OH defined in the pixel definition layer PDL. For example, in an embodiment, the hole transport region HTR, the emission layers EML-R, EML-G, and EML-B, and the electron transport region ETR of the organic electroluminescence devices ED-1, ED-2, and ED-3 may be patterned by an ink jet printing method and provided.

An encapsulating layer TFE may cover the organic electroluminescence devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the openings OH.

Referring to FIG. 1 and FIG. 2, the display apparatus DD may include non-luminous areas NPXA and luminous areas PXA-R, PXA-G, and PXA-B. The luminous areas PXA-R, PXA-G, and PXA-B may each be areas emitting light produced from the organic electroluminescence devices ED-1, ED-2, and ED-3, respectively. The luminous areas PXA-R, PXA-G, and PXA-B may be separated from each other on a plane.

The luminous areas PXA-R, PXA-G, and PXA-B may each be areas separated by the pixel definition layer PDL. The non-luminous areas NPXA may be areas between neighboring luminous areas PXA-R, PXA-G, and PXA-B and may be areas corresponding to the pixel definition layer PDL. For example, in an embodiment, each of the luminous areas PXA-R, PXA-G, and PXA-B may correspond to a pixel. The pixel definition layer PDL may separate the organic electroluminescence devices ED-1, ED-2, and ED-3. The emission layers EML-R, EML-G, and EML-B of the organic electroluminescence devices ED-1, ED-2, and ED-3 may be disposed in the openings OH defined in the pixel definition layer PDL and separated from each other.

The luminous areas PXA-R, PXA-G, and PXA-B may be divided into groups according to the color of light produced from each of the organic electroluminescence devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, the organic electroluminescence devices ED-1, ED-2, and ED-3 may each emit light having different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, each of the red luminous area PXA-R, the green luminous area PXA-G, and the blue luminous area PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light in a same wavelength region, or at least one thereof may emit light in a different wavelength region. For example, the first to third organic electroluminescence devices ED-1, ED-2, and ED-3 may all emit blue light.

The luminous areas PXA-R, PXA-G, and PXA-B in the display apparatus DD according to an embodiment may be arranged in a stripe shape. Referring to FIG. 1, the red luminous areas PXA-R, the green luminous areas PXA-G, and the blue luminous areas PXA-B may be arranged along a second direction DR2. The red luminous area PXA-R, the green luminous area PXA-G, and the blue luminous area PXA-B may be arranged by turns along a first direction DR1.

In FIG. 1 and FIG. 2, the areas of the luminous areas PXA-R, PXA-G, and PXA-B are shown as having a similar area, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first direction axis DR1 and the second direction axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the display quality characteristics which are required for the display apparatus DD. For example, the arrangement type of the luminous areas PXA-R, PXA-G, and PXA-B may be a PENTILE® arrangement type, or a diamond arrangement type.

In an embodiment, the areas of the luminous areas PXA-R, PXA-G, and PXA-B may be different from each other. For example, in an embodiment, an area of the green luminous area PXA-G may be smaller than an area of the blue luminous area PXA-B, but embodiments are not limited thereto.

Hereinafter, FIG. 3 to FIG. 6 are each a schematic cross-sectional view showing an organic electroluminescence device according to embodiments. The organic electroluminescence device ED according to an embodiment may include a first electrode EL1, a second electrode EL2 facing the first electrode EL1, and organic layers disposed between the first electrode EL1 and the second electrode EL2. The organic layers may include a hole transport region HTR, an emission layer EML and an electron transport region ETR. For example, an organic electroluminescence device ED according to an embodiment may include a first electrode EL1, a hole transport region HTR, an emission layer EML, an electron transport region ETR, and a second electrode EL2 stacked in that order.

The organic electroluminescence device ED of an embodiment may include a fused polycyclic compound of an embodiment, which will be explained later, in at least one organic layer among the organic layers disposed between the first electrode EL1 and the second electrode EL2. For example, the organic electroluminescence device ED of an embodiment may include the fused polycyclic compound of an embodiment, which will be explained later, in an emission layer EML disposed between the first electrode EL1 and the second electrode EL2. However, embodiments are not limited thereto, and the organic electroluminescence device ED of an embodiment may include the fused polycyclic compound according to an embodiment, which will be explained later, in a hole transport region HTR or an electron transport region ETR, which may be among the organic layers disposed between the first electrode EL1 and the second electrode EL2, or the organic electroluminescence device ED may include the fused polycyclic compound according to an embodiment, which will be explained later, in a capping layer CPL disposed on the second electrode EL2, in addition to the emission layer EML.

Figure 3:
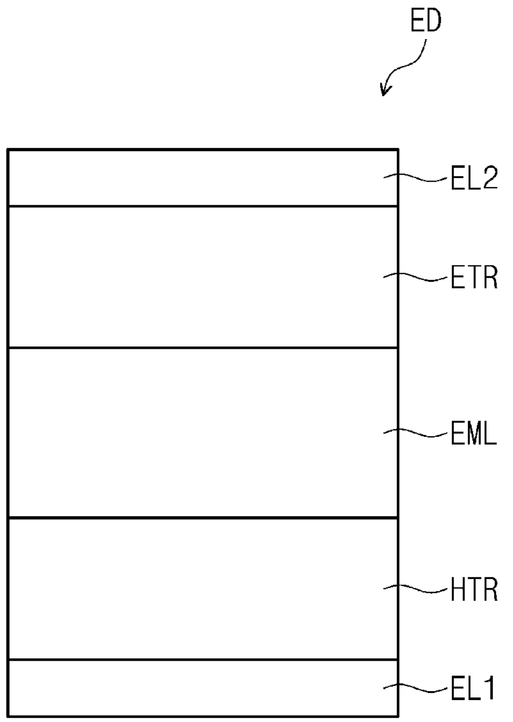
FIG. 3 is a schematic cross-sectional view schematically showing an organic electroluminescence device according to an embodiment.
Figure 4:
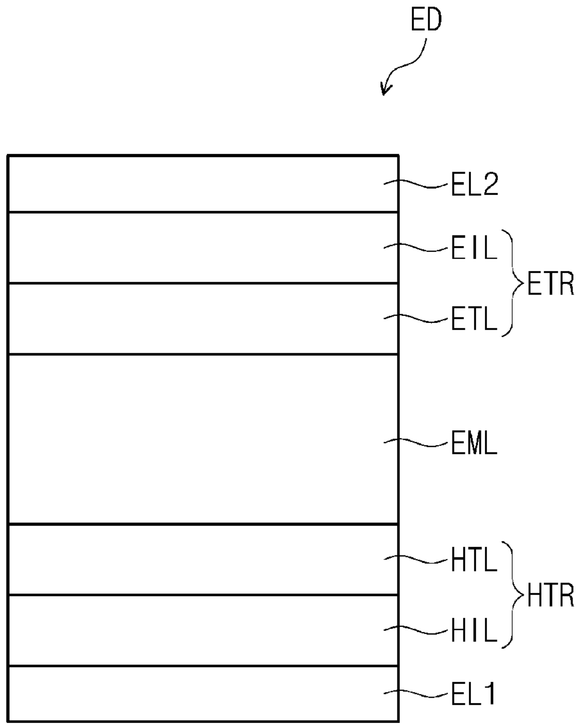
FIG. 4 is a schematic cross-sectional view showing an organic electroluminescence device according to an embodiment.
Figure 5:
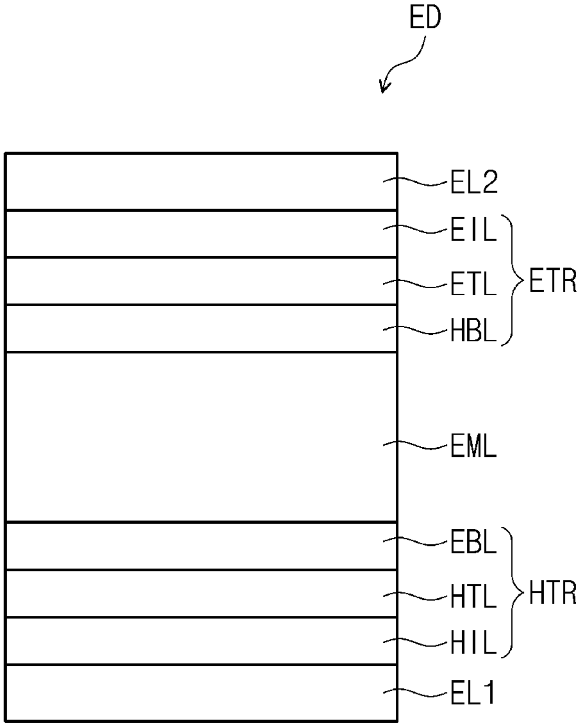
FIG. 5 is a schematic cross-sectional view showing an organic electroluminescence device according to an embodiment.
Figure 6:
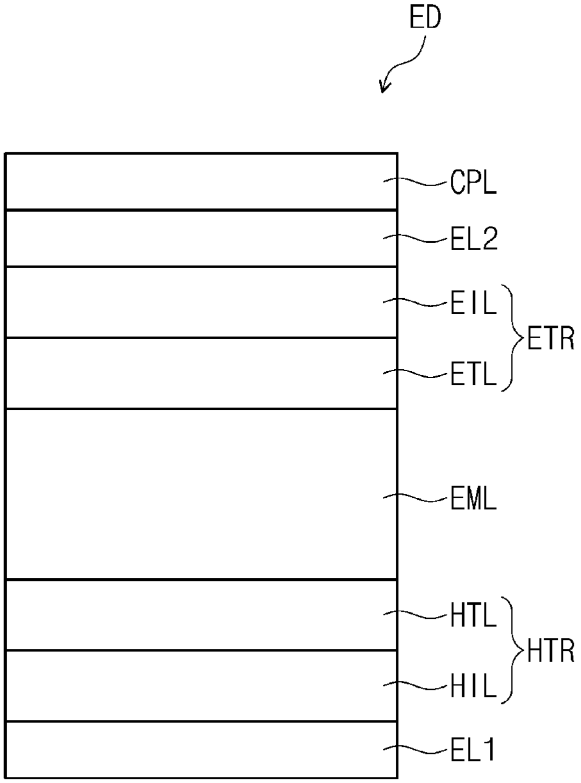
FIG. 6 is a schematic cross-sectional view showing an organic electroluminescence device according to an embodiment.

In comparison to FIG. 3, FIG. 4 shows a schematic cross-sectional view of an organic electroluminescence device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of an organic electroluminescence device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of an organic electroluminescence device ED of an embodiment that includes a capping layer CPL disposed on the second electrode EL2.

In the explanation on the organic electroluminescence device ED of an embodiment, the fused polycyclic compound according to an embodiment, which will be explained later, may be included in an emission layer EML, but embodiments are not limited thereto. The fused polycyclic compound according to an embodiment, which will be explained later, may be included in a hole transport region HTR, in an electron transport region ETR, or in a capping layer CPL.

The first electrode EL1 has conductivity. The first electrode EL1 may be formed using a metal alloy or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure of multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, embodiments are not limited thereto. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), or an electron blocking layer EBL. A thickness of the hole transport region HTR may be in a range of about 50 Å to about 15,000 Å.

The hole transport region HTR may be a layer formed of a single material, a layer formed of different materials, or a multilayer structure including layers formed of different materials.

For example, the hole transport region HTR may have the structure of a single layer of a hole injection layer HIL or a hole transport layer HTL, or may have a structure of a single layer formed of a hole injection material and a hole transport material. The hole transport region HTR may have a structure of a single layer formed using multiple different materials, or a structure in which a hole injection layer HIL/hole transport layer HTL, a hole injection layer HIL/hole transport layer HTL/hole buffer layer (not shown), a hole injection layer HIL/hole buffer layer (not shown), a hole transport layer HTL/hole buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

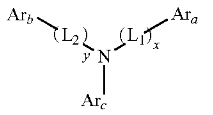

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, x and y may each independently be an integer from 0 to 10. If x or y is 2 or more, $L_1$ groups and $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_a$ to $Ar_c$ may each independently be a substituted or unsubstituted aryl group of 6 to 30 ring-forming carbon atoms, or a substituted or unsubstituted heteroaryl group of 2 to 30 ring-forming carbon atoms.

In an embodiment, the compound represented by Formula H-1 may be a monoamine compound. However, embodiments are not limited thereto, and in another embodiment, the compound represented by Formula H-1 may be a diamine compound in which at least one of $Ar_a$ to $Ar_c$ may include an amine group as a substituent.

In an embodiment, $L_1$ and $L_2$ may each independently be a direct linkage or a substituted or unsubstituted phenylene group.

In an embodiment, at least one of $Ar_a$ to $Ar_c$ may be a substituted or unsubstituted fluorenyl group, a substituted or unsubstituted carbazole group, or a substituted or unsubstituted dibenzofuranyl group.

In an embodiment, in Formula H-1, $Ar_c$ may be a substituted or unsubstituted aryl group of 6 to 30 ring-forming carbon atoms.

In an embodiment, the compound represented by Formula H-1 may be a carbazole-based compound in which at least one of $Ar_a$ and $Ar_b$ may include a substituted or unsubstituted carbazole group. In another embodiment, the compound represented by Formula H-1 may be a fluorene-based compound in which at least one of $Ar_a$ and $Ar_b$ may include a substituted or unsubstituted fluorene group.

The compound represented by Formula H-1 may be any one selected from Compound Group H. However, the compounds shown in Compound Group H are only examples, and the compound represented by Formula H-1 is not limited to Compound Group H:

[Compound Group H]

H-1-1

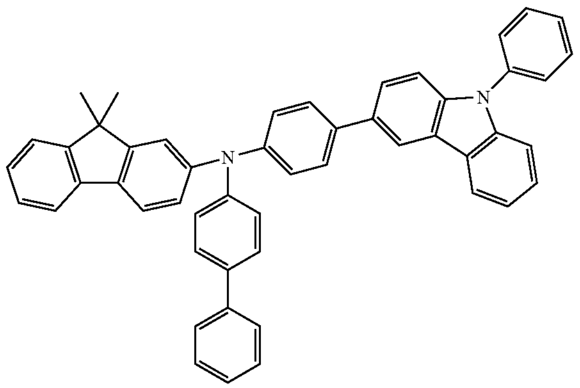

H-1-2

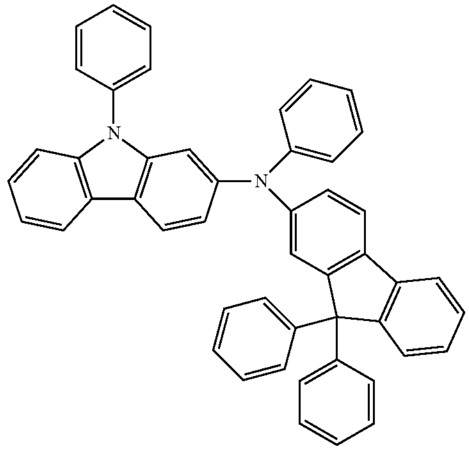

H-1-3

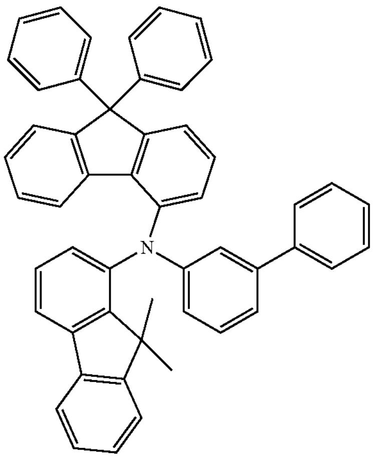

-continued

H-1-4

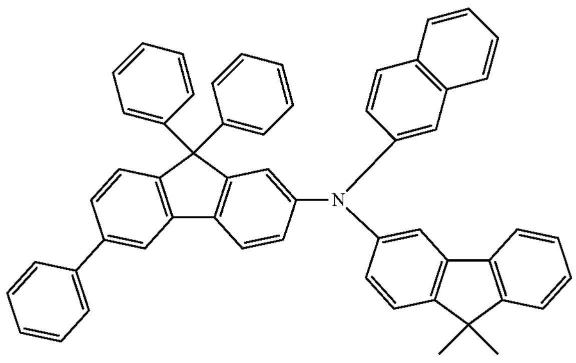

H-1-5

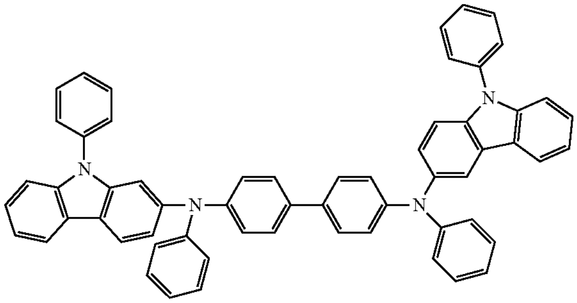

H-1-6

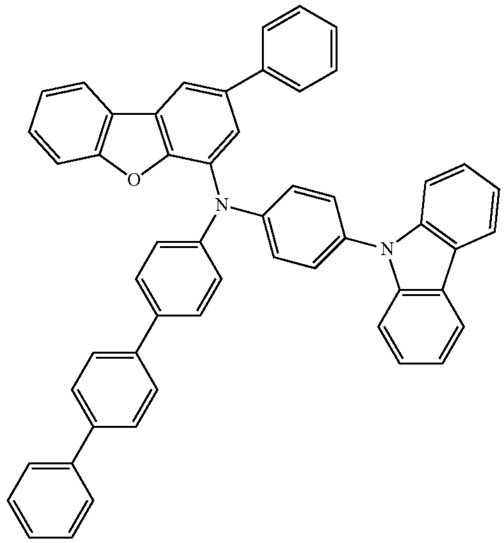

-continued
H-1-7
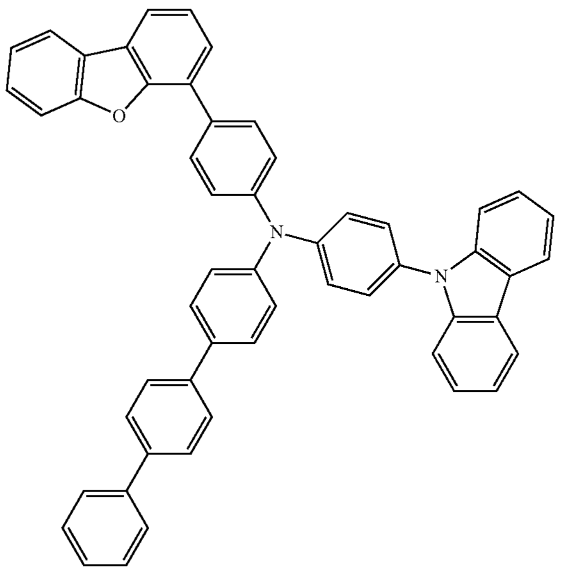
H-1-8
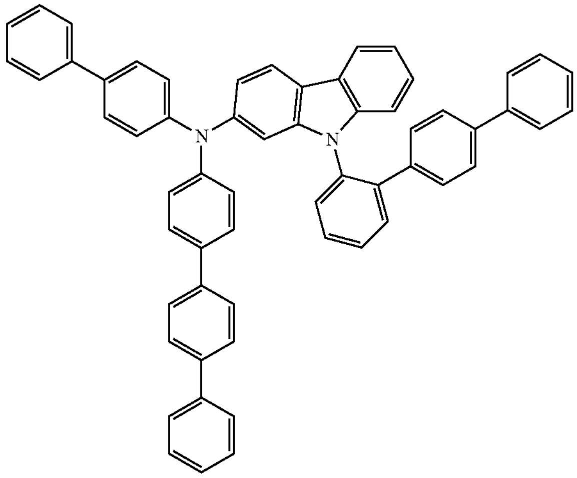
H-1-9
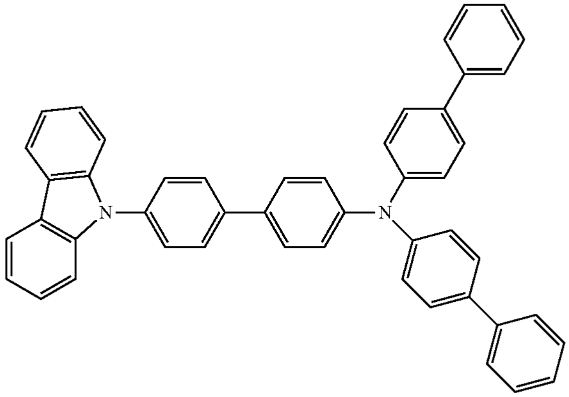
-continued
H-1-10
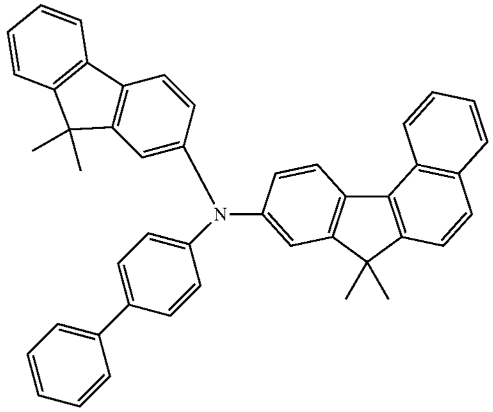
H-1-11
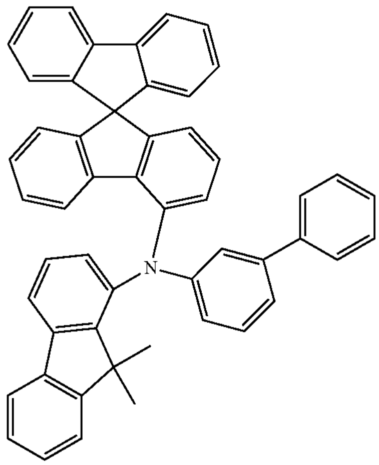
H-1-12
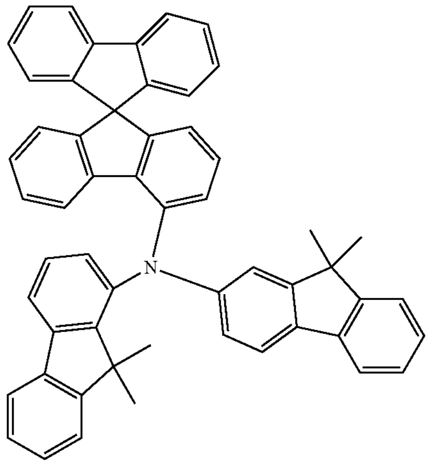

-continued
H-1-13
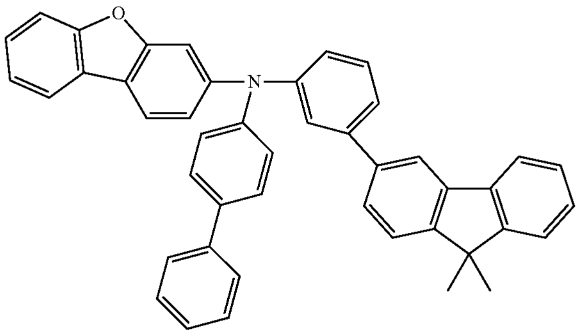
H-1-14
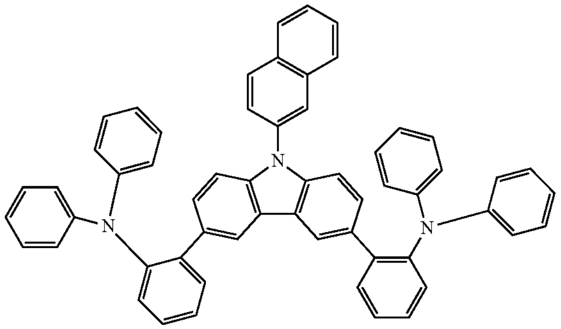
H-1-15
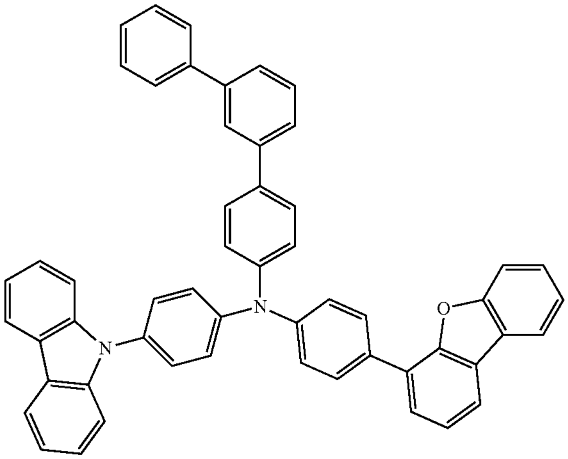
-continued
H-1-16
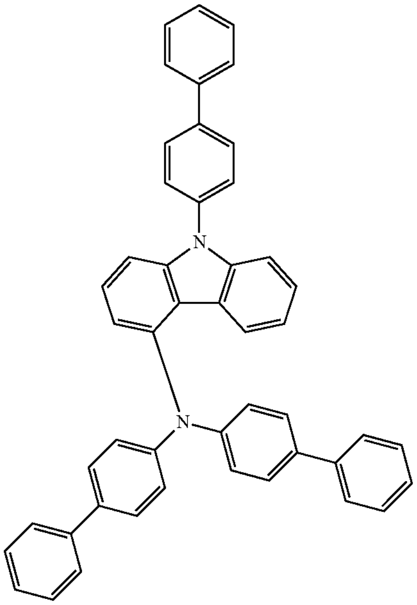
H-1-17
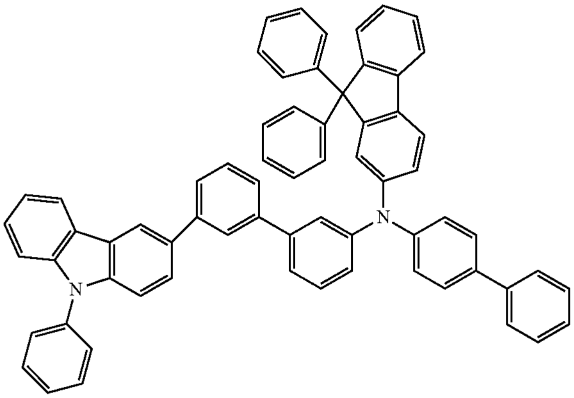
H-1-18
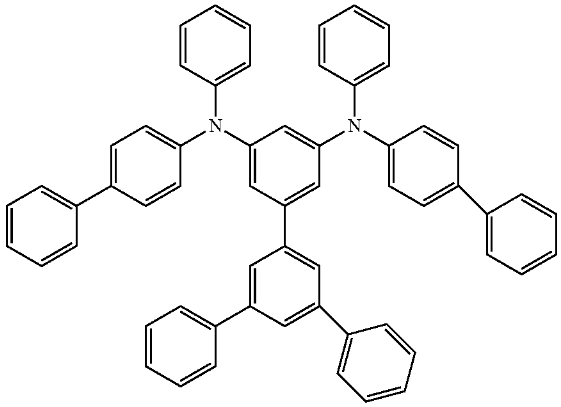

-continued

H-1-19

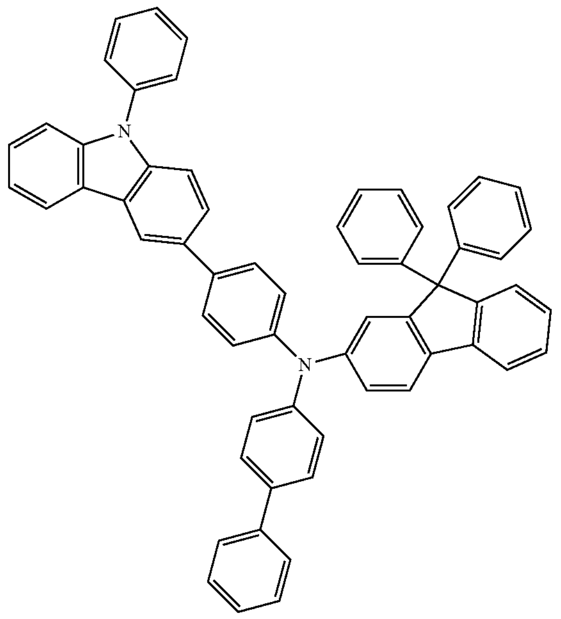

H-1-20

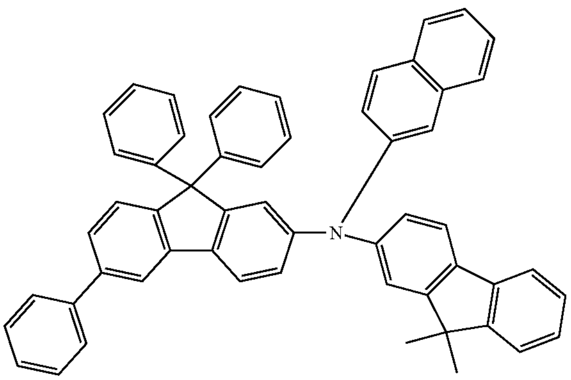

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N (1-naphthyl)-N-phenylamino]-triphenylamine (1-TNATA), 4,4',4"-tris[N (2-naphthyl)-N-phenylamino]-triphenylamine (2-TNATA), poly(3,4-ethylenedioxythiophene)/poly(4-styrenesulfonate)(PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium[tetrakis(pentafluorophenyl) borate], and dipyrazino[2,3-f: 2',3'-h]quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (Mcp), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. A thickness of the hole injection layer may be, for example, in a range of about 30 Å to about 1,000 Å, and a thickness of the hole transport layer HTL may be in a range of about 30 Å to about 1,000 Å. A thickness of the electron blocking layer EBL may be in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase of driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include one of quinone derivatives, metal oxides, and cyano group-containing compounds, without limitation. For example, non-limiting examples of the p-dopant may include quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, etc., without limitation.

As described above, the hole transport region HTR may further include at least one of a hole buffer layer (not shown) or an electron blocking layer EBL in addition to the hole injection layer HIL and the hole transport layer HTL. The hole buffer layer (not shown) may compensate for a resonance distance according to a wavelength of light emitted from an emission layer EML and may increase light emitting efficiency. As materials included in the hole buffer layer (not shown), materials which may be included in the hole transport region HTR may be used. The electron blocking layer EBL may block the injection of electrons from an electron transport region ETR to a hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

In the organic electroluminescence device ED of an embodiment, the emission layer EML may include the fused polycyclic compound of an embodiment.

In the description, the term "substituted or unsubstituted" may mean a group that is substituted or unsubstituted with one or more substituents selected from the group consisting of a deuterium atom, a halogen atom, a cyano group, a nitro group, an amine group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkoxy group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the description, the term "combined with an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The ring that is formed by combining with an adjacent group may be monocyclic or polycyclic. A ring which is formed by combining with an adjacent group may itself be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, examples of a halogen atom may include a fluorine atom, a chlorine atom, a bromine atom, or an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, an alkenyl group may be a hydrocarbon group including one or more carbon-carbon double bonds in the middle or at the terminal of an alkyl group of two or more carbon atoms. The alkenyl group may be a linear chain or a branched chain. The number of carbon atoms in the alkenyl group is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, an alkynyl group may be a hydrocarbon group including one or more carbon-carbon triple bonds in the middle or at the terminal of an alkyl group of two or more carbon atoms. The alkynyl group may be a linear chain or a branched chain. The number of carbon atoms in the alkynyl group is not specifically limited but may be 2 to 30, 2 to 20, or 2 to 10. Examples of the alkynyl group may include an ethynyl group, a propynyl group, etc., without limitation.

In the description, a hydrocarbon ring group may be any functional group or substituent derived from an aliphatic hydrocarbon ring or any functional group or substituent derived from an aromatic hydrocarbon ring. The number of ring-forming carbon atoms in the hydrocarbon ring group may be 5 to 60, 6 to 30, or 5 to 20.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, a fluorenyl group may be substituted, and two substituents may be combined with each other to form a spiro structure. Examples of substituted fluorenyl groups are as follows. However, embodiments are not limited thereto.

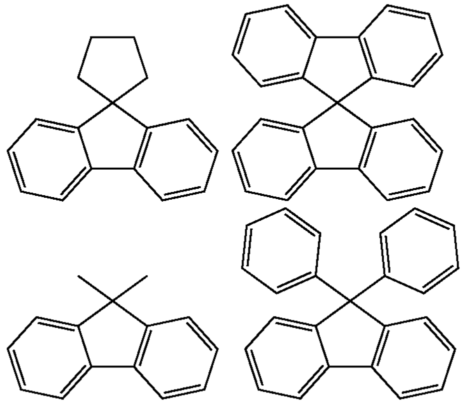

In the description, a heterocyclic group may be any functional group or substituent derived from a ring including one or more of B, O, N, P, Si, or S as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may be monocyclic or polycyclic.

In the description, the heterocyclic group may include one or more of B, O, N, P, Si, or S as heteroatoms. If the heterocyclic group includes two or more heteroatoms, the two or more heteroatoms may be the same as each other or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, or 2 to 10.

In the description, an aliphatic heterocyclic group may include one or more of B, O, N, P, Si, or S as heteroatoms. The number of ring-forming carbon atoms in the aliphatic heterocyclic group may be 2 to 60, 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyrane group, a 1,4-dioxane group, etc., without limitation.

In the description, a heteroaryl group may include one or more of B, O, N, P, Si, or S as heteroatoms. If the heteroaryl group includes two or more heteroatoms, two or more heteroatoms may be the same as each other or different from each other. The heteroaryl group may be a monocyclic heterocyclic group or a polycyclic heterocyclic group. The number of ring-forming carbon atoms in the heteroaryl group may be 2 to 60, 2 to 30, 2 to 20, or 2 to 10. Examples of the heteroaryl group may include thiophene, furan, pyrrole, imidazole, triazole, pyridine, bipyridine, pyrimidine, pyrazine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the description, the explanation on the aryl group may be applied to an arylene group except that the arylene group is a divalent group. The explanation on the heteroaryl group may be applied to a heteroarylene group except that the heteroarylene group is a divalent group.

In the description, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, a boryl group may be an alkyl boryl group or an aryl boryl group. Examples of the boryl group may include a trimethylboryl group, a triethylboryl group, a t-butyldimethylboryl group, a triphenylboryl group, a diphenylboryl group, a phenylboryl group, etc., without limitation.

In the description, the number of carbon atoms in an amine group is not specifically limited, but may be 1 to 30. The amine group may be an alkyl amine group, an aryl amine group, or a heteroaryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, an alkyl group in an alkyl thio group, an alkyl sulfoxy group, an alkyl aryl group, an alkyl amine group, an alkyl boryl group, and an alkyl silyl group may be the same as the alkyl group as described above.

In the description, an aryl group in an aryl oxy group, an aryl thio group, an aryl sulfoxy group, an aryl amine group, an aryl boryl group, and an aryl silyl group may be the same as the aryl group as described above.

In the description, —* indicates a binding site to a neighboring atom.

The fused polycyclic compound of an embodiment may be represented by Formula 1.

[Formula 1]

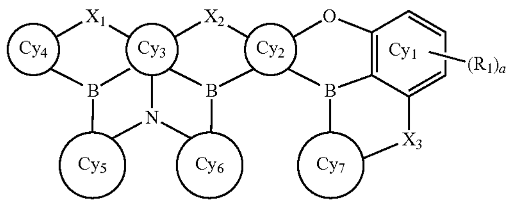

In Formula 1, $Cy_2$ to $Cy_7$ may each independently be a substituted or unsubstituted aromatic hydrocarbon ring, or a substituted or unsubstituted aromatic heterocycle.

In Formula 1, $X_1$ to $X_3$ may each independently be $N(Ar_1)$, O, S, or Se.

In Formula 1, $Ar_1$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 1, $R_1$ may be a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 1, a may be an integer from 1 to 3. If a is 2 or more, then the $R_1$ groups may be the same or different.

In Formula 1, an atom in $R_1$ that is bonded to $Cy_1$ may not be nitrogen. For example, $Cy_1$ and $R_1$ do not form a carbon-nitrogen bond.

The fused polycyclic compound according to embodiments may limit the type of a substituent bonded to $Cy_1$ and may have high bond dissociation energy (BDE). In an embodiment, a bond dissociation energy between at least one $R_1$ group and $Cy_1$ may be equal to or greater than about 2.5 eV. In another embodiment, a bond dissociation energy between at least one $R_1$ group and $Cy_1$ may be equal to or greater than about 3.5 eV.

In an embodiment, if a in Formula 1 is 1, then $R_1$ may be not a hydrogen atom, and if a is 2 or more, then multiple $R_1$ groups may not all be hydrogen atoms at the same time.

In an embodiment, the fused polycyclic compound represented by Formula 1 may be represented by Formula 1-1.

[Formula 1-1]

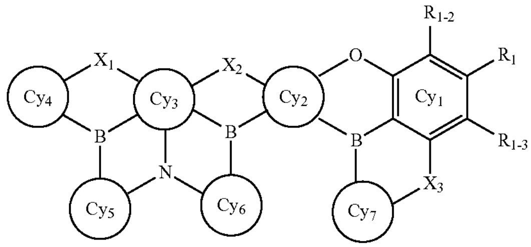

In Formula 1-1, $R_1$ may be a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. In an embodiment, a bond dissociation energy between at least one $R_1$ group and $Cy_1$ may be equal to or greater than about 2.5 eV.

In Formula 1-1, $R_1$-2, and $R_{1-3}$ may each independently be a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 1-1, an atom in $R_1$ that is bonded to $Cy_1$ may not be nitrogen, an atom in $R_{1-2}$ that is bonded to $Cy_1$ may not be nitrogen, and an atom in $R_{1-3}$ that is bonded to $Cy_1$ may not be nitrogen.

In Formula 1-1, $Cy_2$ to $Cy_7$, and $X_1$ to $X_3$ may be the same as defined in Formula 1.

In an embodiment, the fused polycyclic compound represented by Formula 1 may be represented by Formula 2.

[Formula 2]

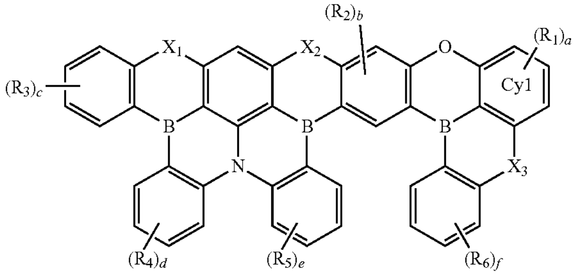

In Formula 2, $R_2$ to $R_6$ may each independently be a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring.

In Formula 2, b may be an integer from 0 to 2. If b is 2 or more, then multiple $R_2$ groups may be the same or different.

In Formula 2, c to f may each independently be an integer from 0 to 4. If c is 2 or more, then multiple $R_3$ groups may be the same or different, if d is 2 or more, then multiple $R_4$ groups may be the same or different, if e is 2 or more, then multiple $R_5$ groups may be the same or different, and if f is 2 or more, then multiple $R_6$ groups may be the same or different.

In Formula 2, $X_1$ to $X_3$, $R_1$, and a may be the same as defined in Formula 1.

In an embodiment, the fused polycyclic compound represented by Formula 2 may be represented by Formula 3.

[Formula 3]

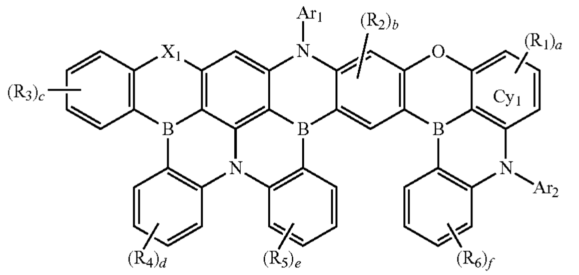

In Formula 3, $Ar_1$ and $Ar_2$ may each independently be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 3, $X_1$, $R_1$ to $R_6$, and a to f may be the same as defined in Formula 1 and Formula 2.

In an embodiment, the fused polycyclic compound represented by Formula 2 may be represented by Formula 4.

[Formula 4]

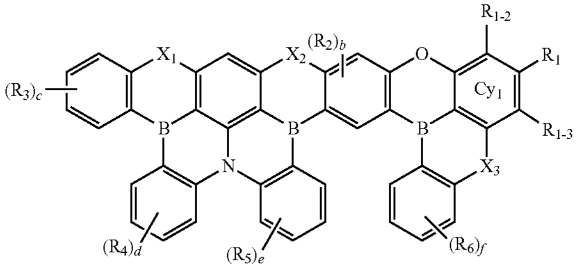

In Formula 4, $R_{1-2}$ and $R_{1-3}$ may each independently be a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 4, $R_1$ may be a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. In an embodiment, a bond dissociation energy between at least one $R_1$ group and Cy may be equal to or greater than about 2.5 eV.

In Formula 1, an atom in $R_1$ that is bonded to $Cy_1$ may not be nitrogen, an atom in $R_{1-2}$ that is bonded to $Cy_1$ may not be nitrogen, and an atom in $R_{1-3}$ that is bonded to $Cy_1$ may not be nitrogen.

In Formula 4, $X_1$ to $X_3$, $R_2$ to $R_6$, and b to f may be the same as defined in Formula 1 and Formula 2.

In an embodiment, the fused polycyclic compound represented by Formula 3 may be represented by Formula 5.

[Formula 5]

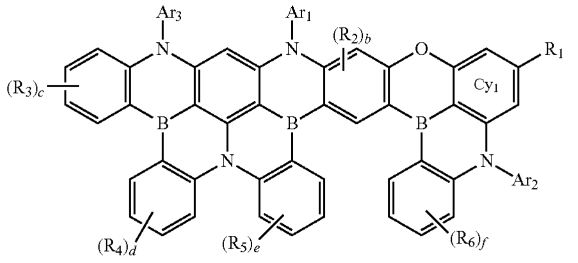

In Formula 5, $Ar_5$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 5, $Ar_1$, $Ar_2$, $X_1$, $R_1$ to $R_6$, and b to f may be the same as defined in Formula 1, Formula 2, and Formula 3.

In an embodiment, $R_1$ may be a substituted or unsubstituted aryl group of 6 to 60 ring-forming carbon atoms, or a substituted or unsubstituted heteroaryl group of 2 to 60 ring-forming carbon atoms.

In an embodiment, $R_1$ may be a group represented by any one of Formula 6-1 to Formula 6-3.

[Formulae]

6-1

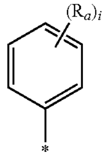

6-2

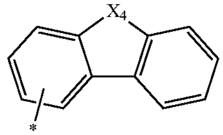

-continued 6-3

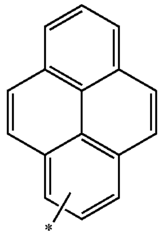

In Formula 6-1, $R_a$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 6-1, i may be an integer from 0 to 5. If i is 2 or more, then multiple $R_a$ groups may be the same or different.

In Formula 6-2, $X_4$ may be $N(R_{10})$, O, S or $C(R_{11})(R_{12})$, and $R_{10}$ to $R_{12}$ may each independently be a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In an embodiment, in Formula 1, if $X_1$ to $X_3$ are each independently $N(Ar_1)$, then $Ar_1$ may be a substituted or unsubstituted aryl group of 6 to 60 ring-forming carbon atoms.

The fused polycyclic compound of an embodiment may be any one selected from Compound Group 1. In an embodiment, the fused polycyclic compound of an embodiment may include at least one selected from Compound Group 1. The organic electroluminescence device ED of an embodiment may include at least one fused polycyclic compound selected from Compound Group 1 in an emission layer EML.

[Compound Group 1]

1

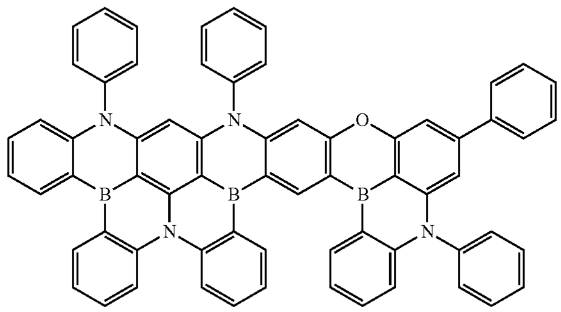

2

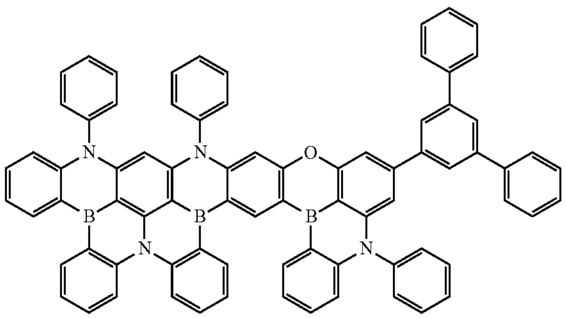

-continued
3
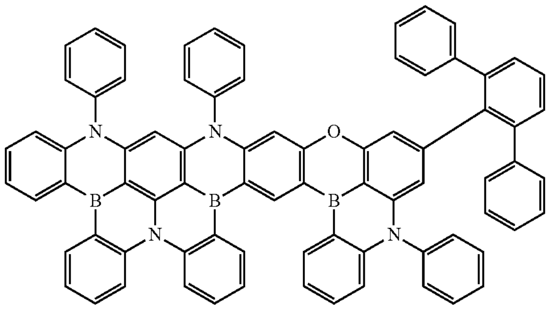
4
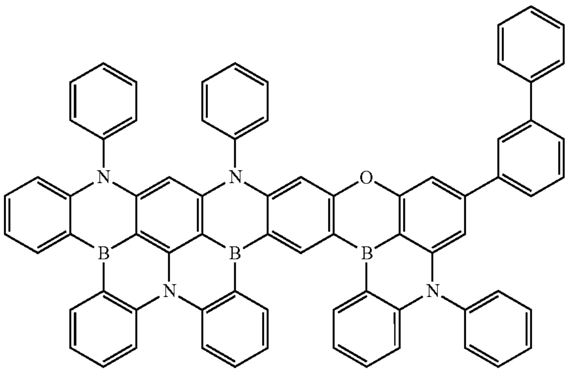
5
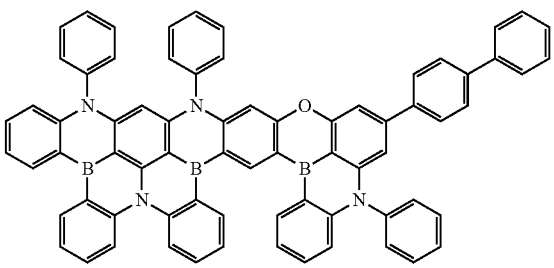
6
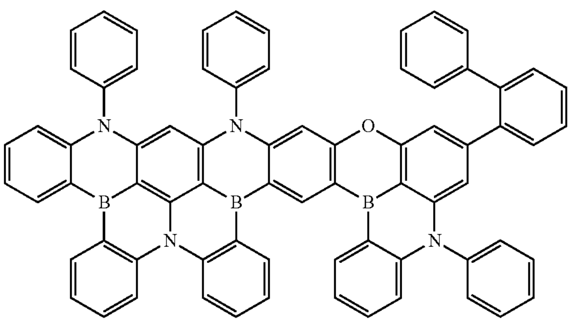
7
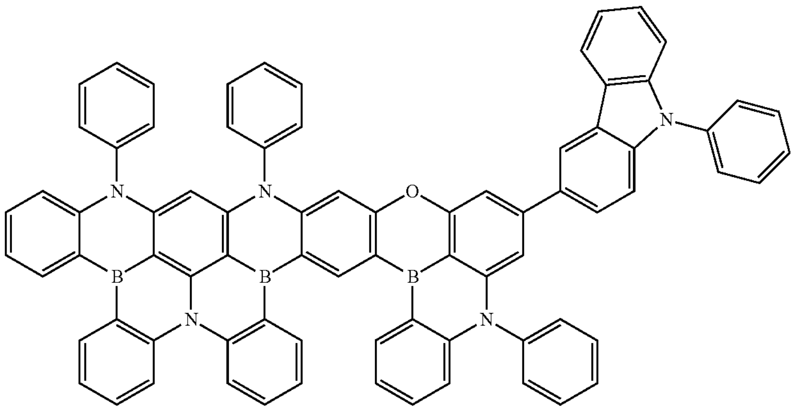
8
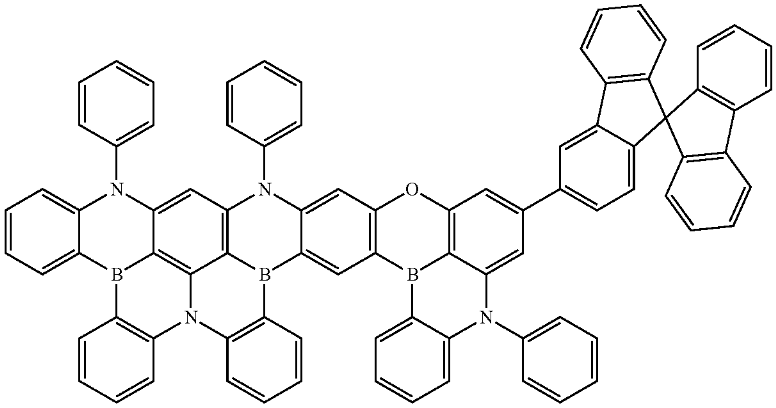

-continued
9
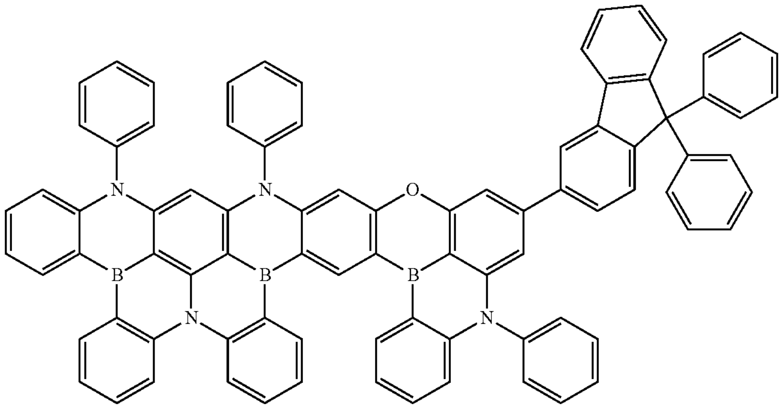
10
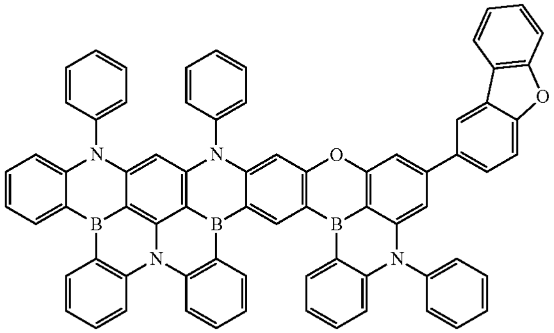
11
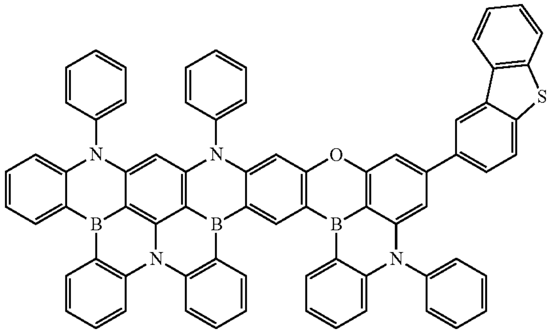
12
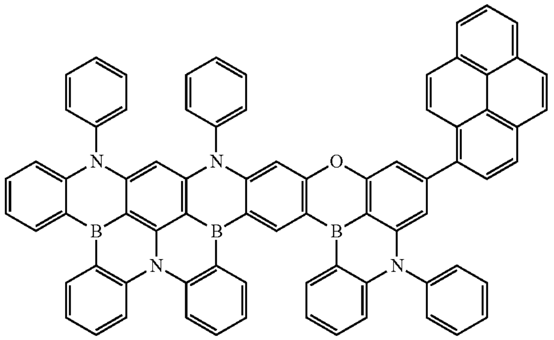
13
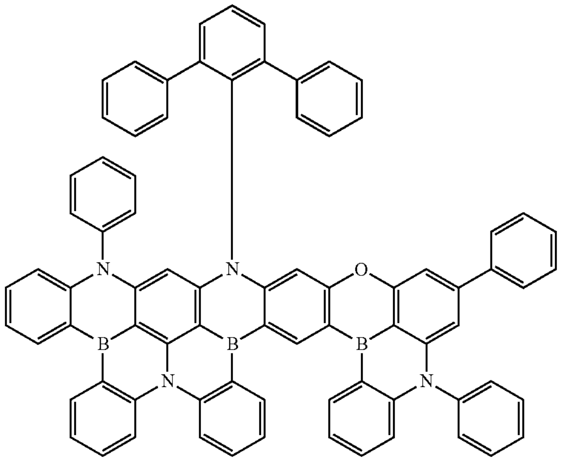

-continued
14
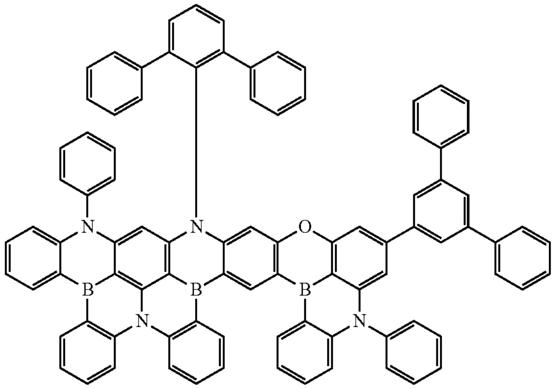
15
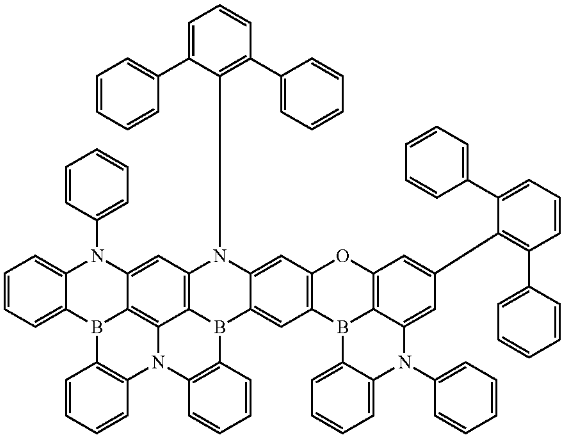
16
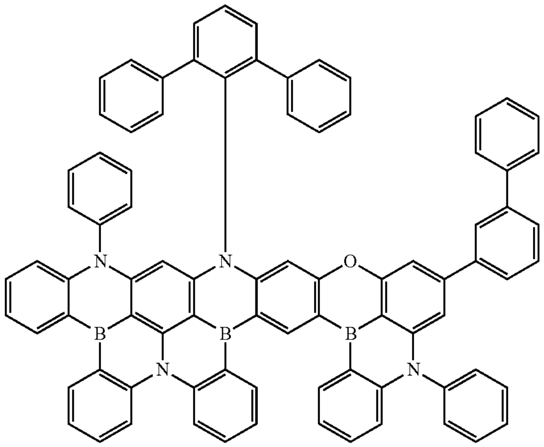
17
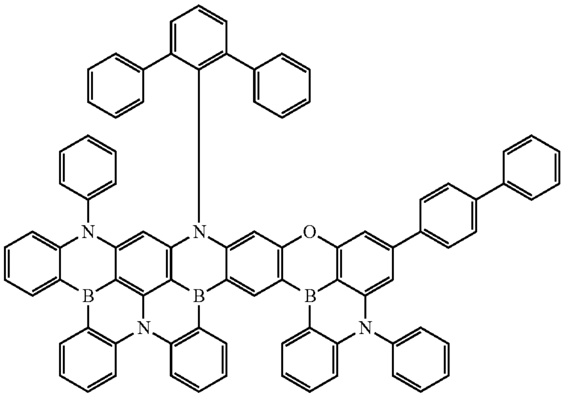
18
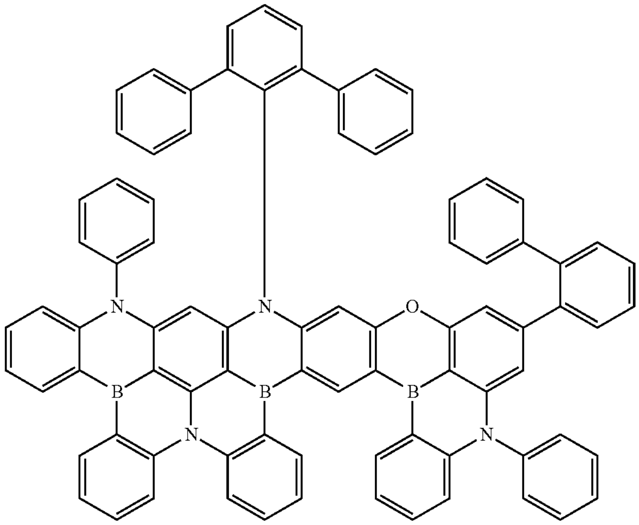

-continued
19
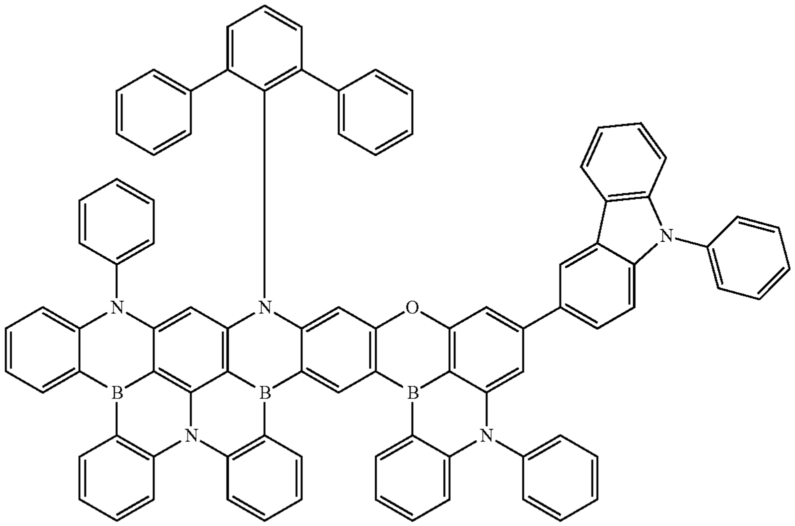
20
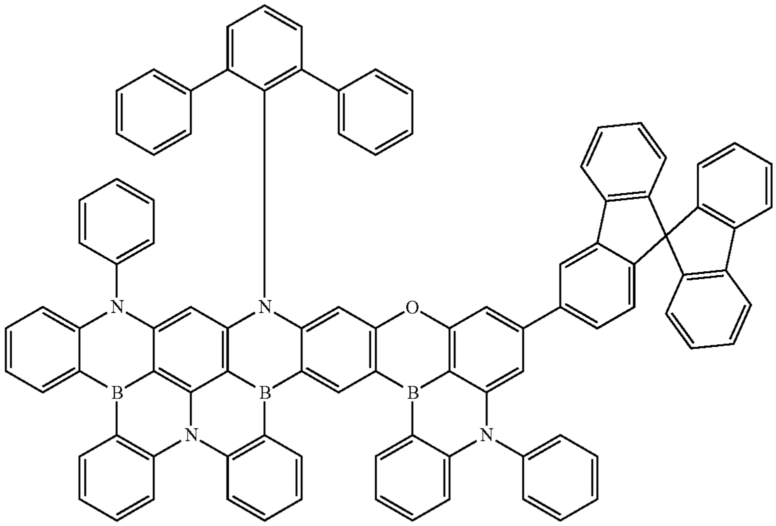
21
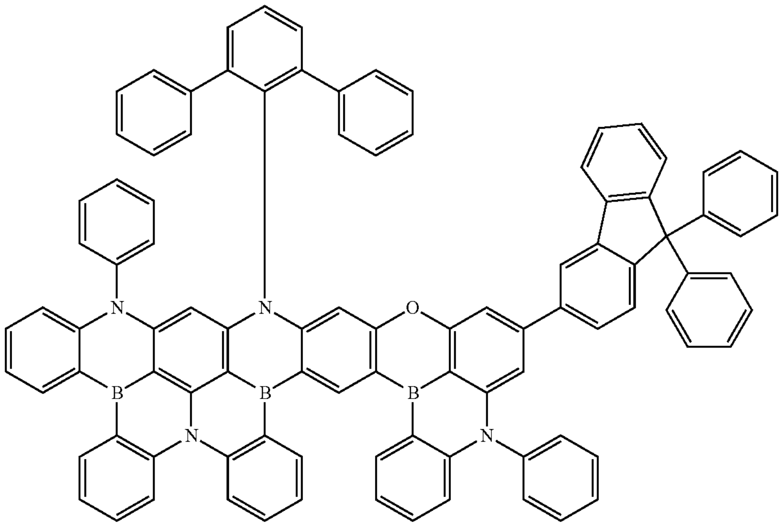

-continued
22
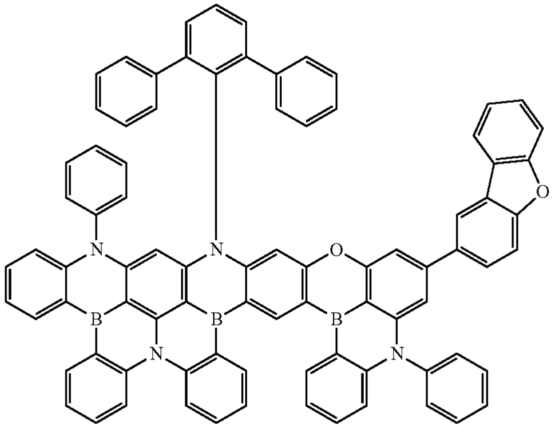
23
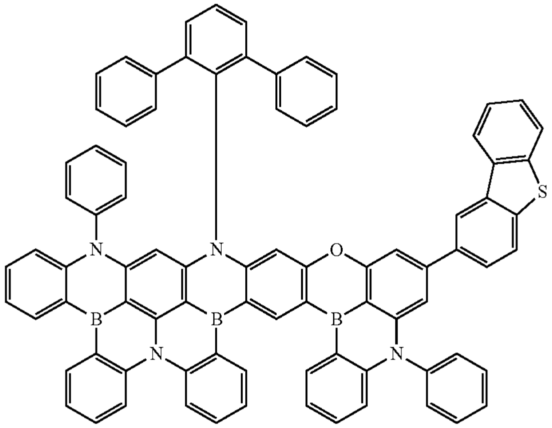
24
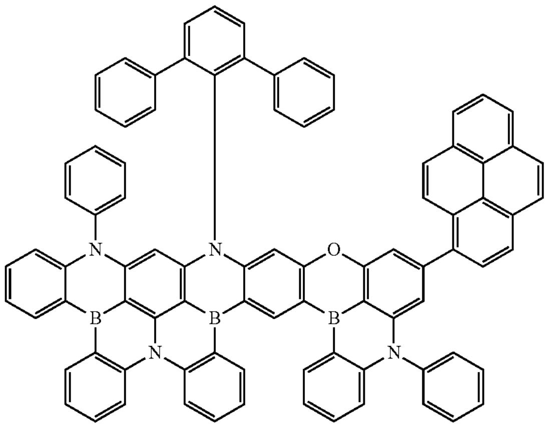
25
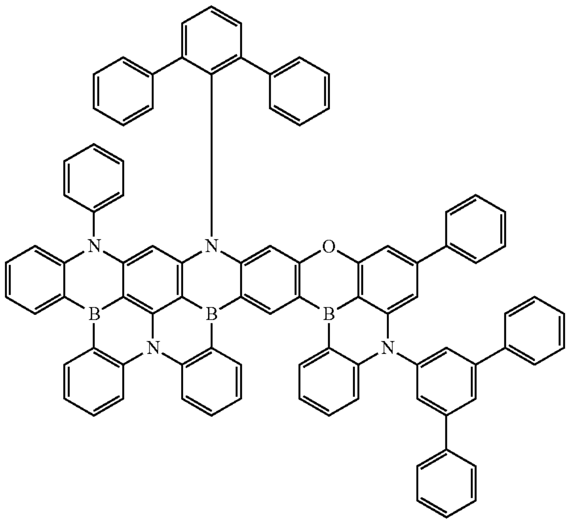
26
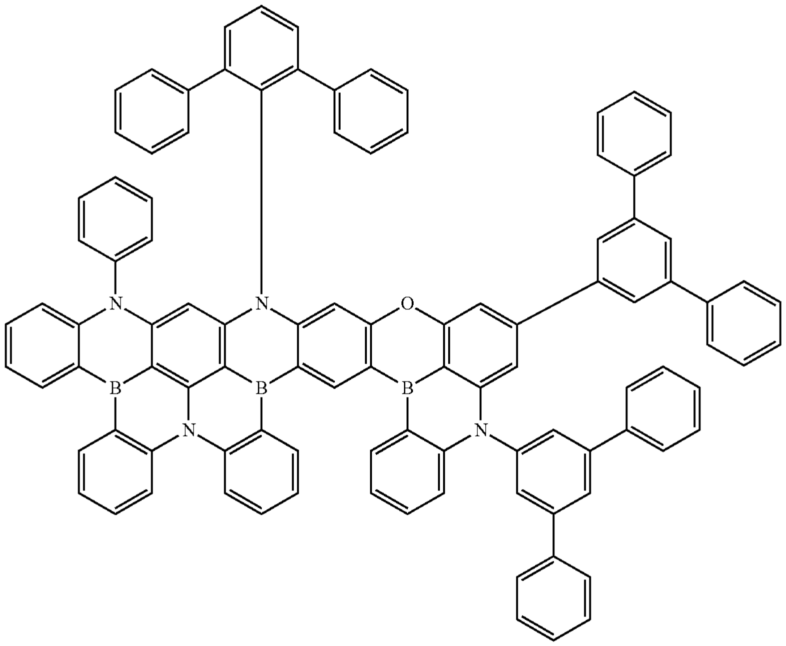

-continued
27
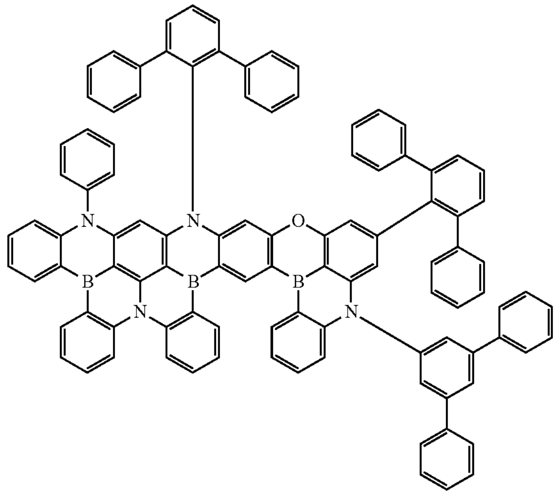
28
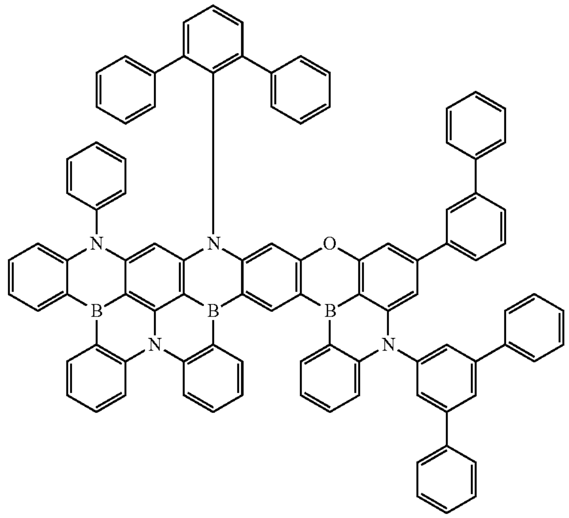
29
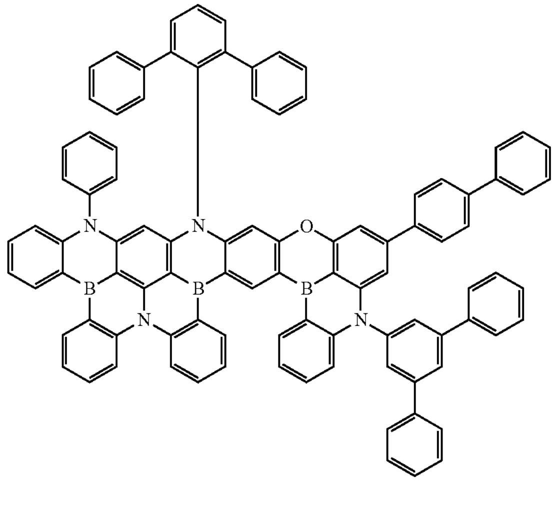
30
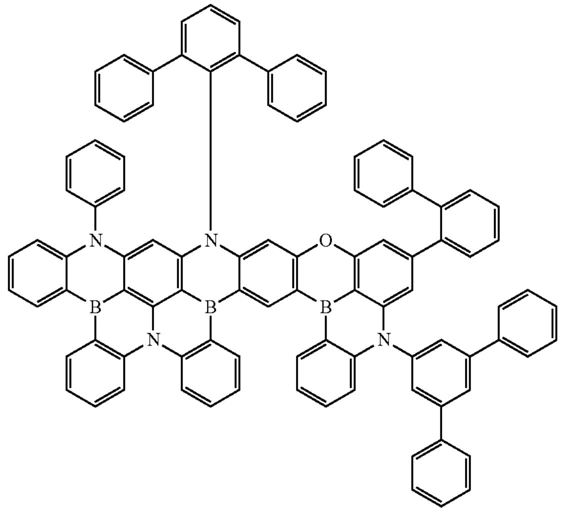

-continued
31
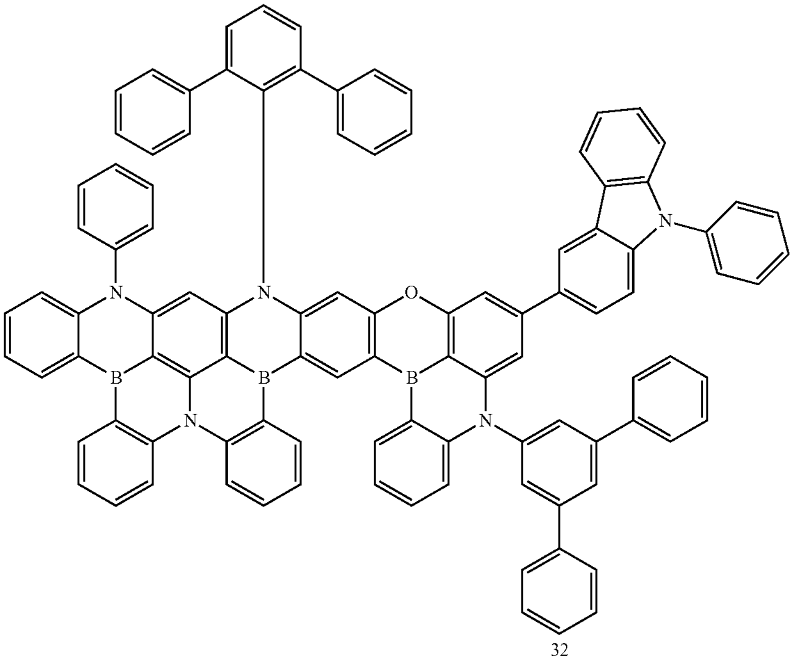
32
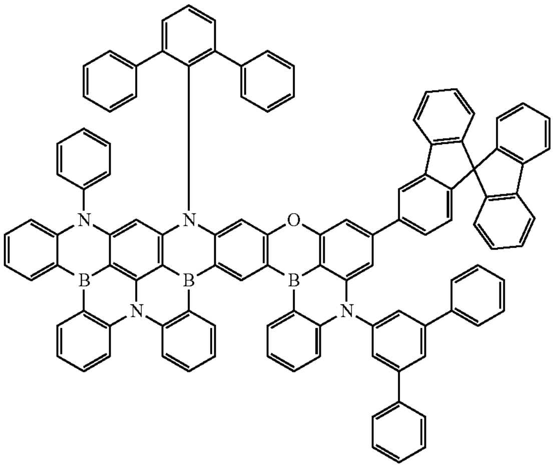
33
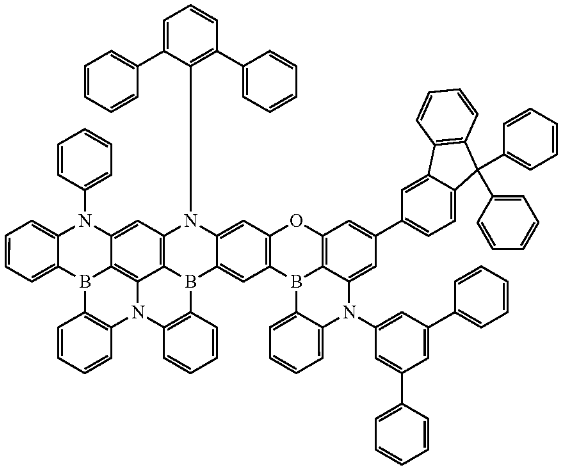
34
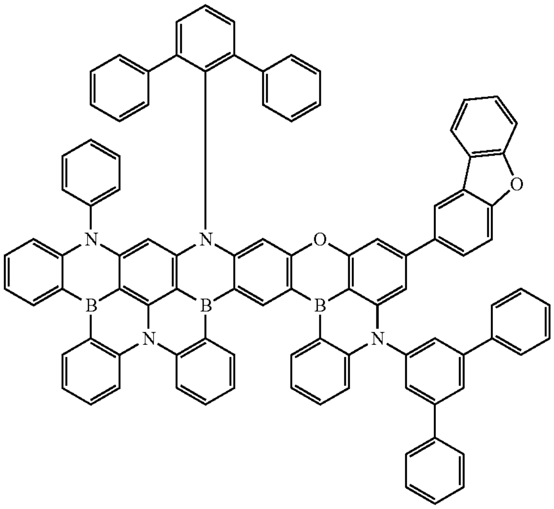
35
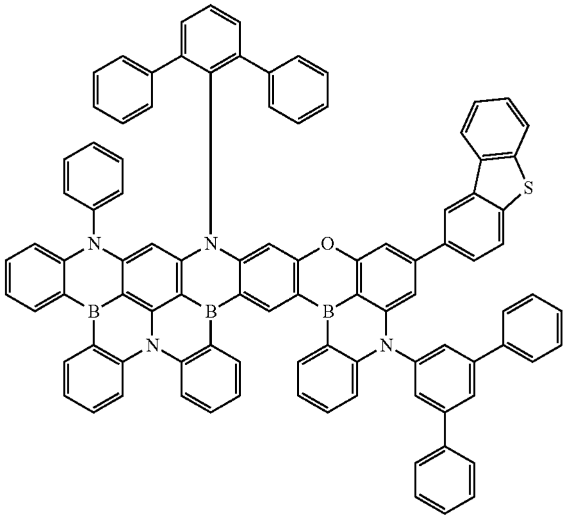

-continued

36

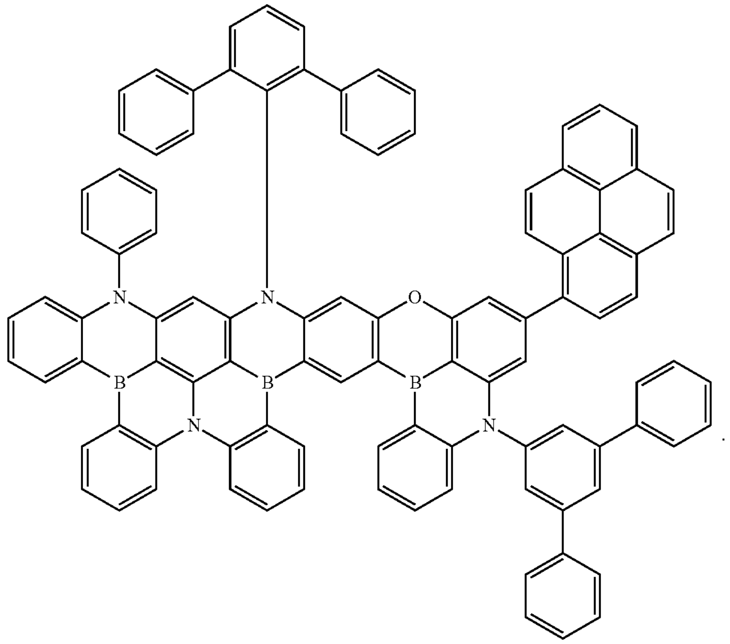

The fused polycyclic compound of an embodiment represented by Formula 1 may be a material for emitting thermally activated delayed fluorescence (TADF). The fused polycyclic compound of an embodiment represented by Formula 1 may be a thermally activated delayed fluorescence dopant having a difference ($\Delta E_{ST}$) between the lowest triplet excitation energy level (T1 level) and the lowest singlet excitation energy level (S1 level) equal to or less than about 0.35 eV.

The fused polycyclic compound of an embodiment, represented by Formula 1 may be a material emitting light in a blue region. The blue region may be a wavelength region, for example, in a range of about 430 nm to about 490 nm. For example, the fused polycyclic compound of an embodiment represented by Formula 1 may be a blue thermally activated delayed fluorescence (TADF) dopant. However, embodiments are not limited thereto, and when the fused polycyclic compound of an embodiment is used as a light-emitting material, the fused polycyclic compound may be used as a dopant material emitting light in various wavelength regions, such as a red emitting dopant and a green emitting dopant. In another embodiment, the fused polycyclic compound of an embodiment represented by Formula 1 may be a host.

The fused polycyclic compound according to embodiments may be used in the organic electroluminescence device ED of an embodiment to improve the efficiency and life of the organic electroluminescence device. The fused polycyclic compound according to embodiments may be used in an emission layer EML of the organic electroluminescence device ED of an embodiment to improve the emission efficiency and life of the organic electroluminescence device.

In an embodiment, the emission layer EML of the organic electroluminescence device ED may emit delayed fluorescence. In an embodiment, the emission layer EML may be a delayed fluorescence emission layer including a first compound and a second compound, and the first compound of the emission layer EML may include the fused polycyclic compound of an embodiment represented by Formula 1. For example, the first compound may be a dopant, and the second compound may be a host.

In an embodiment, the host may be a host for emitting delayed fluorescence, and the dopant may be a dopant for emitting delayed fluorescence. The fused polycyclic compound of an embodiment represented by Formula 1 may be included as a dopant material of an emission layer EML. For example, the fused polycyclic compound of an embodiment represented by Formula 1 may be used as a TADF dopant.

Although not shown in FIGS. 1 to 6, the organic electroluminescence device ED of an embodiment may include multiple emission layers. The multiple emission layers may be provided as a stack of emission layers, for example, and the organic electroluminescence device including the multiple emission layers may emit white light. The organic electroluminescence device including the multiple emission layers may be an organic electroluminescence device having a tandem structure. If the organic electroluminescence device ED includes multiple emission layers, at least one emission layer EML may include the fused polycyclic compound according to embodiments as described above.

In the organic electroluminescence device ED of an embodiment, the emission layer EML may further include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

The emission layer EML may further include a host and a dopant, and the emission layer EML may include a compound represented by Formula E-1. The compound represented by Formula E-1 may be used as a fluorescence host material.

[Formula E-1]

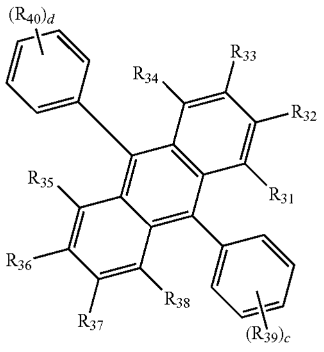

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19.

E1

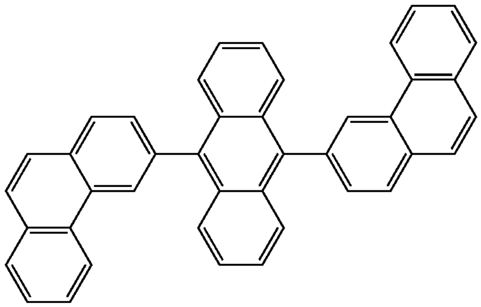

E2

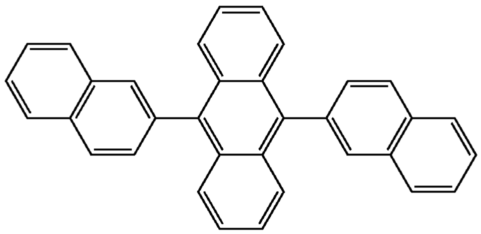

-continued

E3

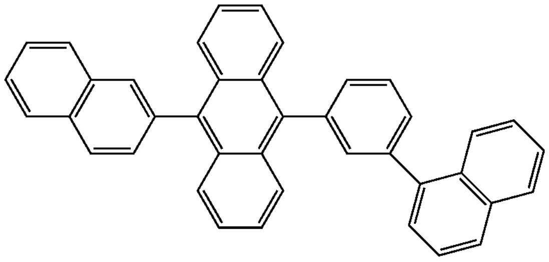

E4

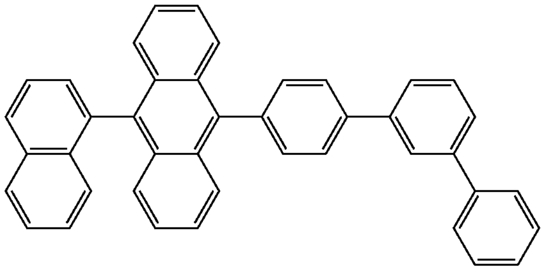

E5

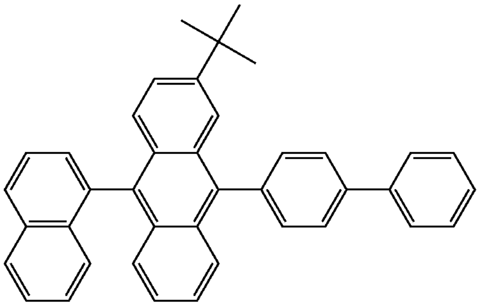

E6

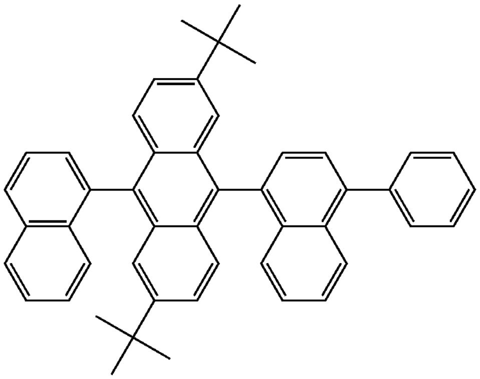

E7

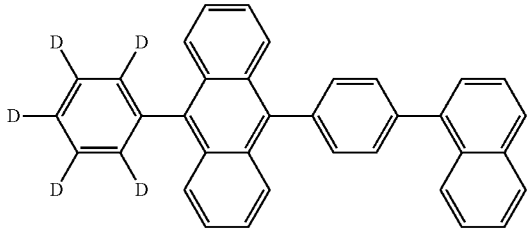

-continued
E8
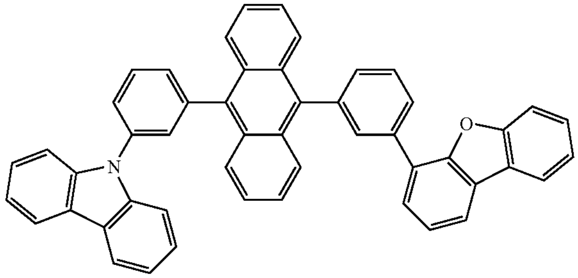
E9
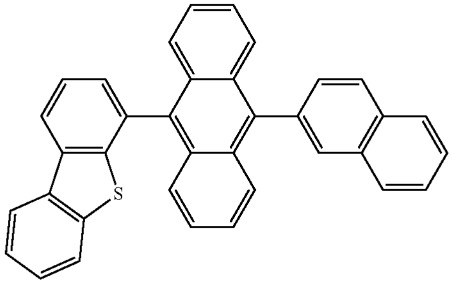
E10
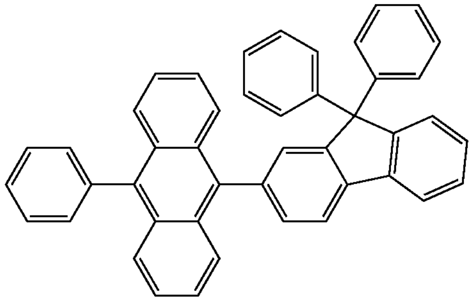
E11
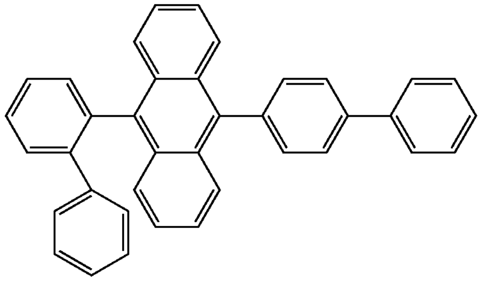
E12
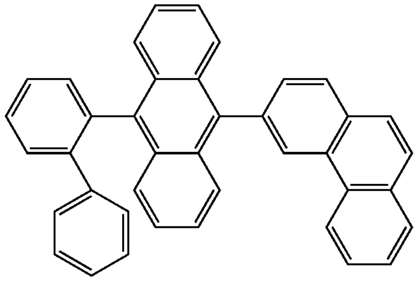
-continued
E13
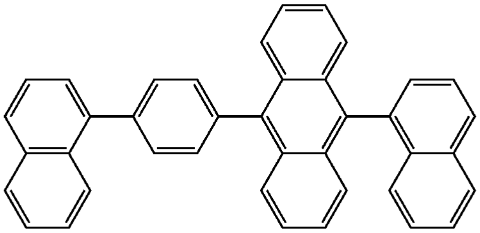
E14
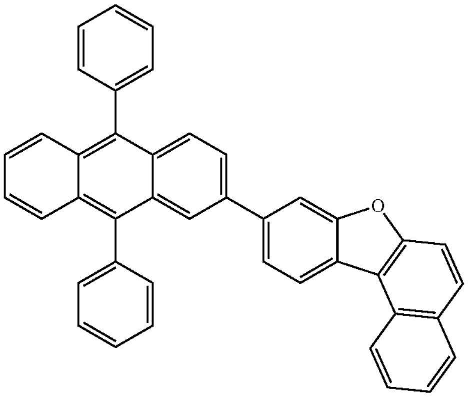
E15
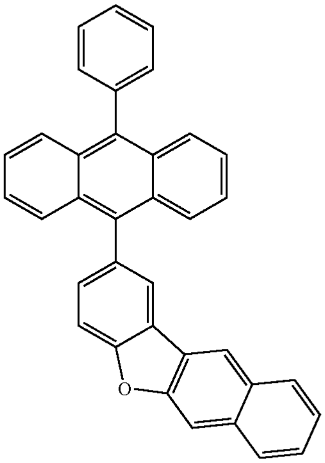
E16
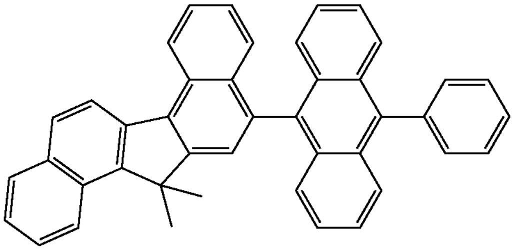

-continued

E17

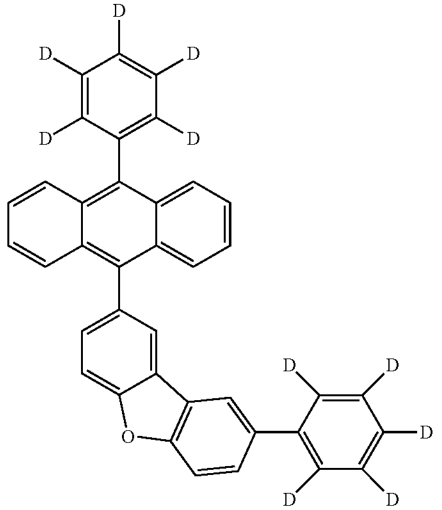

E18

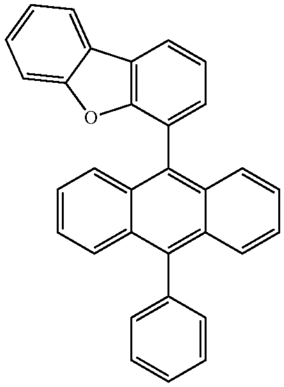

E19

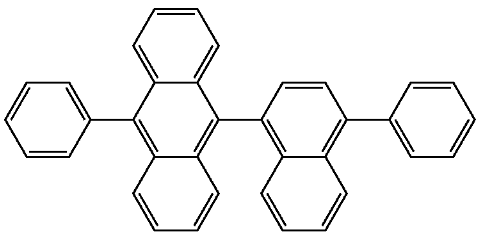

In an embodiment, the emission layer EML may include a compound represented by Formula E-2a or Formula E-2b. The compound represented by Formula E-2a or Formula E-2b may be used as a phosphorescence host material.

[Formula E-2a]

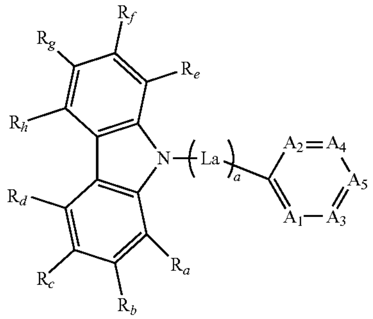

In Formula E-2b, a may be an integer from 0 to 10, and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

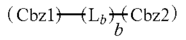

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds shown in Compound Group E-2 are only examples, and the compound represented by Formula E-2a or Formula E-2b is not limited to Compound Group E-2.

[Compound Group E-2]
E-2-1
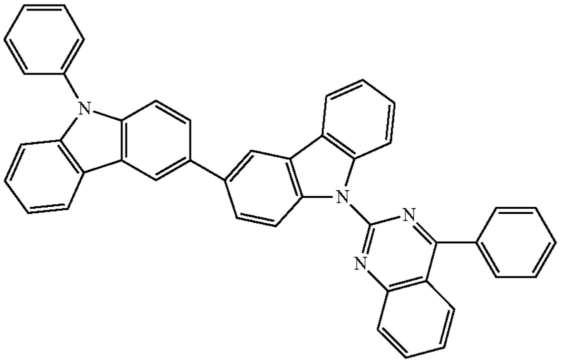
E-2-2
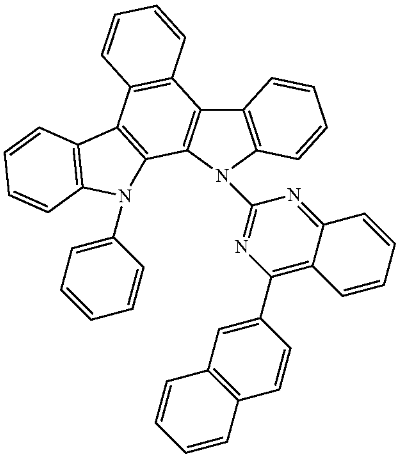
E-2-3
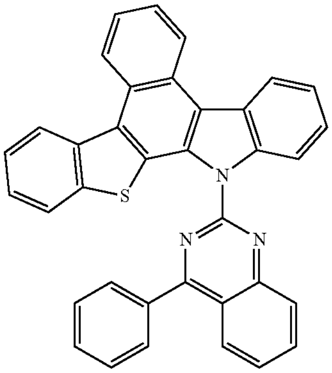
-continued
E-2-4
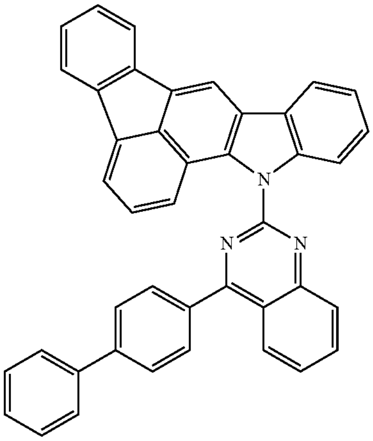
E-2-5
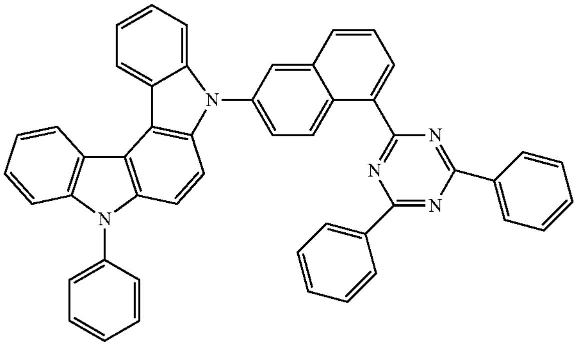
E-2-6
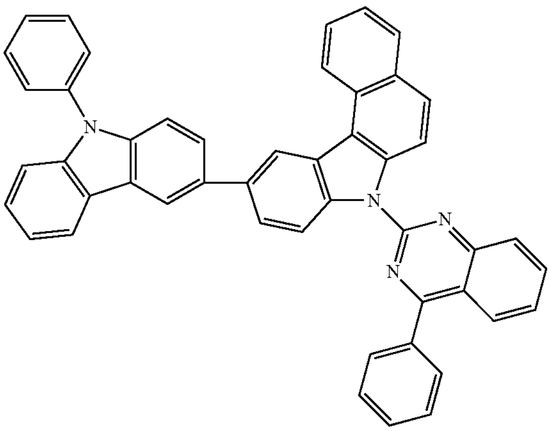

-continued
E-2-7
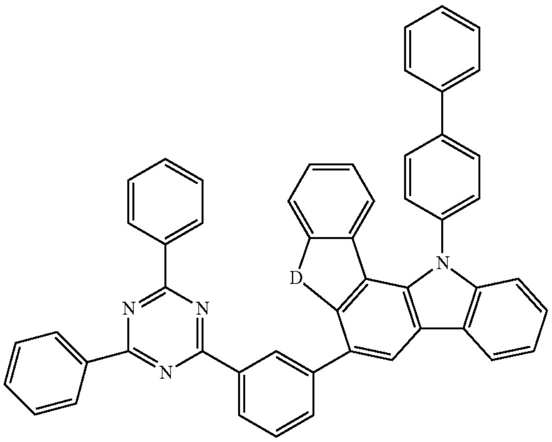
E-2-8
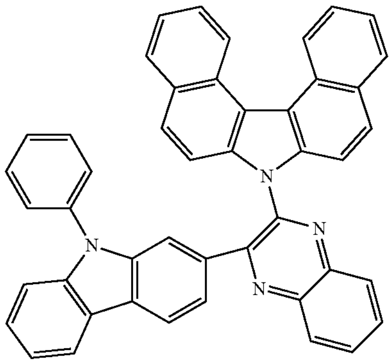
E-2-9
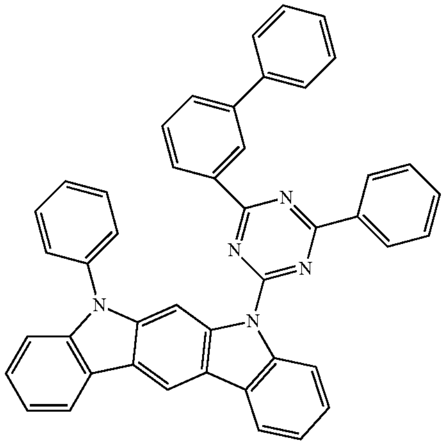
-continued
E-2-10
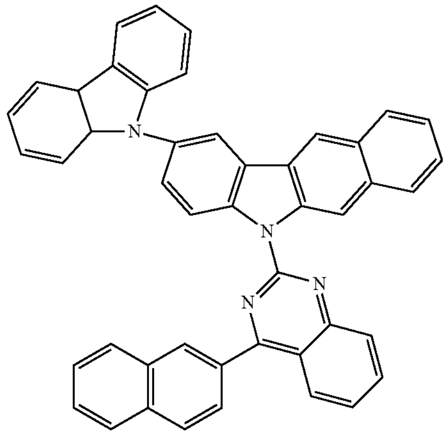
E-2-11
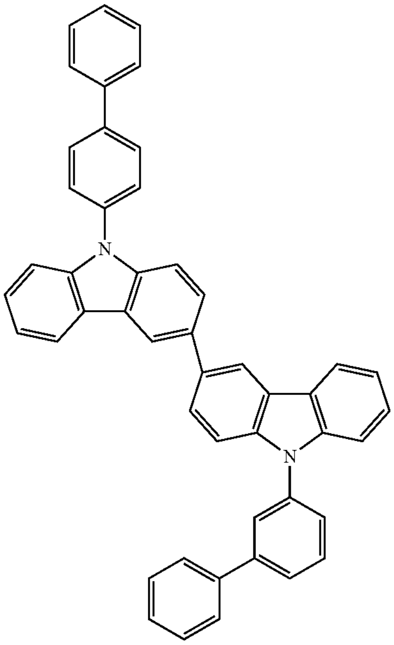
E-2-12
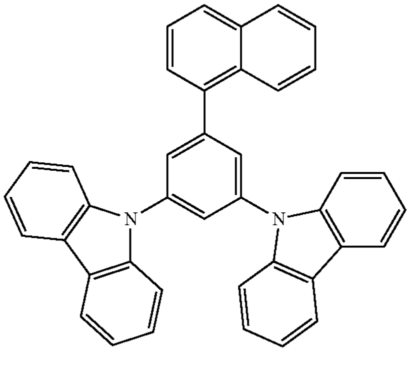

-continued
E-2-13
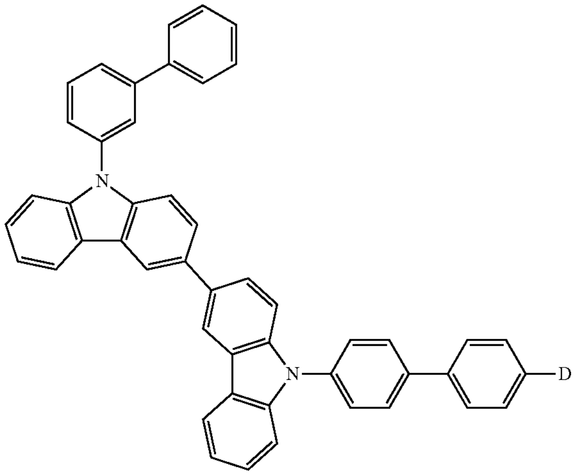
E-2-14
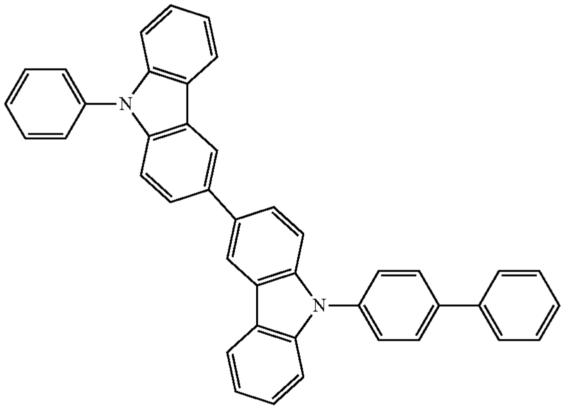
E-2-15
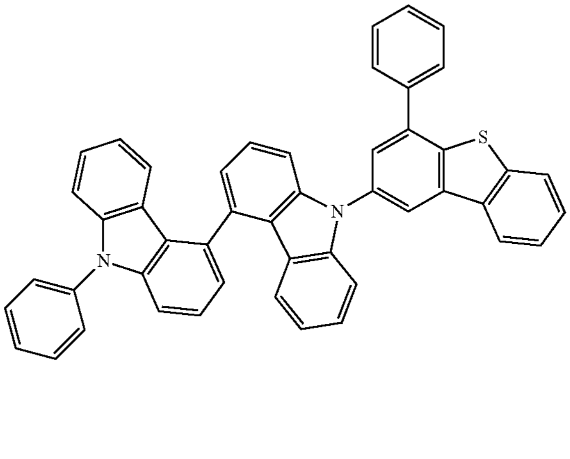
-continued
E-2-16
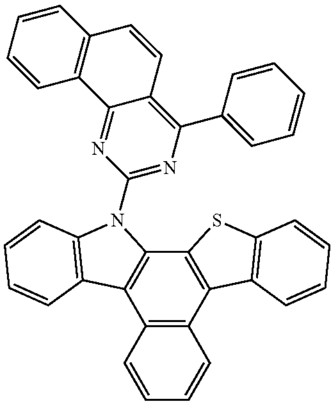
E-2-17
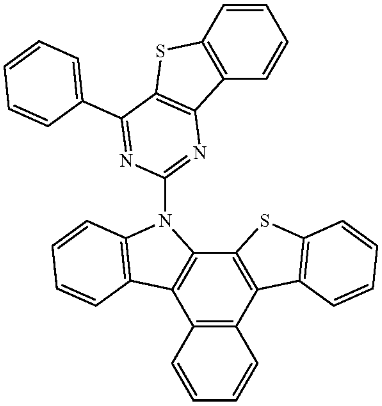
E-2-18
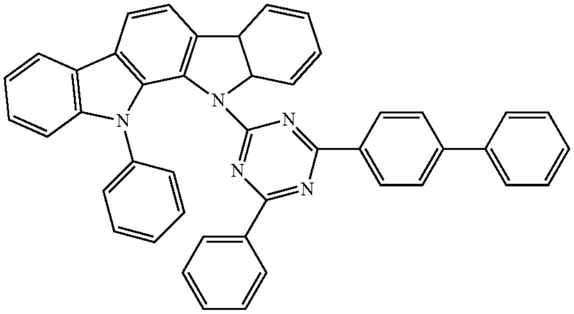
E-2-19
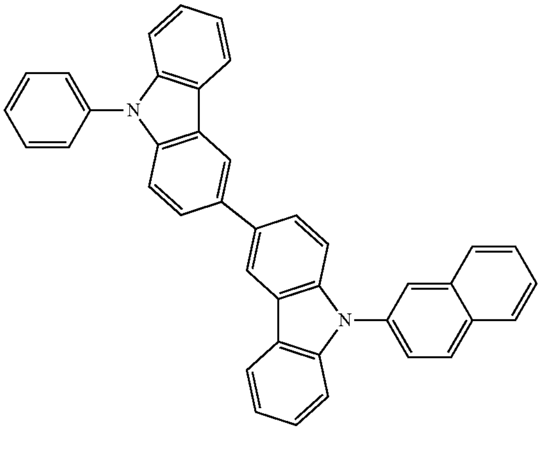

-continued

E-2-20

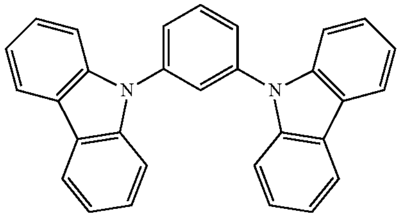

E-2-21

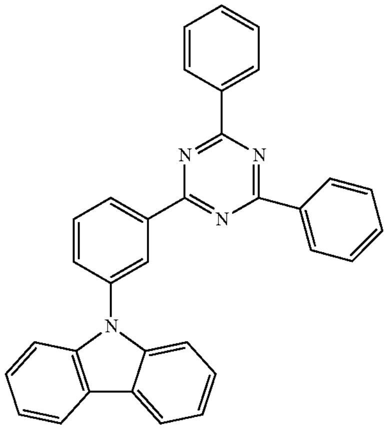

E-2-22

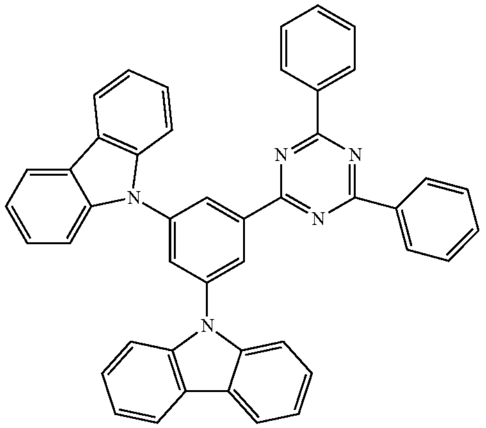

E-2-23

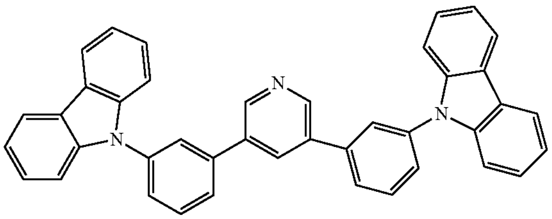

-continued

E-2-24

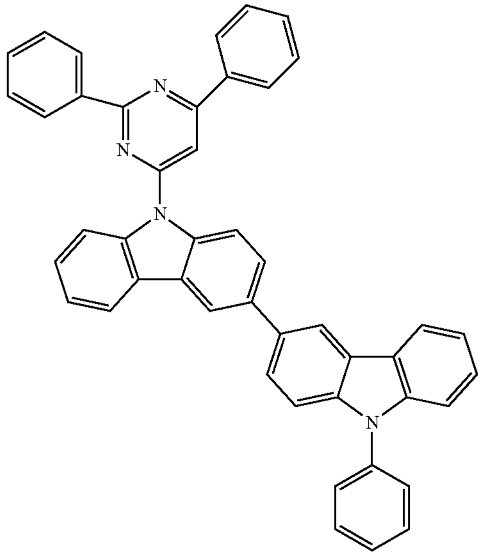

The emission layer EML may further include a common material in the art as a host material. For example, the emission layer EML may include as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(carbazol-9-yl)-1,1'-biphenyl (CBP), 1,3-bis(carbazol-9-yl) benzene (mCP), 2,8-bis(diphenylphosphoryl) dibenzo[b,d] furan (PPF), 4,4',4"-tris(carbazol-9-yl)-triphenylamine (TCTA), or 1,3,5-tris(1-phenyl-1H-benzo[d]imidazole-2-yl) benzene (TPBi). However, embodiments are not limited thereto. For example, tris(8-hydroxyquinolino)aluminum ($Alq_3$), 9,10-di(naphthalene-2-yl) anthracene (ADN), 2-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl) anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetrasiloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

[Formula M-a]

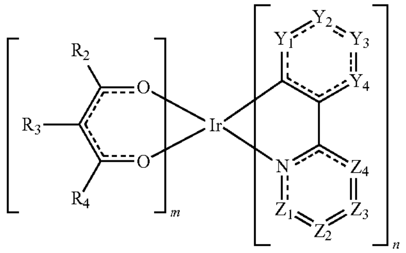

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, then n may be 3, and if m is 1, then n may be 2.

The compound represented by Formula M-a may be used as a phosphorescence dopant.

The compound represented by Formula M-a may be any one selected from Compounds M-a1 to M-a25. However, Compounds M-a1 to M-a25 are examples, and the compound represented by Formula M-a is not limited to Compounds M-a1 to M-a25.

M-a1

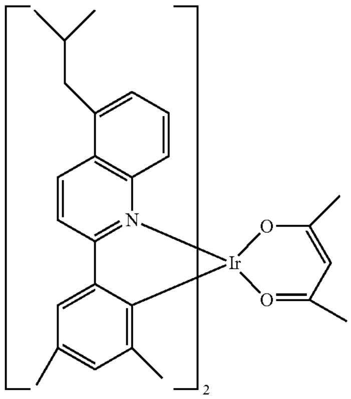

M-a2

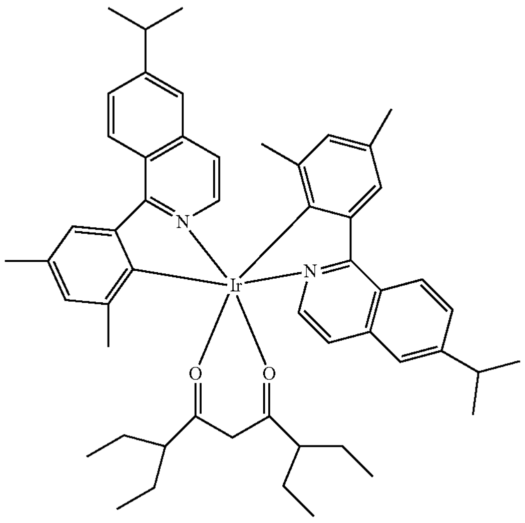

-continued

M-a3

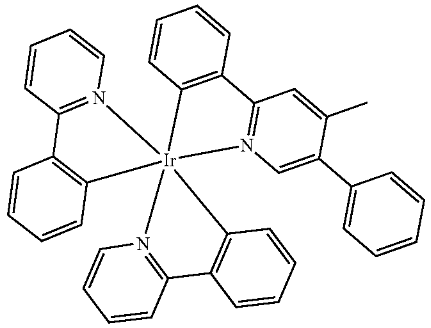

M-a4

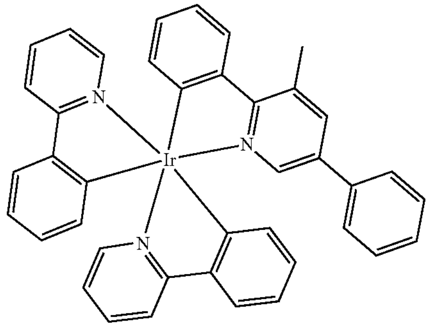

M-a5

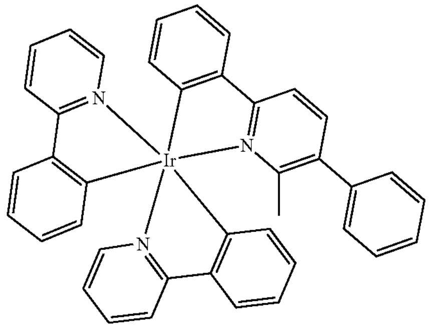

M-a6

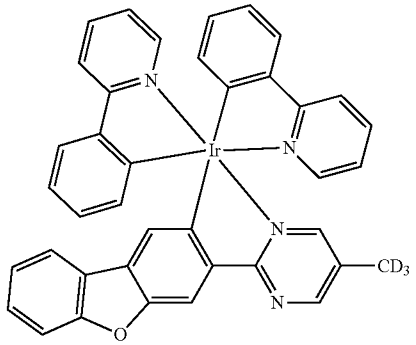

-continued
M-a7
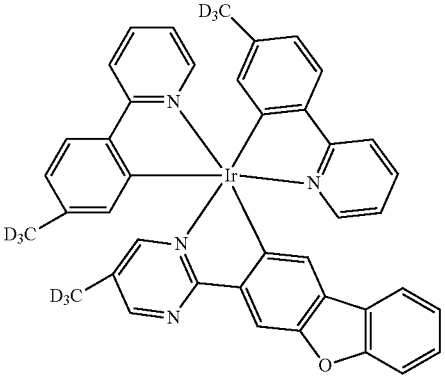
M-a8
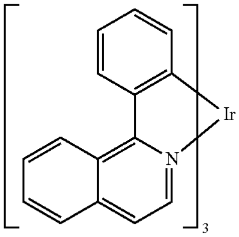
M-a9
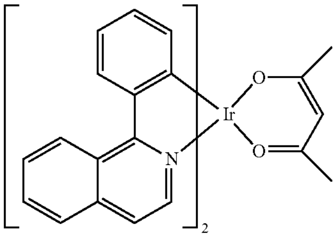
M-a10
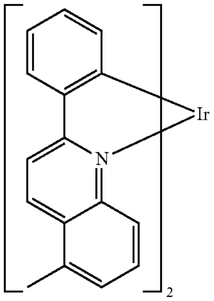
M-a11
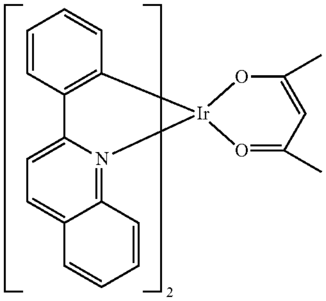
-continued
M-a12
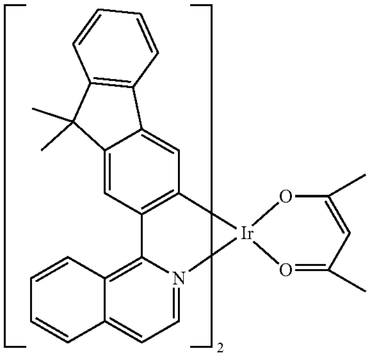
M-a13
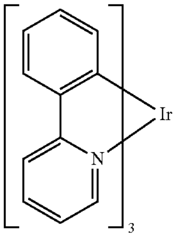
M-a14
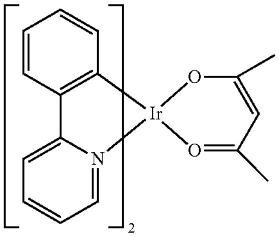
M-a15
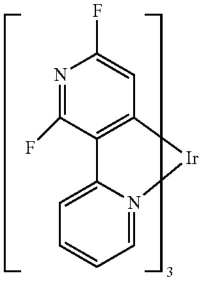
M-a16
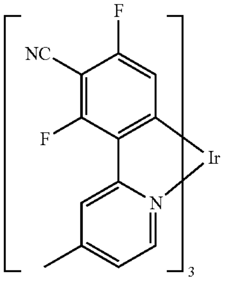

-continued
M-a17
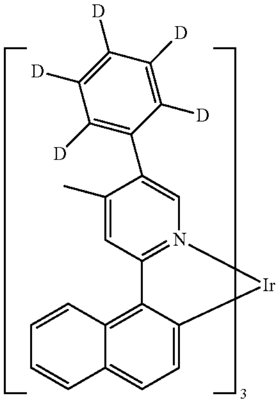
M-a18
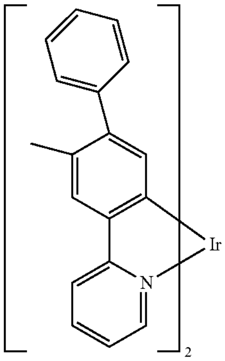
M-a19
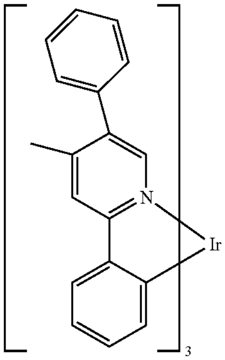
M-a20
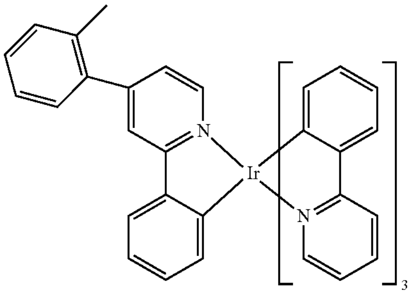
-continued
M-a21
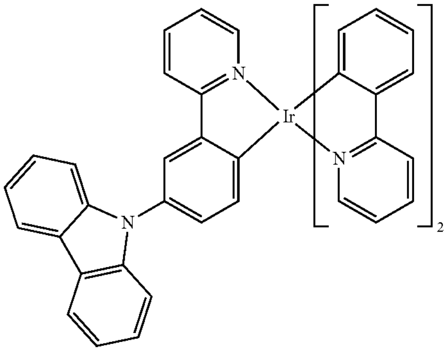
M-a22
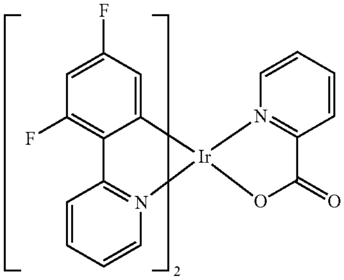
M-a23
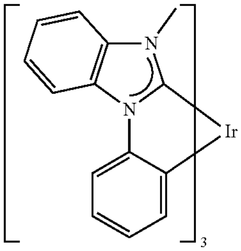
M-a24
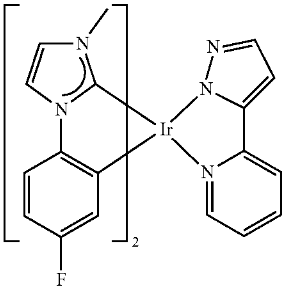
M-a25
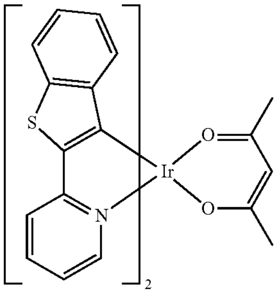
Compound M-a1 and Compound M-a2 may be used as red dopant materials, and Compound M-a3 to Compound M-a7 may be used as green dopant materials.

[Formula M-b]

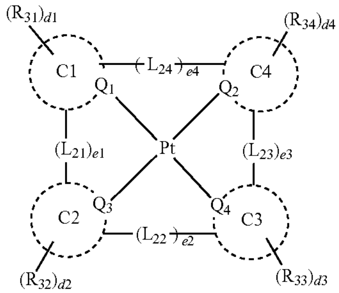

In Formula M-b, $Q_1$ to $Q_4$ may each independently be C or N, and $C_1$ to $C_4$ may each independently be a substituted or unsubstituted hydrocarbon ring of 5 to 30 ring-forming carbon atoms, or a substituted or unsubstituted heterocycle of 2 to 30 ring-forming carbon atoms. In Formula M-b, $L_{21}$ to $L_{24}$ may each independently be a direct linkage,

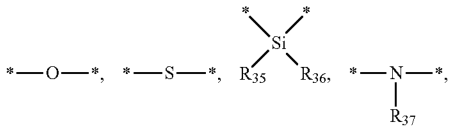

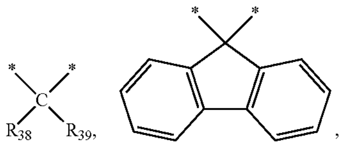

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be any one selected from Compound M-b-1 to Compound M-b-11. However, Compound M-b-1 to Compound M-b-11 are examples, and the compound represented by Formula M-b is not limited to Compound M-b-1 to Compound M-b-11.

M-b-1

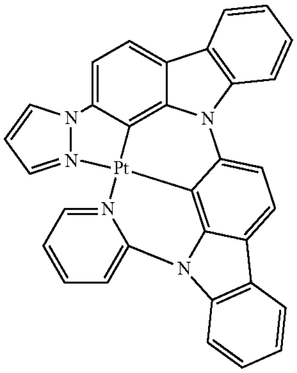

M-b-2

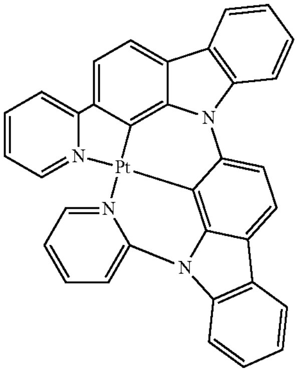

M-b-3

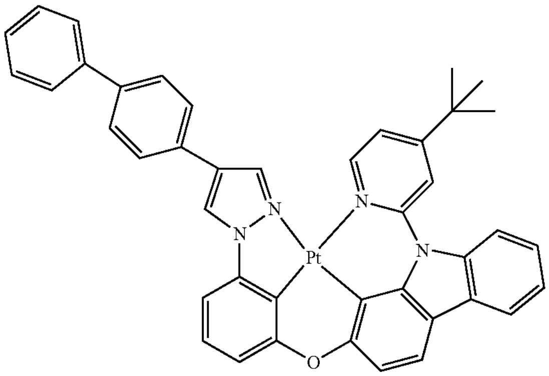

M-b-4

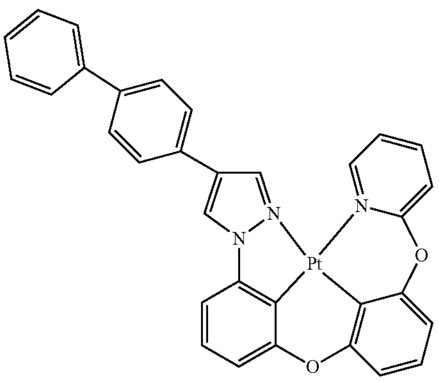

-continued

M-b-5

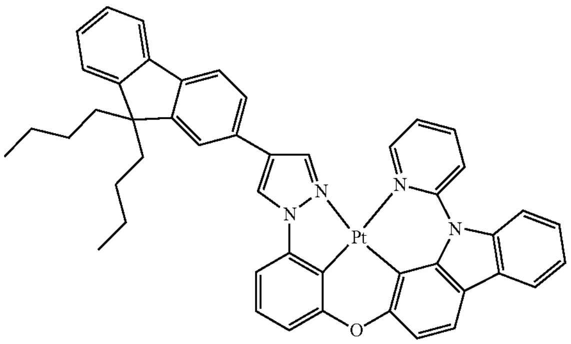

M-b-6

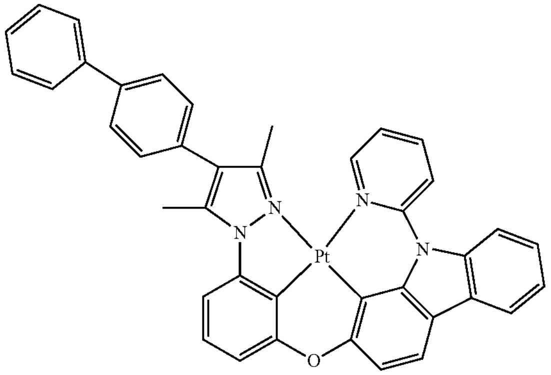

M-b-7

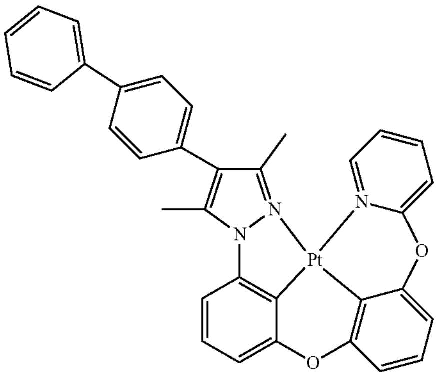

M-b-8

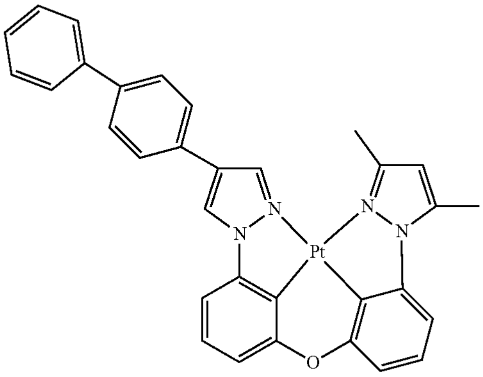

-continued

M-b-9

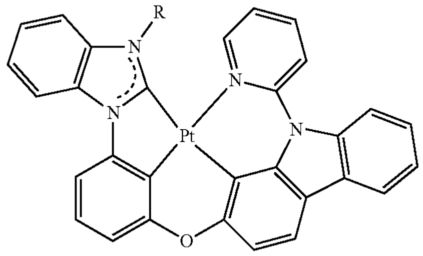

M-b-10

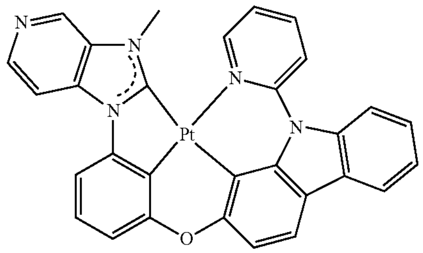

M-b-11

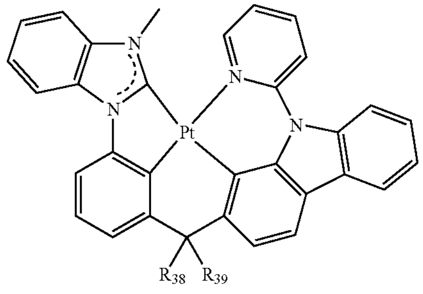

In Compound M-b-1 to Compound M-b-11, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by any one of Formula F-a to Formula F-c. The compounds represented by Formula F-a to Formula F-c may be used as fluorescence dopant materials.

[Formula F-a]

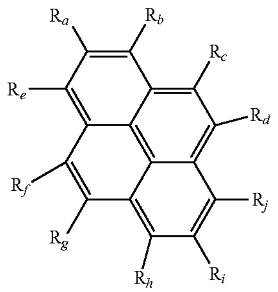

In Formula F-a, two selected from $R_a$ to $R_j$ may each independently be substituted with a group represented by $*$—$NAr_1Ar_2$. The remainder of $R_a$ to $R_j$ not substituted with the group represented by —$NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by ·—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ and $Ar_2$ may be a heteroaryl group including O or S as a ring-forming atom.

[Formula F-b]

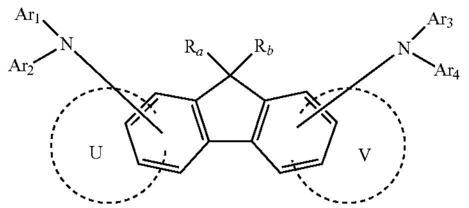

In Formula F-b, $R_a$ and $R_b$ may each independently be a hydrogen atom, a deuterium atom, a substituted or unsubstituted alkyl group of 1 to 20 carbon-atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula F-b, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, a fused ring may be present at the part designated by U or V, and if the number of U or V is 0, a ring may not be present at the part designated by U or V. If the number of U is 0 and the number of V is 1, or if the number of U is 1 and the number of V is 0, a fused ring having the fluorene core of Formula F-b may be a ring compound with four rings. If the number of both U and V is 0, the fused ring of Formula F-b may be a ring compound with three rings. If the number of both U and V is 1, a fused ring having the fluorene core of Formula F-b may be a ring compound with five rings.

[Formula F-c]

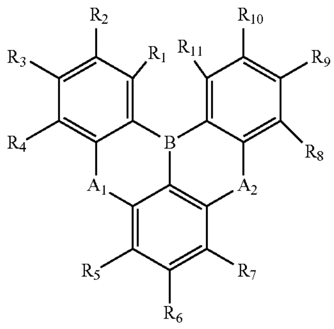

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $Ar_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include as a dopant material, styryl derivatives (for example, 1,4-bis[2-(3-N-ethylcarbazoryl) vinyl]benzene (BCzVB), 4-(di-p-tolylamino)-4'-[(di-p-tolylamino) styryl]stilbene (DPAVB), and N-(4-((E)-2-(6-((E)-4-(diphenylamino) styryl) naphthalene-2-yl) vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino) pyrene), etc.

The emission layer EML may include a phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). Particularly, iridium(III) bis(4,6-difluorophenylpyridinato-N,C2') picolinate (FIrpic), bis(2,4-difluorophenylpyridinato)-tetrakis(1-pyrazolyl) borate iridium (III)(Fir6), or platinum octaethyl porphyrin (PtOEP) may be used as the phosphorescence dopant. However, embodiments are not limited thereto.

In the organic electroluminescence devices ED of embodiments as shown in FIG. 3 to FIG. 6, the electron transport region ETR is provided on the emission layer EML. The electron transport region ETR may include at least one of a hole blocking layer HBL, an electron transport layer ETL or an electron injection layer EIL. However, embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, or a single layer structure formed of an electron injection material and an electron transport material. The electron transport region ETR may have a single layer structure formed of different materials, or may have a structure in which an electron transport layer ETL/electron injection layer EIL, or a hole blocking layer HBL/electron transport layer ETL/electron injection layer EIL are stacked in its respective stated order from the emission layer EML, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

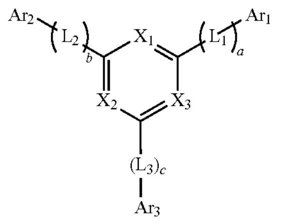

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl) biphenyl-3-yl)-1,3,5-triazine, 2-(4-(N-phenylbenzoimidazolyl-1-ylphenyl)-9,10-dinaphthylanthracene, 1,3,5-tri (1-phenyl-1H-benzo[d]imidazol-2-yl) benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di (naphthalene-2-yl) anthracene (ADN), 1,3-bis[3,5-di(pyridin-3-yl)phenyl]benzene (BmPyPhB), and mixtures thereof, without limitation.

The electron transport region ETR may include at least one of Compounds ET1 to ET36.

ET1

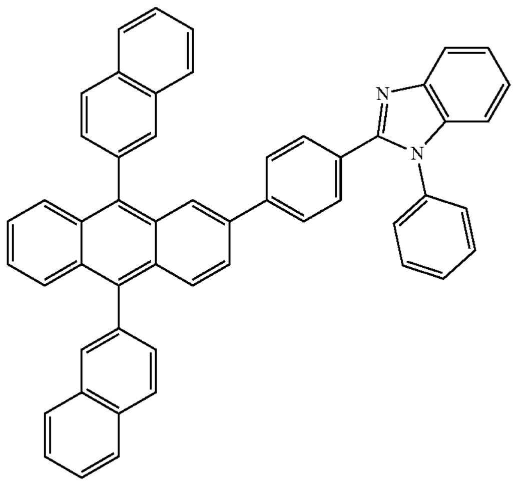

ET2

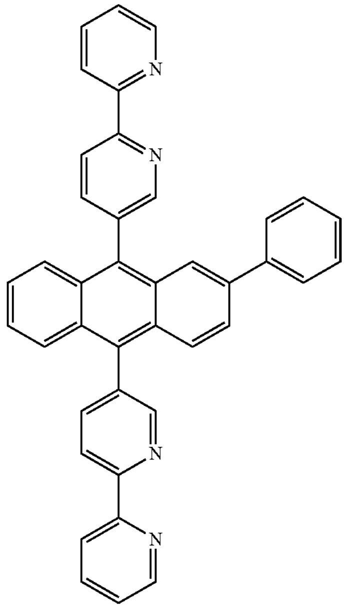

-continued
ET3
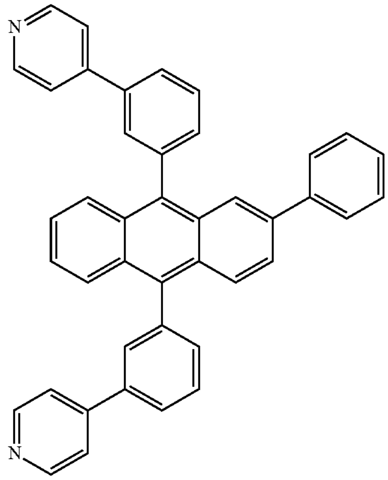
ET4
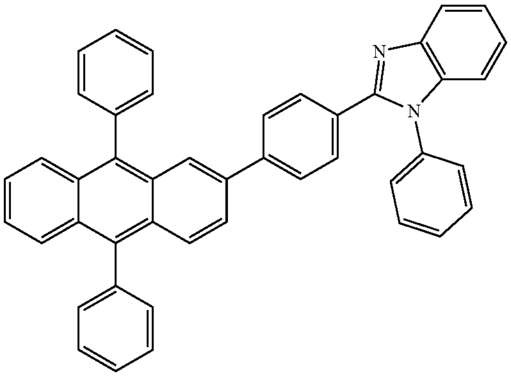
ET5
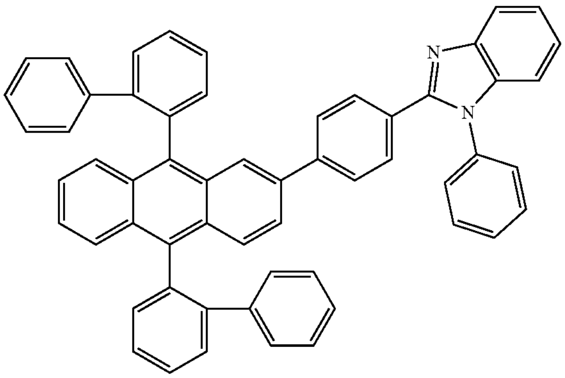
-continued
ET6
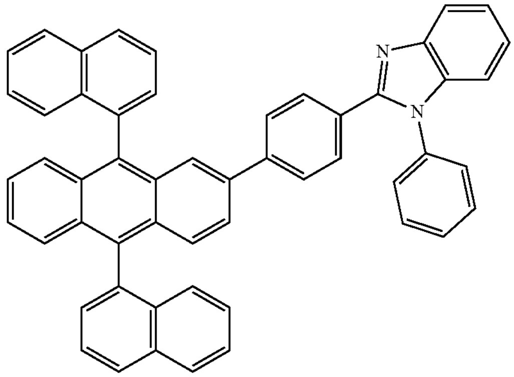
ET7
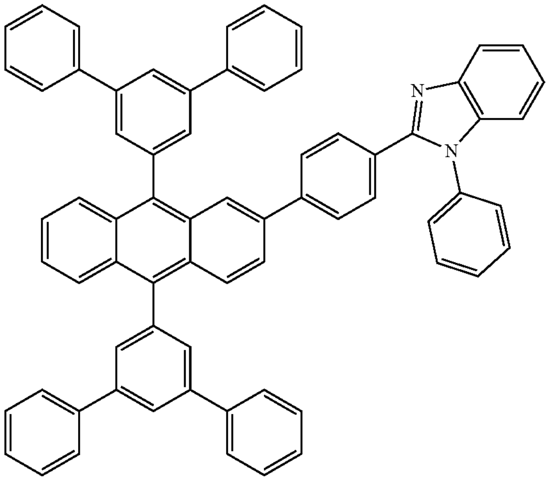
ET8
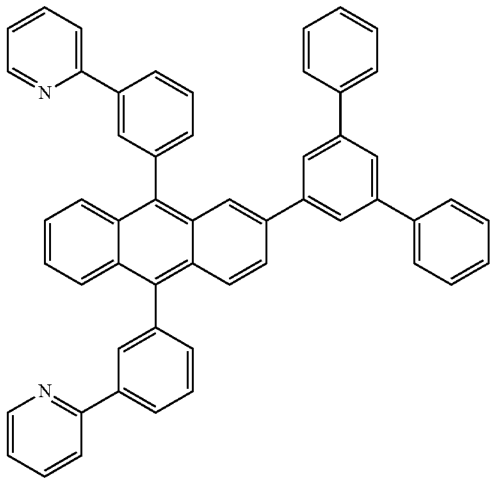

-continued
ET9
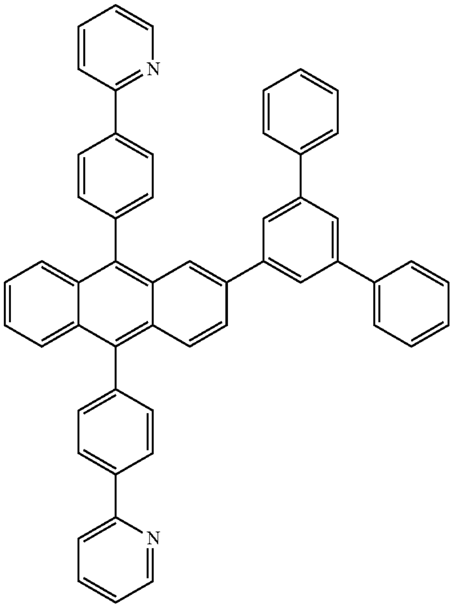
ET10
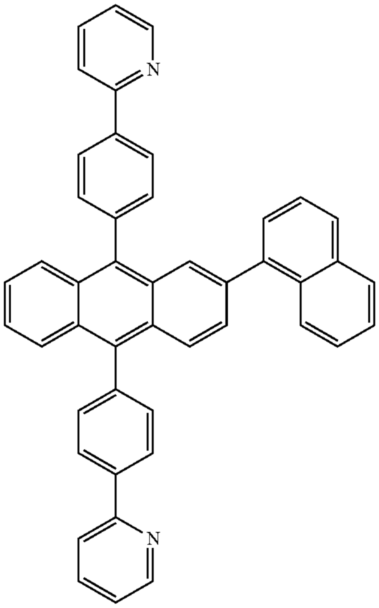
-continued
ET11
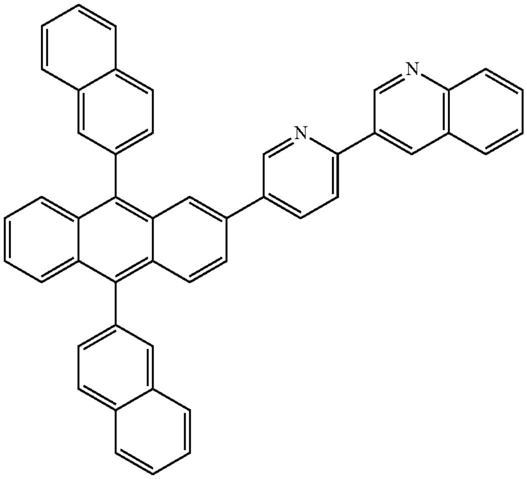
ET12
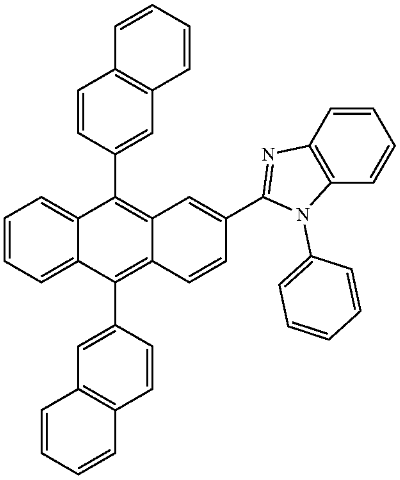
ET13
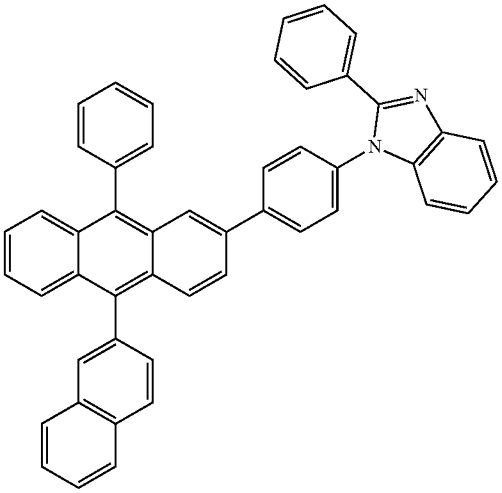

-continued
ET14
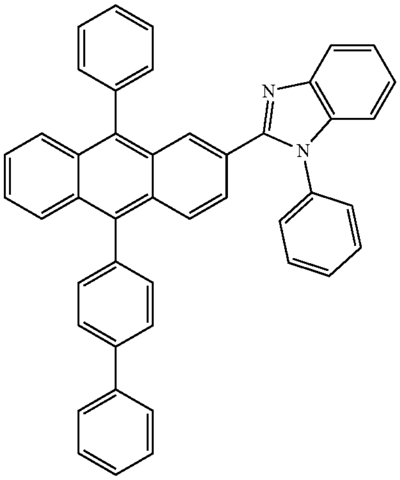
ET15
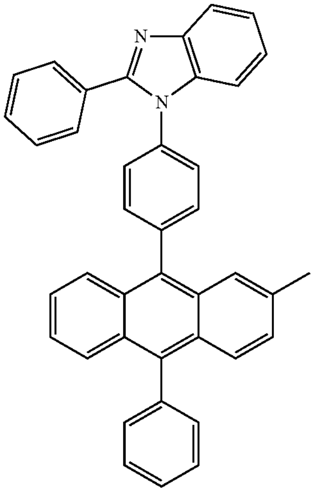
ET16
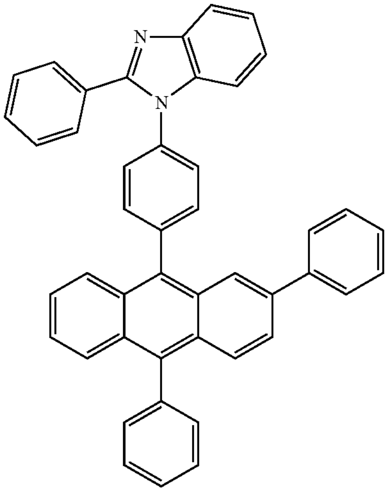
-continued
ET17
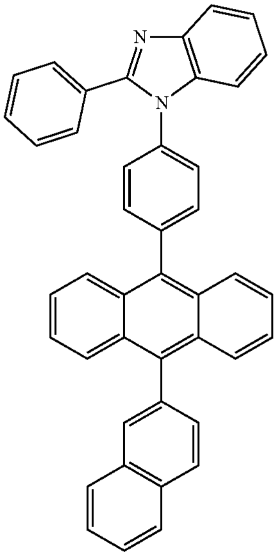
ET18
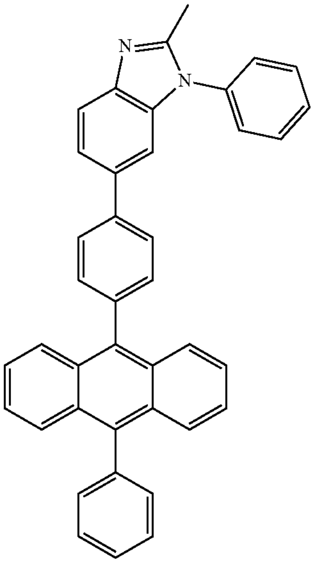
ET19
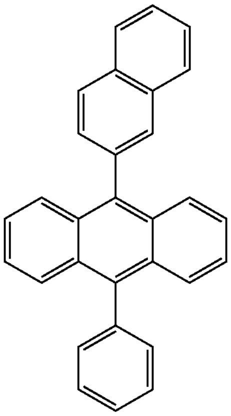

-continued
ET20
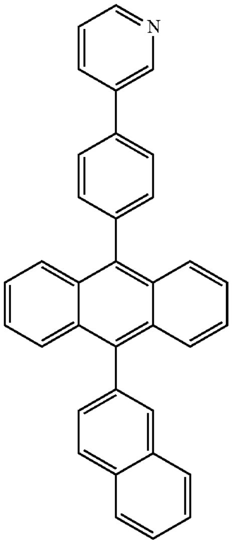
ET21
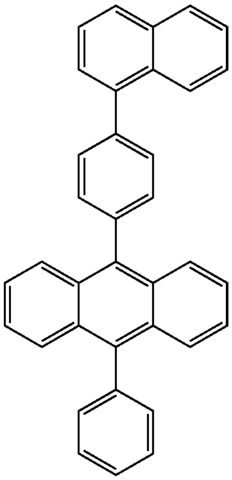
ET22
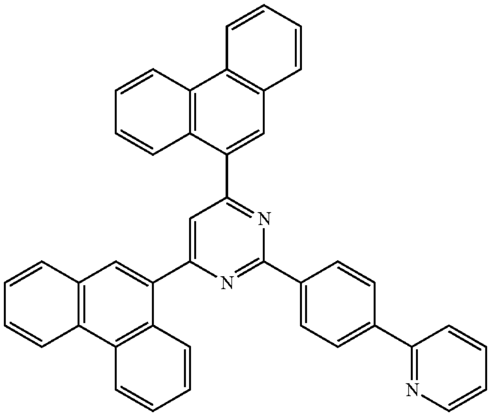
-continued
ET23
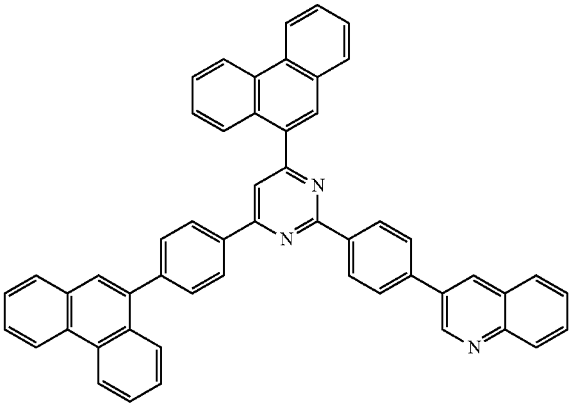
ET24
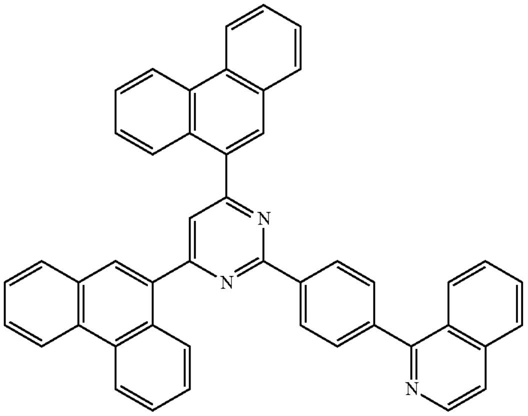
ET25
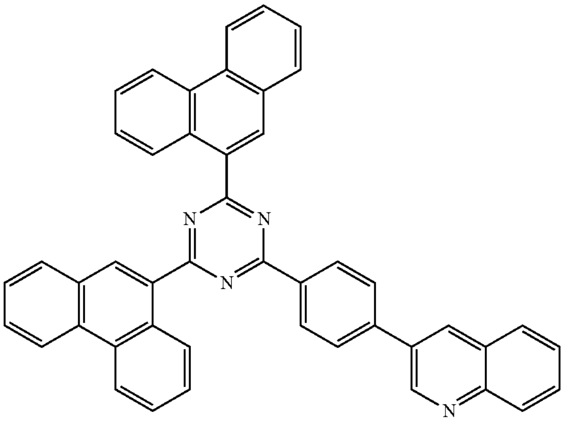

-continued
ET26
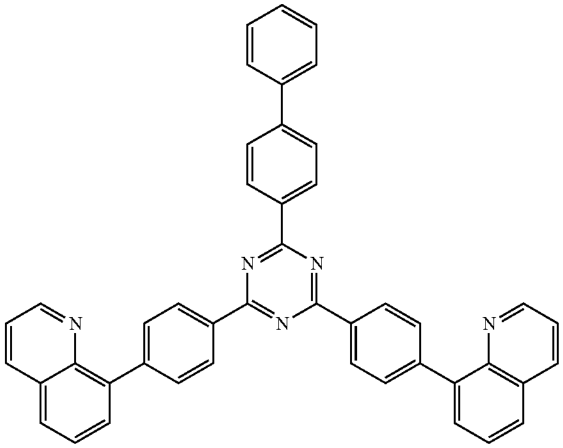
ET27
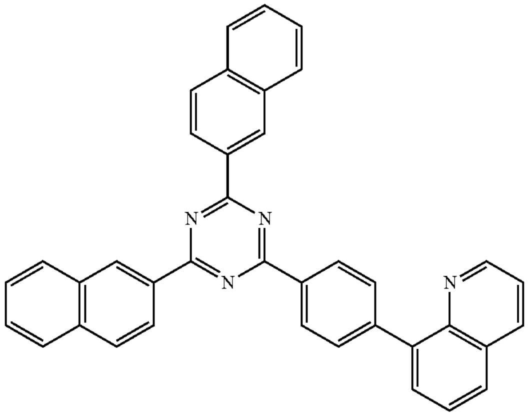
ET28
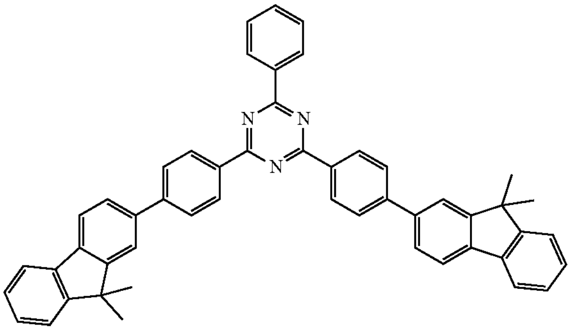
-continued
ET29
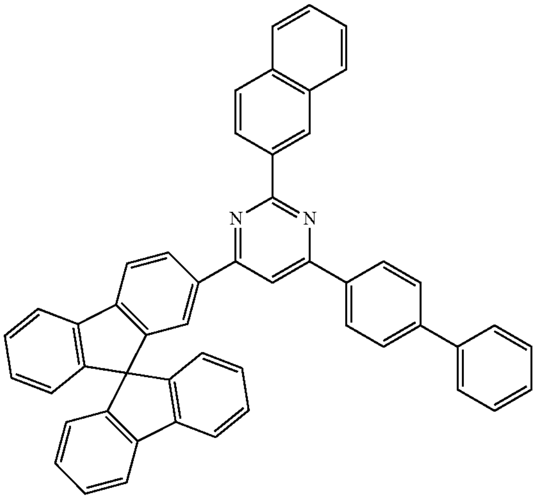
ET30
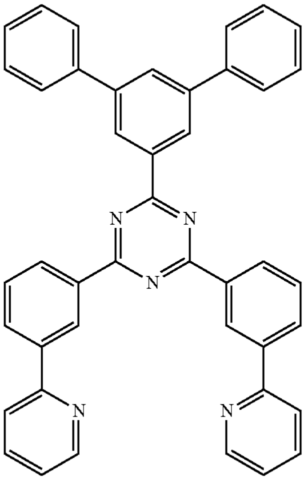
ET31
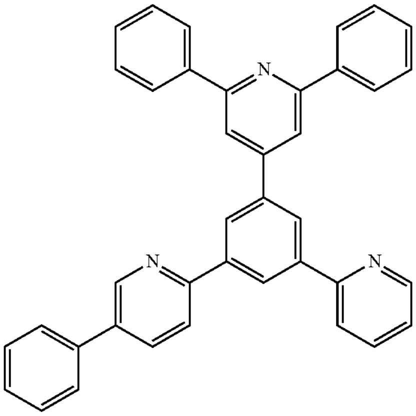

-continued

ET32

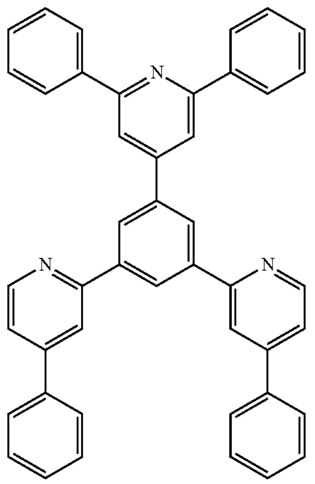

ET33

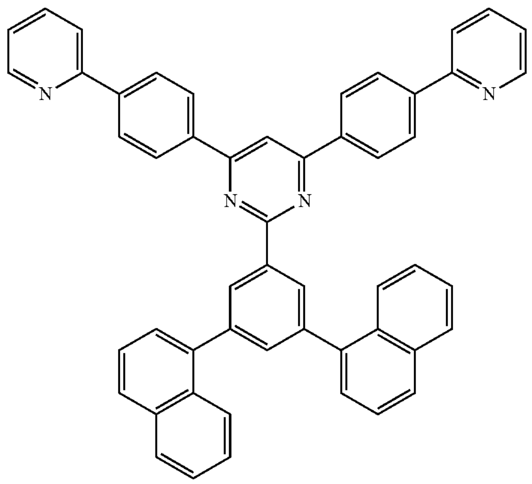

ET34

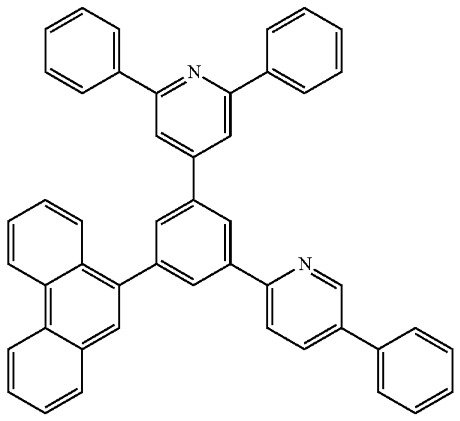

-continued

ET35

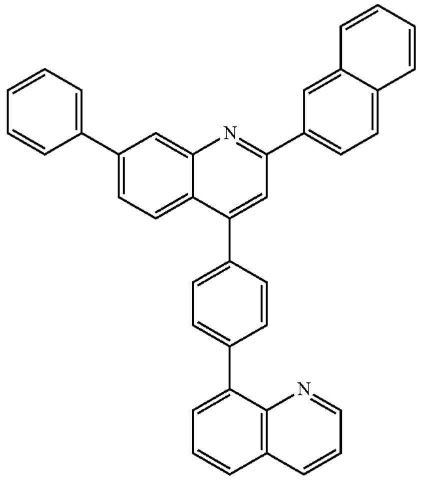

ET36

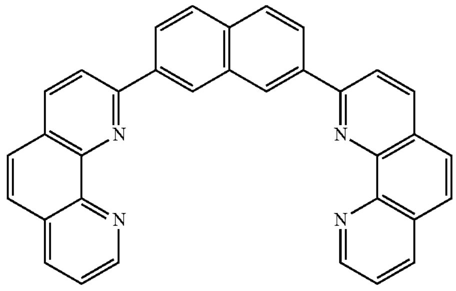

The electron transport region ETR may include a metal halide such as LiF, NaCl, CsF, RbCl, RbI, CuI and KI, a lanthanide metal such as Yb, or a co-deposited material of the metal halide and the lanthanide metal. For example, the electron transport region ETR may include KI:Yb, RbI:Yb, etc., as a co-deposited material. The electron transport region ETR may include a metal oxide such as $Li_2O$ and BaO, or 8-hydroxy-lithium quinolate (Liq). However, embodiments are not limited thereto. The electron transport region ETR may be formed of a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, and a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase of driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without a substantial increase of driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second electrode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In another embodiment, the second electrode EL2 may have a multi-layered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the organic electroluminescence device ED may further include a capping layer CPL disposed, on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl)triphenylamine (TCTA), etc., or may include an epoxy resin, or acrylate such as methacrylate. The capping layer CPL may include at least one selected from Compounds P1 to P5, but embodiments are not limited thereto.

P1

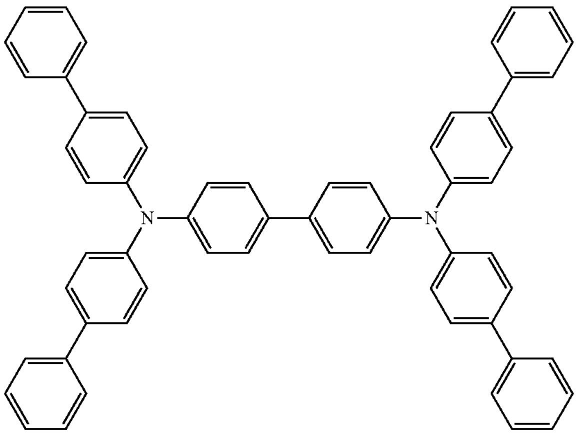

P2

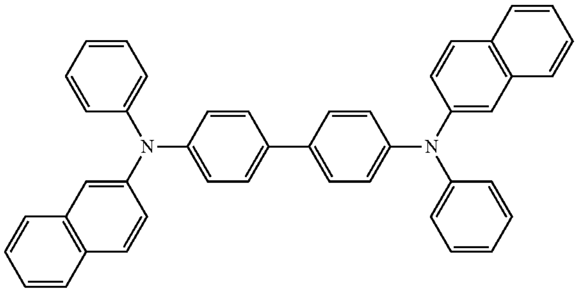

P3

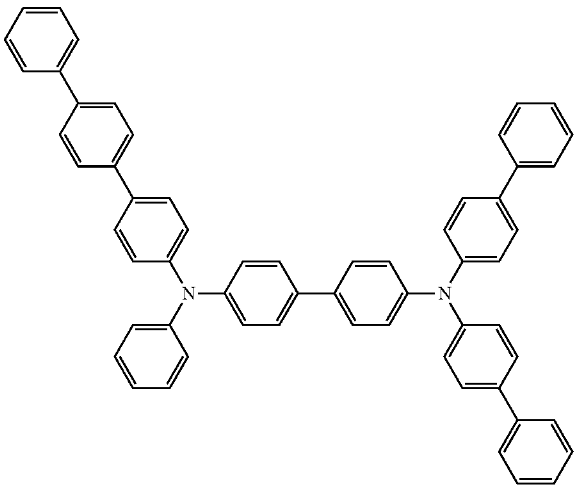

P4

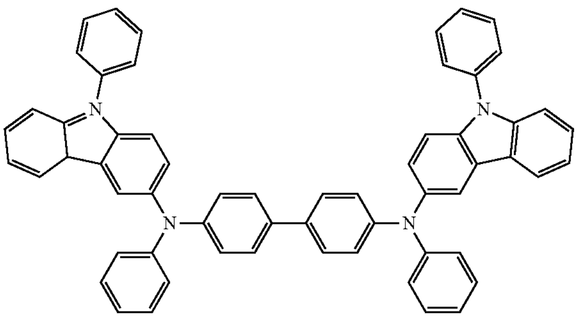

-continued

P5

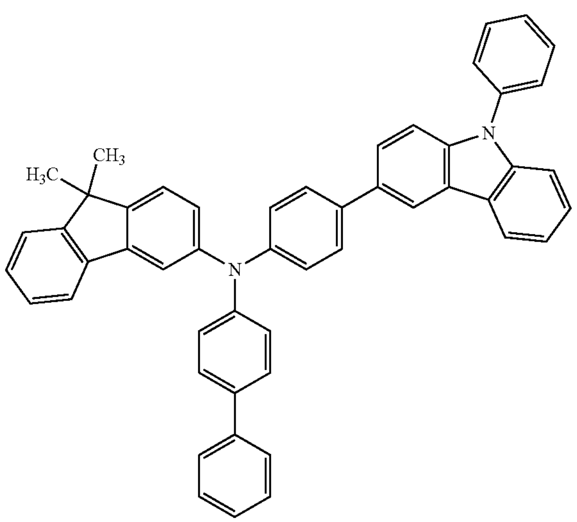

A refractive index of the capping layer CPL may be equal to or greater than about 1.6. For example, the capping layer CPL may have a refractive index equal to or greater than about 1.6 with respect to light in a wavelength range of about 550 nm to about 660 nm.

Figure 7:
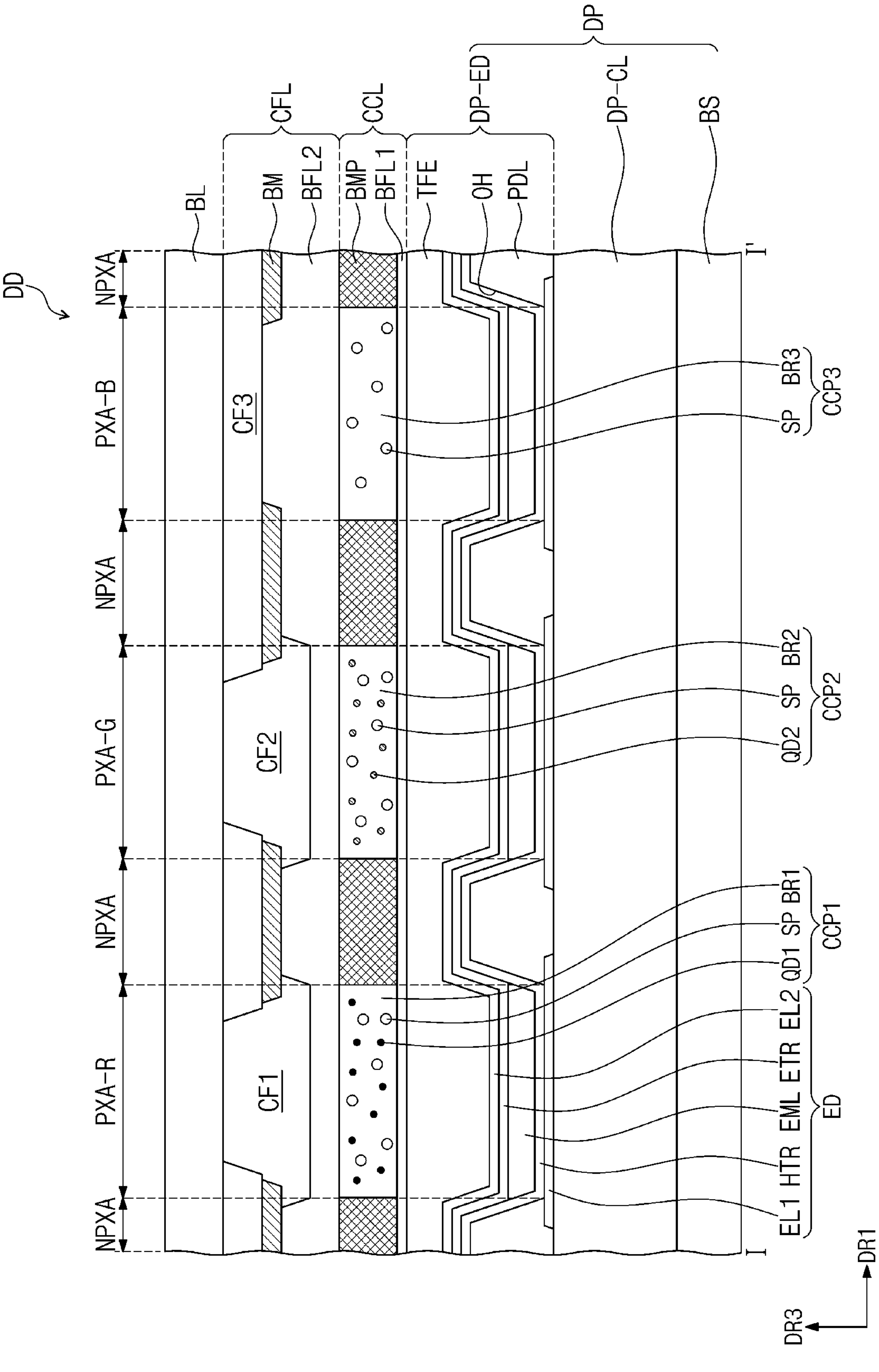
FIG. 7 is a schematic cross-sectional view showing a display apparatus according to an embodiment.
Figure 8:
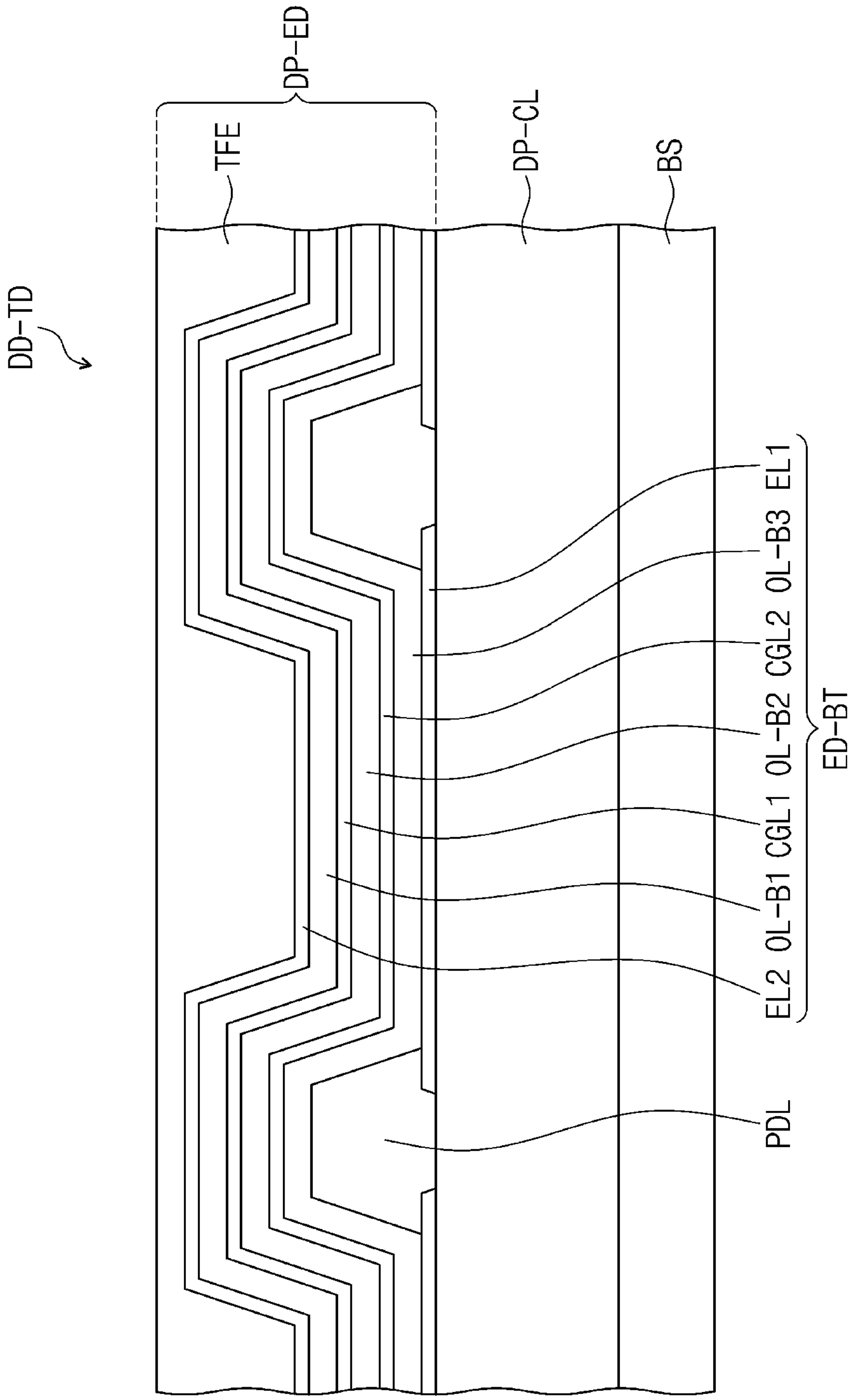
FIG. 8 is a schematic cross-sectional view showing a display apparatus according to an embodiment.

FIG. 7 and FIG. 8 are each a schematic cross-sectional view of a display apparatus according to embodiments. In the explanation on the display apparatuses of embodiments according to FIG. 7 and FIG. 8, the overlapping parts with the explanation on FIG. 1 to FIG. 6 will not be explained again, and the different features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP may include a base layer BS, a circuit layer DP-CL provided on the base layer BS, and a display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the organic electroluminescence device according to FIG. 3 to FIG. 6 may be applied to the structure of the organic electroluminescence device ED shown in FIG. 7.

Referring to FIG. 7, the emission layer EML may be disposed in opening OH defined in a pixel definition layer PDL. For example, the emission layer EML which is divided by the pixel definition layer PDL and correspondingly provided to each of the luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may convert the wavelength of a provided light and may emit the converted light. For example, the light controlling layer CCL may be a layer including a quantum dot or a layer including a phosphor.

The quantum dot may be a Group II-VI compound, a Group III-VI compound, a Group I-III-VI compound, a Group III-V compound, a Group III-II-V compound, a Group IV-VI compound, a Group IV element, a Group IV compound, and combinations thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof; or any combination thereof.

The Group III-VI compound may be a binary compound such as $In_2S_3$, and $In_2Se_3$; a ternary compound such as $InGaS_3$, and $InGaSe_3$; or any combinations thereof.

The Group I-III-VI compound may be a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, a quaternary compound such as $AgInGaS_2$, and $CuInGaS_2$; or any combination thereof.

The Group III-V compound may be a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof; or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; a quaternary compound selected from the group consisting of SnPbSSe, SnPbSeTe, SnPbSTe, and mixtures thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present in a particle at a partially different concentration distribution state. In an embodiment, the quantum dot may have a core/shell structure in which one quantum dot surrounds another quantum dot. The interface of the core and the shell may have a concentration gradient in which the concentration of an element that is present in the shell decreases toward the center.

In embodiments, the quantum dot may have a core-shell structure including a core including a nanocrystal and a shell surrounding the core. The shell of the quantum dot may be a protection layer that prevents chemical deformation of the core to maintain semiconductor properties and/or may be a charging layer that imparts electrophoretic properties to the quantum dot. The shell may be a single layer or a multilayer. Examples of the shell of the quantum dot may include a metal oxide, a non-metal oxide, a semiconductor compound, or combinations thereof.

For example, the metal oxide or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO; or a ternary compound such as $MgAl_2O_4$, $CoFe_2O_4$, $NiFe_2O_4$ and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within these ranges, color purity or color reproducibility may be improved. Light emitted through the quantum dot may be emitted in all directions, and light viewing angle properties may be improved.

The shape of the quantum dot may be a shape that is used in the art, without limitation. For: example, a quantum dot may have a spherical shape, a pyramidal shape, a multi-arm shape, or a cubic shape, or the quantum dot may be in the form of a nanoparticle, a nanotube, a nanowire, a nanofiber, a nanoplate, etc.

The quantum dot may control the color of light emitted according to a particle size thereof, and accordingly, the quantum dot may have various emission colors such as blue, red, and green.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. FIG. 7 illustrates that the partition pattern BMP does not overlap the light controlling parts CCP1, CCP2, and CCP3, but at least a portion of the edge of the light controlling parts CCP1, CCP2, and CCP3 may overlap the partition pattern BMP.

The light controlling layer CCL may include a first light controlling part CCP1 including a first quantum dot QD1 that converts first color light provided from the organic electroluminescence device ED into second color light, a second light controlling part CCP2 including a second quantum dot QD2 that converts first color light into third color light, and a third light controlling part CCP3 that transmits first color light.

In an embodiment, the first light controlling part CCP1 may provide red light which is the second color light, and the second light controlling part CCP2 may provide green light which is the third color light. The third light controlling part CCP3 may transmit and provide blue light, which is the first color light provided from the organic electroluminescence device ED. For example, the first quantum dot QD1 may be a red quantum dot, and the second quantum dot QD2 may be a green quantum dot. The same descriptions as provided above with respect to quantum dots may be applied to the quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may each include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 may each be a medium in which the quantum dots QD1 and QD2 and the scatterer SP are dispersed, and may be composed of various resin compositions which may be generally referred to as a binder. For example, the base resins BR1, BR2, and BR3 may each independently be acrylic resins, urethane-based resins, silicone-based resins, epoxy-based resins, etc. The base resins BR1, BR2, and BR3 may each be transparent resins. In an embodiment, the first base resin BR1, the second base resin BR2 and the third base resin BR3 may be the same as or different from each other.

The light controlling layer CCL may include a barrier layer BFL1. The barrier layer BFL1 may block penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. For example, the barrier layer BFL2 may be provided between the light controlling parts CCP1, CCP2, and CCP3 and a color filter layer CFL.

The barrier layers BFL1 and BFL2 may each include at least one inorganic layer. For example, the barrier layers BFL1 and BFL2 may each be formed by including an inorganic material. For example, the barrier layers BFL1 and BFL2 may each independently include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may each further include an organic layer. The barrier layers BFL1 and BFL2 may each be formed of a single layer or of multiple layers.

In the display apparatus DD of an embodiment, the color filter layer CFL may be disposed on the light controlling layer CCL. In an embodiment, the color filter layer CFL may be disposed directly on the light controlling layer CCL. For example, the barrier layer BFL2 may be omitted.

The color filter layer CFL may include a light blocking part BM and filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may be provided in one body without distinction.

The light blocking part BM may be a black matrix. The light blocking part BM may include an organic light blocking material or an inorganic light blocking material including a black pigment or a black dye. The light blocking part BM may prevent light leakage and may separate the boundaries between adjacent filters CF1, CF2 and CF3. In an embodiment, the light blocking part BM may be formed as a blue filter.

The first to third filters CF1, CF2, and CF3 may be disposed corresponding to each of a red luminous area PXA-R, green luminous area PXA-G, and blue luminous area PXA-B.

A base substrate BL may be disposed on the color filter layer FCL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

FIG. 8 is a schematic cross-sectional view showing a portion of the display apparatus according to an embodiment. In FIG. 8, a schematic cross-sectional view of a portion corresponding to the display panel DP in FIG. 7 is shown. In a display apparatus DD-TD of an embodiment, the organic electroluminescence device ED-BT may include multiple light emitting structures OL-B1, OL-B2, and OL-B3. The organic electroluminescence device ED-BT may include a first electrode EL1 and an oppositely disposed second electrode EL2, and the light emitting structures OL-B1, OL-B2, and OL-B3 stacked in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the organic electroluminescence device ED-BT included in the display apparatus DD-TD of an embodiment may be an organic electroluminescence device having a tandem structure and including multiple emission layers.

In an embodiment shown in FIG. 8, light emitted from the light emitting structures OL-B1, OL-B2, and OL-B3 may be all blue light. However, embodiments are not limited thereto, and the light emitted from the light emitting structures OL-B1, OL-B2, and OL-B3 may have different wavelength regions from each other. For example, the organic electroluminescence device ED-BT including the light emitting structures OL-B1, OL-B2, and OL-B3 emitting light in different wavelength regions may emit white light.

Charge generating layers CGL1 and CGL2 may be disposed between neighboring light emitting structures OL-B1, OL-B2 and OL-B3. The charge generating layers CGL1 and CGL2 may each independently include a p-type charge generating layer and/or an n-type charge generating layer.

Hereinafter, a compound according to an embodiment and an organic electroluminescence device of an embodiment will be explained with reference to the Examples and the Comparative Examples. The Examples are only illustrations for understanding the disclosure, and the scope thereof is not limited thereto.

EXAMPLES

1. Synthesis of Fused Polycyclic Compound

The synthesis method of the fused polycyclic compound according to an embodiment will be explained by describing to the synthesis methods of Compounds 1, 2, 3, 7, 8, and 10. The synthesis methods of the fused polycyclic compounds explained below are only examples, and the synthesis method of the fused polycyclic compound according to embodiments is not limited thereto.

(1) Synthesis of Compound 1

Fused Polycyclic Compound 1 according to an embodiment may be synthesized, for example, by the reaction below.

[Reaction 1]

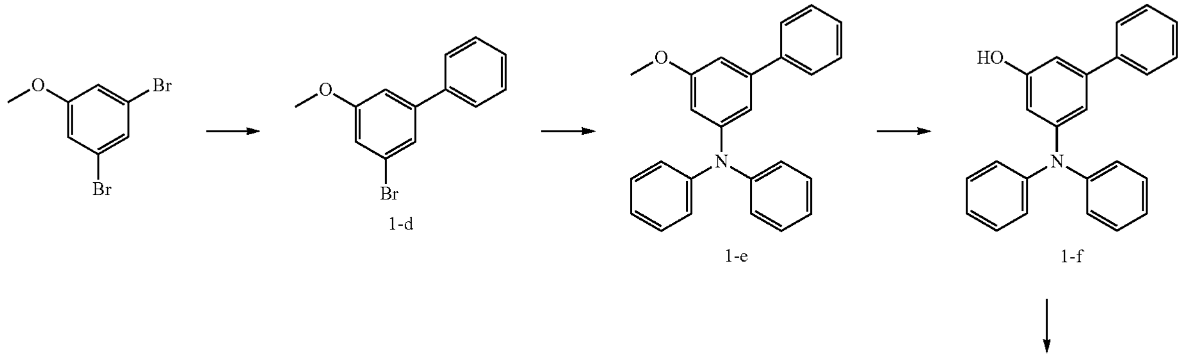
1-d 1-e 1-f

-continued

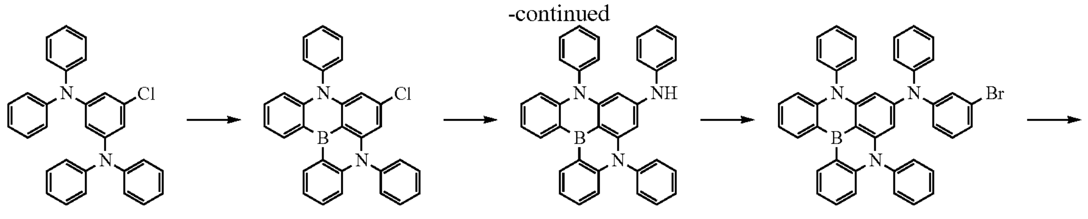

1-a 1-b 1-c

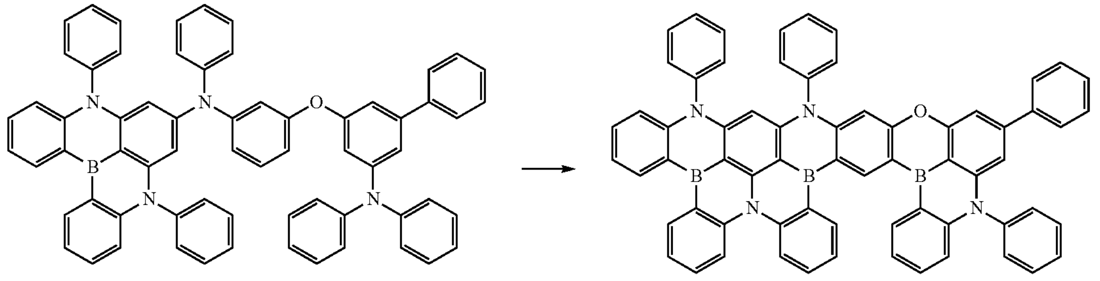

1-g 1

1) Synthesis of Intermediate 1-a

After dissolving 5-chloro-N1,N1,N3,N3-tetraphenylbenzene-1,3-diamine (1 eq) in o-dichlorobenzene, the temperature was reduced to about 0° C., and under a nitrogen atmosphere, $BI_3$ (2 eq) was slowly injected thereto. After finishing the dropwise addition, the temperature was raised to about 150° C., followed by stirring for about 24 hours. After cooling, triethylamine was slowly added dropwise to a flask containing the resultant product to terminate the reaction, and ethyl alcohol was added to the resultant product to precipitate. The precipitate was filtered, and the solid thus obtained was separated by column chromatography to obtain Compound 1-a (yield: 31%).

2) Synthesis of Intermediate 1-b

Intermediate 1-a (1 eq), aniline (1 eq), tris(dibenzylideneacetone) dipalladium(0)(0.1 eq), SPhos (0.1 eq), and sodium tert-butoxide (3 eq) were dissolved in toluene, followed by stirring at about 100° C. for about 12 hours. After cooling, the reaction product was washed with ethyl acetate and water three times, and an organic layer obtained by separating liquid layers was dried with $MgSO_4$ and dried under a reduced pressure. Intermediate 1-b was obtained by column chromatography (yield: 60%).

3) Synthesis of Intermediate 1-c

Intermediate 1-b (1 eq), 1-bromo-3-iodobenzene (1 eq), tris(dibenzylideneacetone) dipalladium (0) (0.1 eq), SPhos (0.1 eq), and sodium tert-butoxide (3 eq) were dissolved in toluene, followed by stirring at about 100° C. for about 12 hours. After cooling, the reaction product was washed with dichloromethane and water three times, and an organic layer obtained by separating liquid layers was dried with $MgSO_4$ and dried under a reduced pressure. Intermediate 1-c was obtained by column chromatography (yield: 57%).

4) Synthesis of Intermediate 1-d

Under a nitrogen atmosphere, a mixture solution of toluene/water (20%), in which 1,3-dibromo-5-methoxybenzene (1 eq), phenylboronic acid (2 eq), $K_2CO_3$ (5 eq), and $Pd(PPh_3)_4$ (0.1 eq) were dissolved, was heated and stirred at about 100° C. for about 12 hours. After finishing the reaction, a process of adding dichloromethane and extracting was repeated three times, and $MgSO_4$ was used to remove remaining $H_2O$. After filtering, the solvent was evaporated. Intermediate 1-d was obtained by column chromatography (yield: 65%).

5) Synthesis of Intermediate 1-e

Intermediate 1-d (1 eq), diphenylamine (1 eq), tris(dibenzylideneacetone) dipalladium (0)(0.1 eq), SPhos (0.1 eq), and sodium tert-butoxide (3 eq) were dissolved in toluene, followed by stirring at about 100° C. for about 12 hours. After cooling, the reaction product was washed with ethyl acetate and water 1 three times, and an organic layer obtained by separating liquid layers was dried with $MgSO_4$ and dried under a reduced pressure. Intermediate 1-e was obtained by column chromatography (yield: 70%).

6) Synthesis of Intermediate 1-f

Intermediate 1-e (1 eq) was dissolved in dichloromethane, and $BBr_3$ (4 eq) was slowly injected thereto at about 0° C. Stirring was performed at room temperature for about 12 hours. After finishing the reaction, the resultant product was washed with ethyl acetate and water three times, and an organic layer obtained by separating liquid layers was dried with $MgSO_4$ and dried under a reduced pressure. Intermediate 1-f was obtained by column chromatography (yield: 50%).

7) Synthesis of Intermediate 1-g

Intermediate 1-c (1 eq), Intermediate 1-f (1 eq), CuI (0.1 eq), 1,10-phenanthroline (0.1 eq), and $K_2CO_3$ (3 eq) were dissolved in dimethylformamide (DMF), followed by stirring at about 160° C. for about 12 hours. The reaction product was washed with ethyl acetate and water three times, and an organic layer obtained was dried with $MgSO_4$ and dried under a reduced pressure. Intermediate 1-g was obtained by column chromatography (yield: 52%).

8) Synthesis of Compound 1

After dissolving 1-g (1 eq) in o-dichlorobenzene, the temperature was reduced to about 0° C., and under a nitrogen atmosphere, $BI_3$ (5 eq) was slowly injected thereto. After finishing the dropwise addition, the temperature was raised to about 180° C., followed by stirring for about 24 hours. After cooling, triethylamine was slowly added dropwise to a flask containing the resultant product to terminate the reaction, and ethyl alcohol was added to the resultant product to precipitate. The precipitate was filtered, and the solid thus obtained was separated by column chromatography to obtain Compound 1 (yield: 31%).

(2) Synthesis of Compound 2

Fused Polycyclic Compound 2 according to an embodiment may be synthesized, for example, by the reaction below.

[Reaction 2]

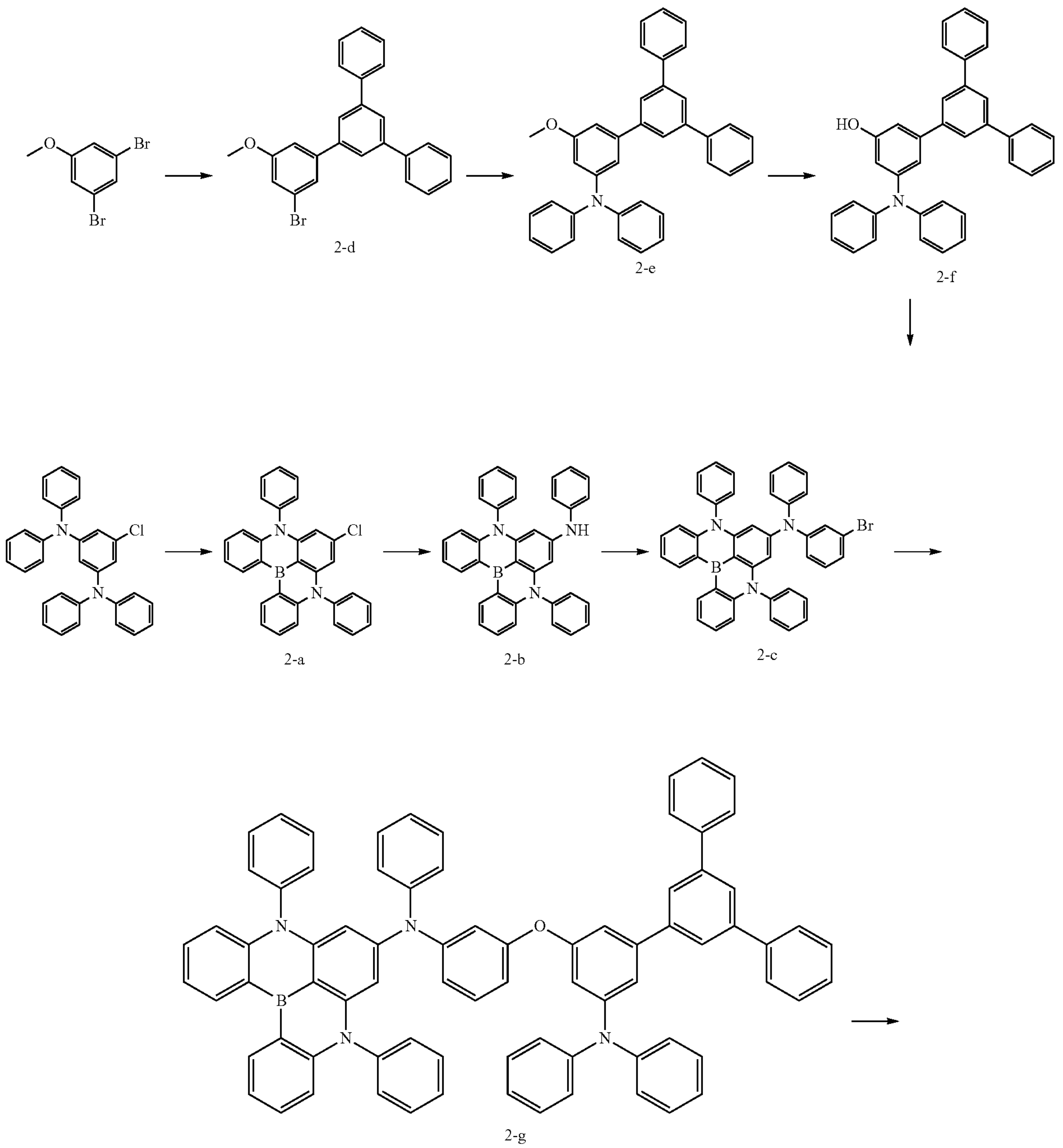

-continued

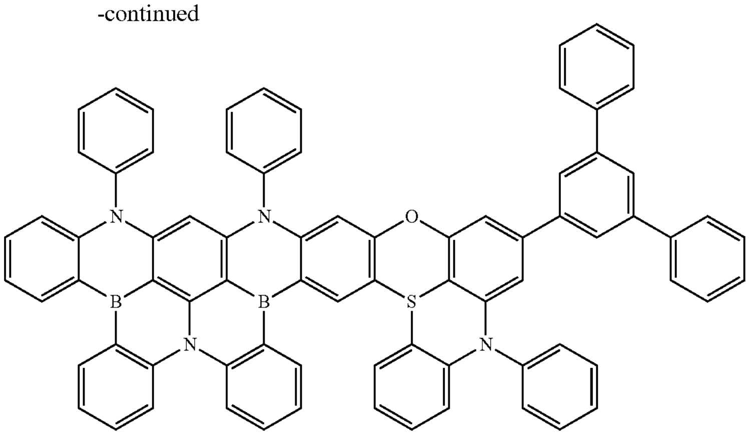

2

1) Synthesis of Intermediate 2-a

Intermediate 2-a was obtained by the same method as in the synthetic example of Intermediate 1-a.

2) Synthesis of Intermediate 2-b

Intermediate 2-b was obtained by the same method as in the synthetic example of Intermediate 1-b.

3) Synthesis of Intermediate 2-c

Intermediate 2-c was obtained by the same method as in the synthetic example of Intermediate 1-c.

4) Synthesis of Intermediate 2-d

Intermediate 2-d was obtained by the same method as in the synthetic example of Intermediate 1-d except for using [1,1':3',1"-terphenyl]-5'-ylboronic acid instead of a starting material, phenylboronic acid.

5) Synthesis of Intermediate 2-e

Intermediate 2-e was obtained by the same method as in the synthetic example of Intermediate 1-e except for using Intermediate 2-d instead of Intermediate 1-d.

6) Synthesis of Intermediate 2-f

Intermediate 2-f was obtained by the same method as in the synthetic example of Intermediate 1-f except for using Intermediate 2-e instead of Intermediate 1-e.

7) Synthesis of Intermediate 2-g

Intermediate 2-g was obtained by the same method as in the synthetic example of Intermediate 1-g except for using Intermediate 2-f instead of Intermediate 1-f.

8) Synthesis of Compound 2

Compound 2 was obtained by the same method as in the synthetic example of Compound 1 except for using Intermediate 2-g instead of Intermediate 1-g.

(3) Synthesis of Compound 3

Fused Polycyclic Compound 3 according to an embodiment may be synthesized, for example, by the reaction below.

[Reaction 3]

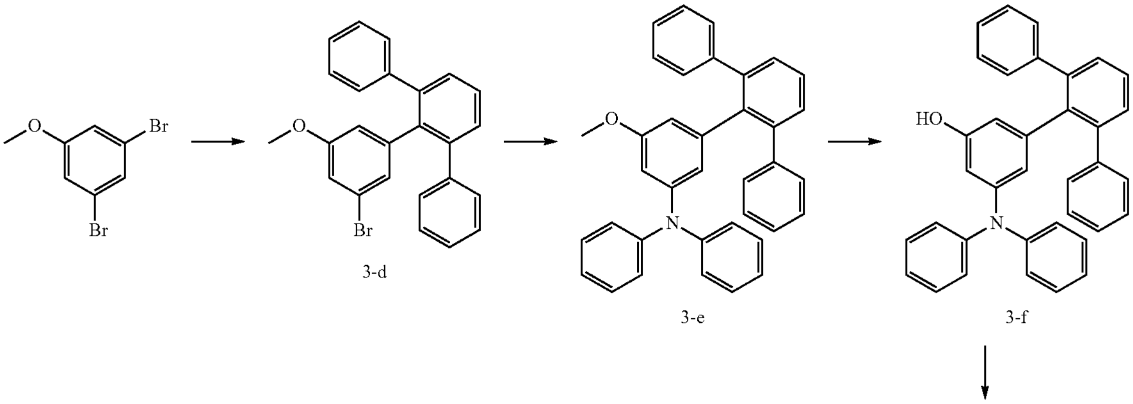

3-d 3-e 3-f

-continued

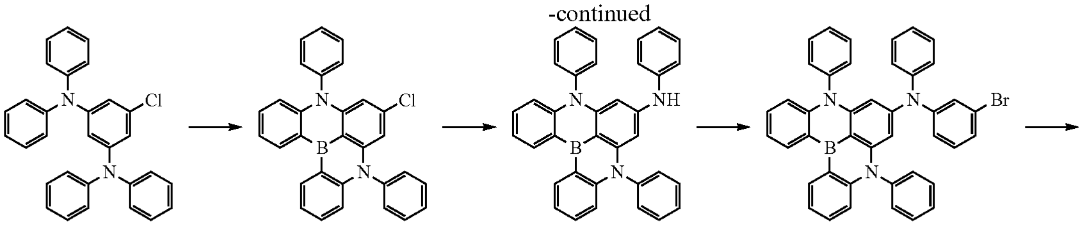

3-a 3-b 3-c

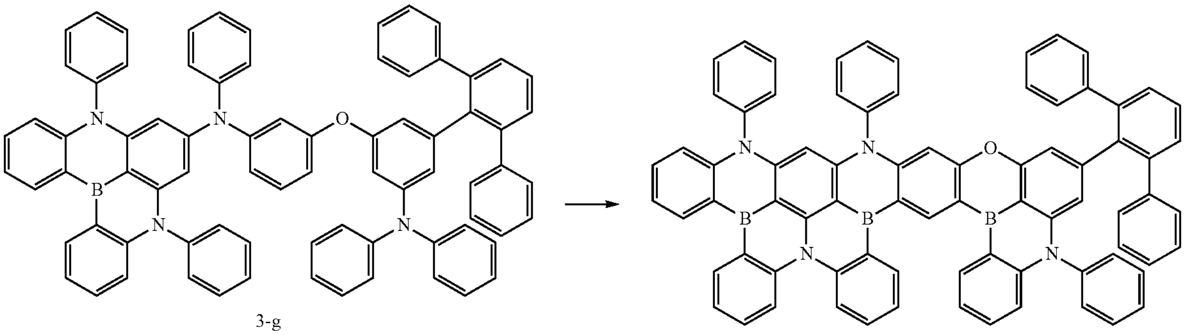

3-g 3

1) Synthesis of Intermediate 3-a

Intermediate 3-a was obtained by the same method as in the synthetic example of Intermediate 1-a.

2) Synthesis of Intermediate 3-b

Intermediate 3-b was obtained by the same method as in the synthetic example of Intermediate 1-b.

3) Synthesis of Intermediate 3-c

Intermediate 3-c was obtained by the same method as in the synthetic example of Intermediate 1-c.

4) Synthesis of Intermediate 3-d

Intermediate 3-d was obtained by the same method as in the synthetic example of Intermediate 1-d except for using [1,1':3',1"-terphenyl]-2'-ylboronic acid instead of a starting material, phenylboronic acid.

5) Synthesis of Intermediate 3-e

Intermediate 3-e was obtained by the same method as in the synthetic example of Intermediate 1-e except for using Intermediate 3-d instead of Intermediate 1-d.

6) Synthesis of Intermediate 3-f

Intermediate 3-f was obtained by the same method as in the synthetic example of Intermediate 1-f except for using Intermediate 3-e instead of Intermediate 1-e.

7) Synthesis of Intermediate 3-g

Intermediate 3-g was obtained by the same method as in the synthetic example of Intermediate 1-g except for using Intermediate 3-f instead of Intermediate 1-f.

8) Synthesis of Compound 3

Compound 3 was obtained by the same method as in the synthetic example of Compound 1 except for using Intermediate 3-g instead of Intermediate 1-g.

(4) Synthesis of Compound 7

Fused Polycyclic Compound 7 according to an embodiment may be synthesized, for example, by the reaction below.

[Reaction 4]
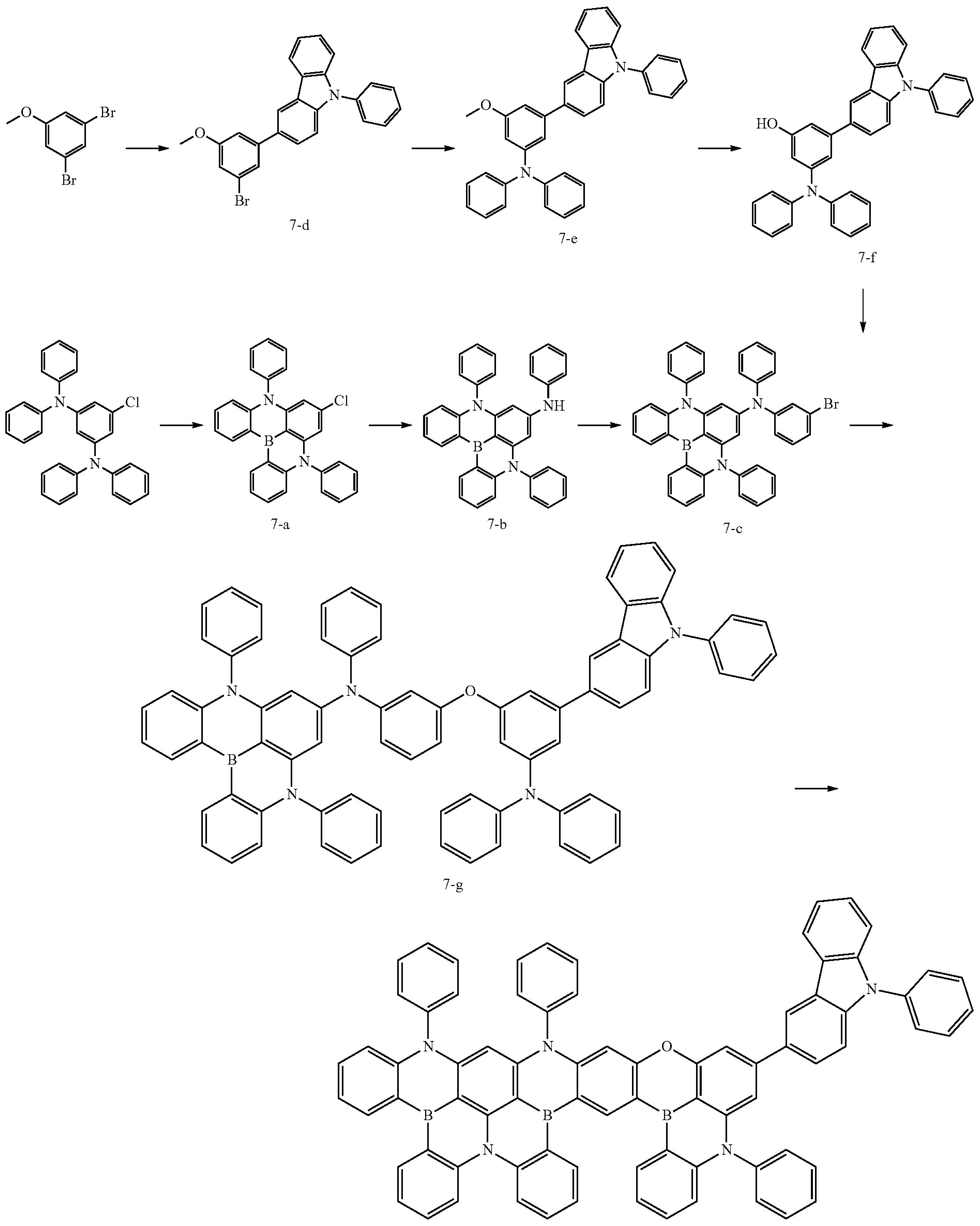
7-d 7-e 7-f
7-a 7-b 7-c
7-g
7
1) Synthesis of Intermediate 7-a
Intermediate 7-a was obtained by the same method as in the synthetic example of Intermediate 1-a.
2) Synthesis of Intermediate 7-b
Intermediate 7-b was obtained by the same method as in the synthetic example of Intermediate 1-b.

3) Synthesis of Intermediate 7-c

Intermediate 7-c was obtained by the same method as in the synthetic example of Intermediate 1-c.

4) Synthesis of Intermediate 7-d

Intermediate 7-d was obtained by the same method as in the synthetic example of Intermediate 1-d except for using (9-phenyl-9H-carbazol-3-yl) boronic acid instead of a starting material, phenylboronic acid.

5) Synthesis of Intermediate 7-e

Intermediate 7-e was obtained by the same method as in the synthetic example of Intermediate 1-e except for using Intermediate 7-d instead of Intermediate 1-d.

6) Synthesis of Intermediate 7-f

Intermediate 7-f was obtained by the same method as in the synthetic example of Intermediate 1-f except for using Intermediate 7-e instead of Intermediate 1-e.

7) Synthesis of Intermediate 7-g

Intermediate 7-g was obtained by the same method as in the synthetic example of Intermediate 1-g except for using Intermediate 7-f instead of Intermediate 1-f.

8) Synthesis of Compound 7

Compound 7 was obtained by the same method as in the synthetic example of Compound 1 except for using Intermediate 7-g instead of Intermediate 1-g.

(5) Synthesis of Compound 8

Fused Polycyclic Compound 8 according to an embodiment may be synthesized, for example, by the reaction below.

[Reaction 5]

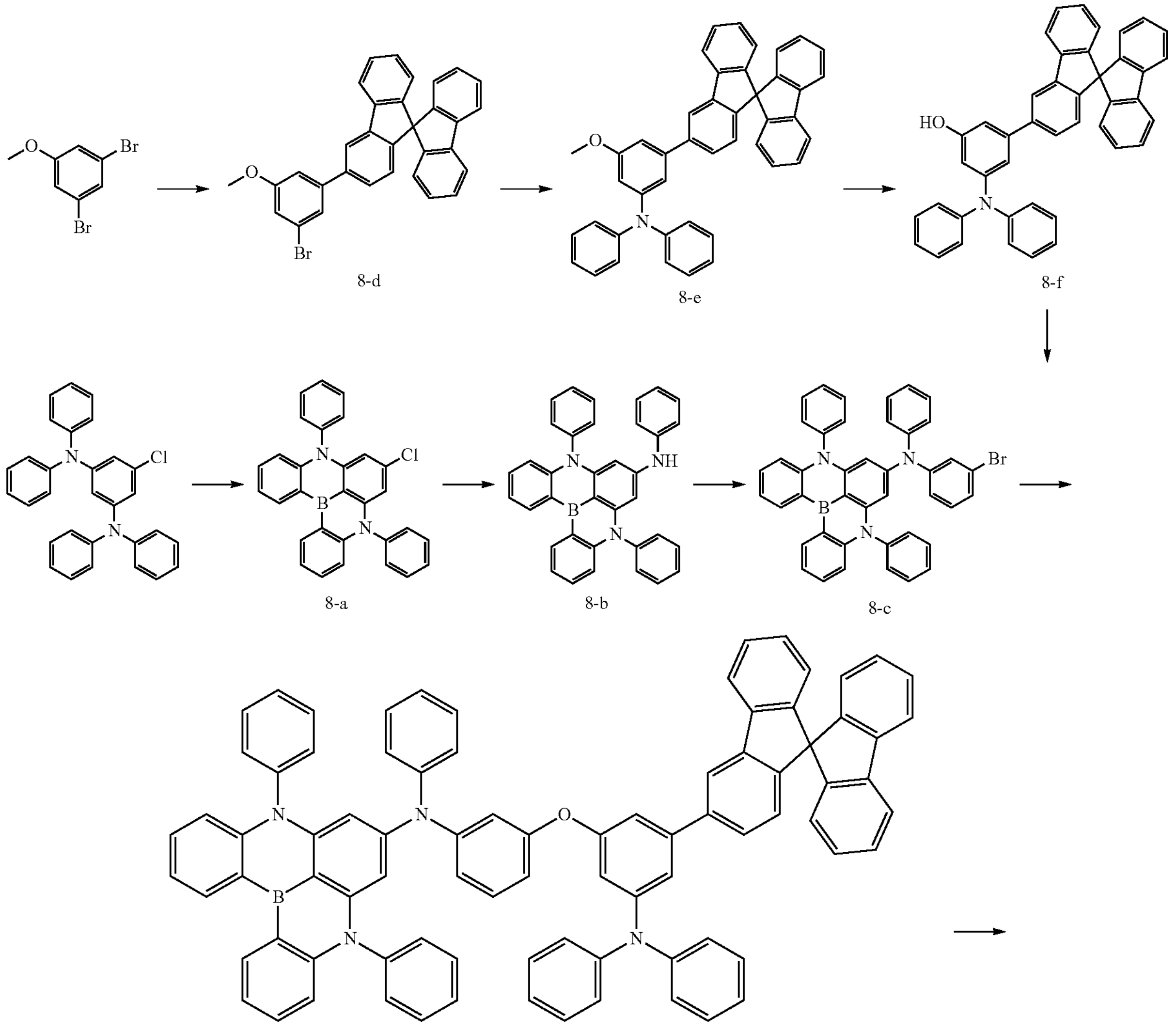

8-d 8-e 8-f 8-a 8-b 8-c 8-g

-continued

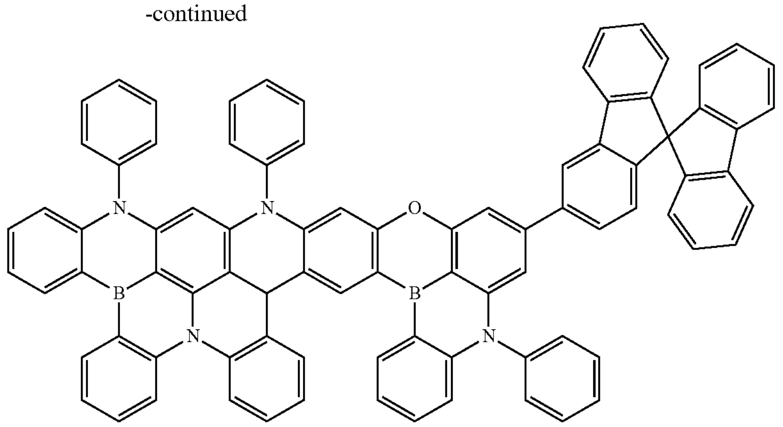

8

1) Synthesis of Intermediate 8-a

Intermediate 8-a was obtained by the same method as in the synthetic example of Intermediate 1-a.

2) Synthesis of Intermediate 8-b

Intermediate 8-b was obtained by the same method as in the synthetic example of Intermediate 1-b.

3) Synthesis of Intermediate 8-c

Intermediate 8-c was obtained by the same method as in the synthetic example of Intermediate 1-c.

4) Synthesis of Intermediate 8-d

Intermediate 8-d was obtained by the same method as in the synthetic example of Intermediate 1-d except for using 9,9'-spirobi[fluoren]-3-ylboronic acid instead of a starting material, phenylboronic acid.

5) Synthesis of Intermediate 8-e

Intermediate 8-e was obtained by the same method as in the synthetic example of Intermediate 1-e except for using Intermediate 8-d instead of Intermediate 1-d.

6) Synthesis of Intermediate 8-f

Intermediate 8-f was obtained by the same method as in the synthetic example of Intermediate 1-f except for using Intermediate 8-e instead of Intermediate 1-e.

7) Synthesis of Intermediate 8-g

Intermediate 8-g was obtained by the same method as in the synthetic example of Intermediate 1-g except for using Intermediate 8-f instead of Intermediate 1-f.

8) Synthesis of Compound 8

Compound 8 was obtained by the same method as in the synthetic example of Compound 1 except for using Intermediate 8-g instead of Intermediate 1-g.

(6) Synthesis of Compound 10

Fused Polycyclic Compound 10 according to an embodiment may be synthesized, for example, by the reaction below.

[Reaction 6]

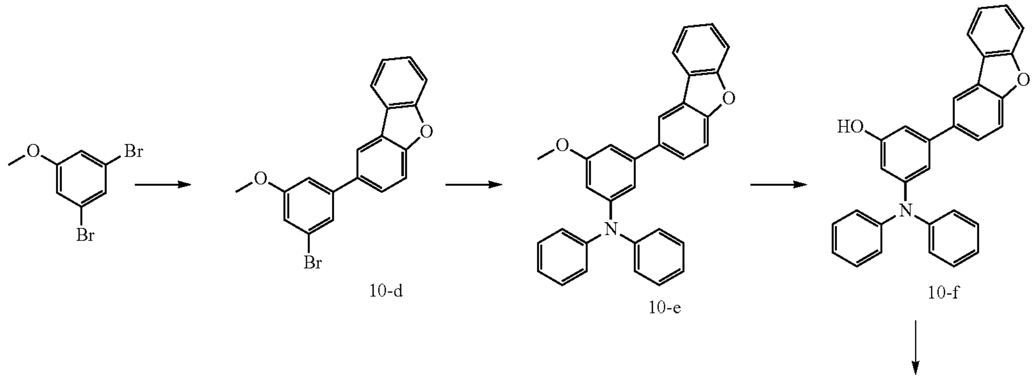

10-d 10-e 10-f

-continued

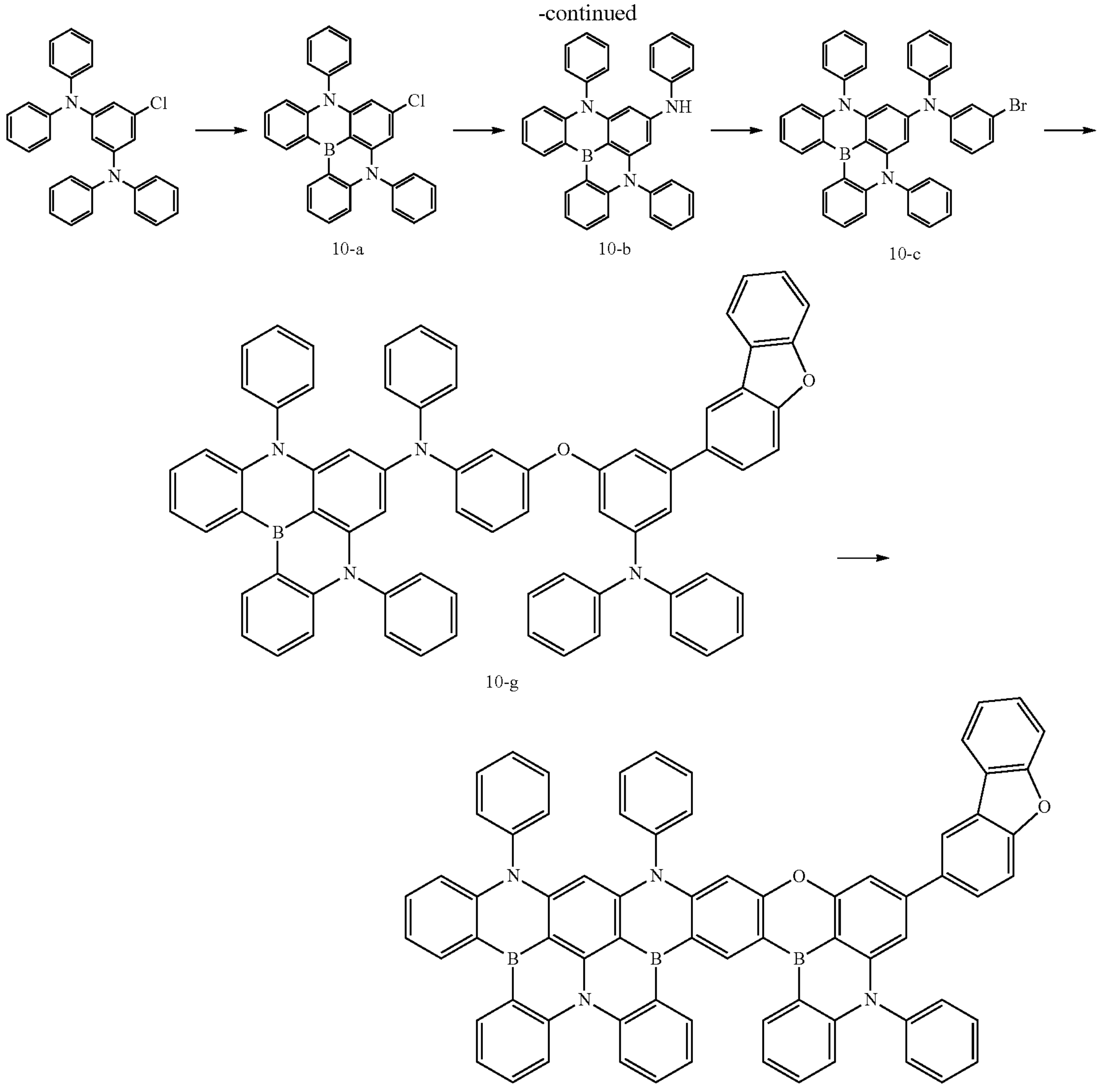

10-a 10-b 10-c 10-g

10

1) Synthesis of Intermediate 10-a

Intermediate 10-a was obtained by the same method as in the synthetic example of Intermediate 1-a.

2) Synthesis of Intermediate 10-b

Intermediate 10-b was obtained by the same method as in the synthetic example of Intermediate 1-b.

3) Synthesis of Intermediate 10-c

Intermediate 10-c was obtained by the same method as in the synthetic example of Intermediate 1-c.

4) Synthesis of Intermediate 10-d

Intermediate 10-d was obtained by the same method as in the synthetic example of Intermediate 1-d except for using dibenzo[b,d]furan-2-ylboronic acid instead of a starting material, phenylboronic acid.

5) Synthesis of Intermediate 10-e

Intermediate 10-e was obtained by the same method as in the synthetic example of Intermediate 1-e except for using Intermediate 10-d instead of Intermediate 1-d.

6) Synthesis of Intermediate 10-f

Intermediate 10-f was obtained by the same method as in the synthetic example of Intermediate 1-f except for using Intermediate 10-e instead of Intermediate 1-e.

7) Synthesis of Intermediate 10-g

Intermediate 10-g was obtained by the same method as in the synthetic example of Intermediate 1-g except for using Intermediate 10-f instead of Intermediate 1-f.

8) Synthesis of Compound 10

Compound 10 was obtained by the same method as in the synthetic example of Compound 1 except for using Intermediate 10-g instead of Intermediate 1-g.

2. Manufacture and Evaluation of Organic Electroluminescence Device Including Fused Polycyclic Compound
Organic electroluminescence devices of embodiments including the Example Compounds and Comparative Compounds below as materials in an emission layer were manufactured by a method below.
[Example Compounds]
1
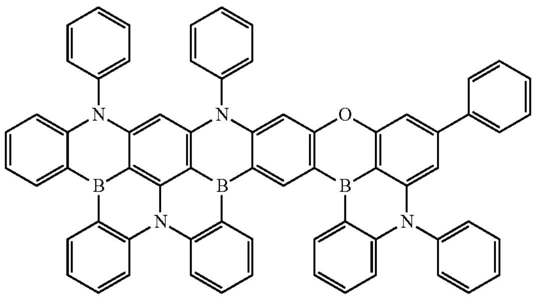
2
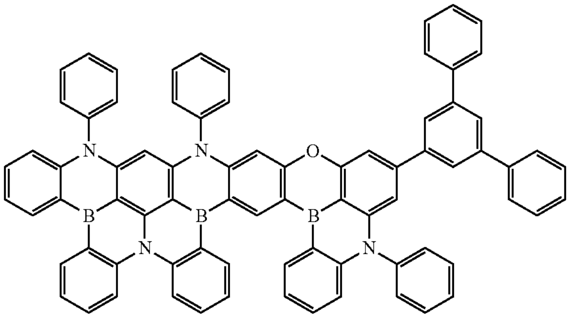
3
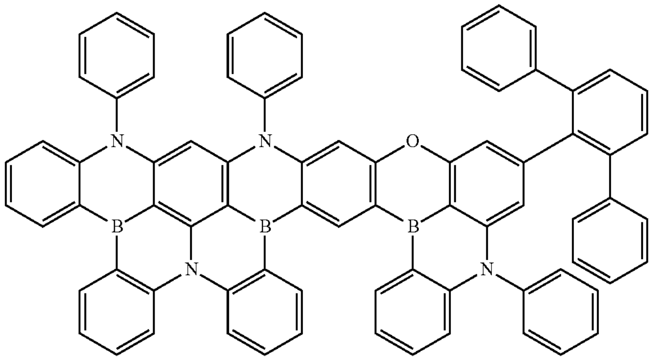
7
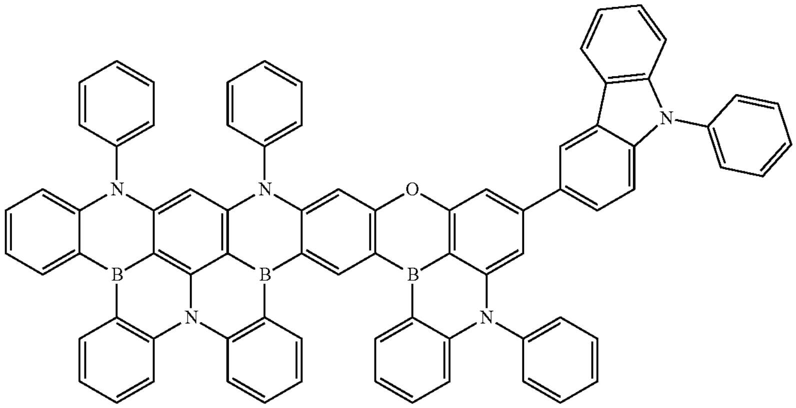

-continued
8
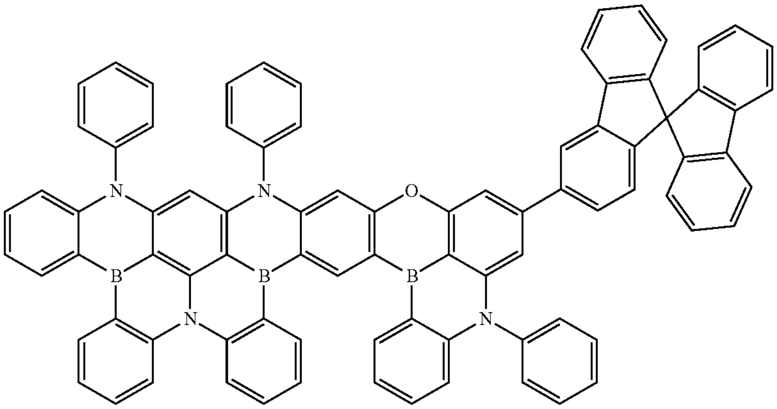
10
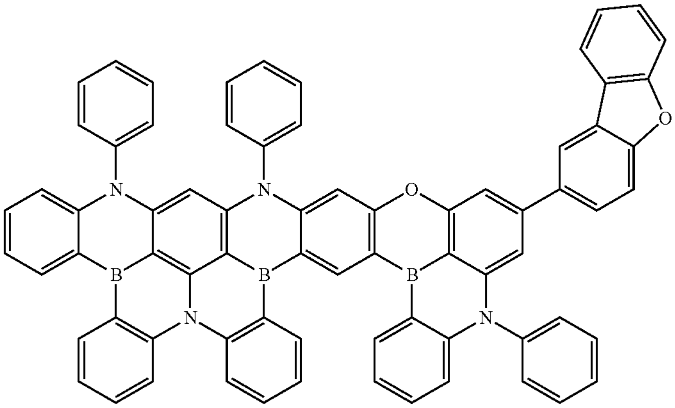
[Comparative Compounds]
C-1
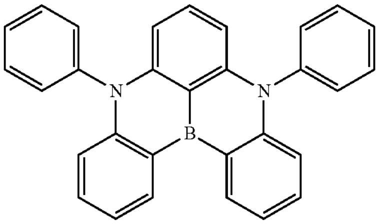
C-2
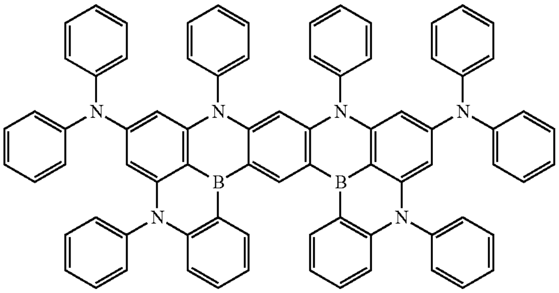
C-3
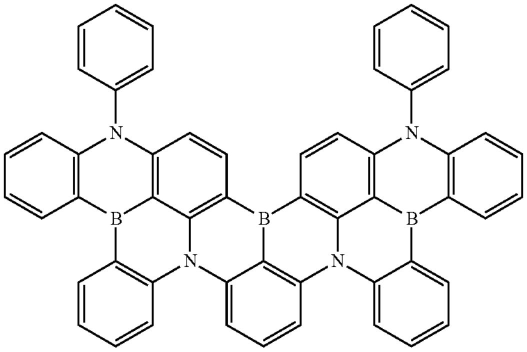

(1) Measurement of Bond Dissociation Energy (BDE)

With respect to the Example Compounds and Comparative Compound C-2, the bond dissociation energy (BDE) was calculated and shown in Table 1 below.

TABLE 1

| Compound | BDE (eV) |
|---|---|
| Comparative Compound C-2 | 2.165 |
| Compound 1 | 4.017 |
| Compound 2 | 4.041 |
| Compound 3 | 3.537 |
| Compound 7 | 4.012 |
| Compound 8 | 4.055 |
| Compound 10 | 4.053 |

(2) Manufacture and Evaluation of Properties of Organic Electroluminescence Device 1

In order to form a first electrode, ITO was patterned into a thickness of about 1,200 Å on a glass substrate to form a first electrode, washed with ultrasonic waves using isopropyl alcohol and pure water for about five minutes for each, exposed to ultraviolet rays for about 30 minutes and cleansed by exposing to ozone. On the glass substrate on which the ITO was formed, NPD was vacuum deposited as a hole injection layer to a thickness of about 300 Å, and the compound according to Table 2 was vacuum deposited to a thickness of about 200 Å to form a hole transport layer. On the hole transport layer, CzSi was vacuum deposited to a thickness of about 100 Å to form an electron blocking layer.

On the layer, mCP and the compound according to Table 2 were deposited simultaneously in a weight ratio of 99:1 to form an emission layer having a thickness of about 200 Å. TSPO1 was formed to a thickness of about 200 Å, and an electron injection layer compound of TPBi was deposited to a thickness of about 300 Å. An alkali metal halide of LiF was deposited on the electron transport layer to a thickness of about 10 Å, and Al was vacuum deposited to a thickness of about 3,000 Å to form a second electrode. In Table 2, the results on the evaluation of the properties of the organic electroluminescence devices 1 are shown.

(3) Manufacture and Evaluation of Properties of Organic Electroluminescence Device 2

In order to form a first electrode, ITO was patterned into a thickness of about 1,200 Å on a glass substrate to form a first electrode, washed with ultrasonic waves using isopropyl alcohol and pure water for about five minutes for each, exposed to ultraviolet rays for about 30 minutes and cleansed by exposing to ozone. On the glass substrate on which the ITO was formed, NPD was vacuum deposited as a hole injection layer to a thickness of about 300 Å, and NPD was vacuum deposited to a thickness of about 200 Å to form a hole transport layer. On the hole transport layer, CzSi was vacuum deposited to a thickness of about 100 Å to form an electron blocking layer.

On the layer, mCP and the compound according to Table 3 were deposited simultaneously in a weight ratio of 99:1 to form an emission layer having a thickness of about 200 Å. TSPO1 was formed to a thickness of about 200 Å, and an electron injection layer compound of TPBi was deposited to a thickness of about 300 Å. An alkali metal halide of LiF was deposited on the electron transport layer to a thickness of about 10 Å, and Al was vacuum deposited to a thickness of about 3,000 Å to form a second electrode of LiF/Al. In Table 3, the results on the evaluation of the properties of the organic electroluminescence devices 2 are shown.

(4) The compounds used for the manufacture of the organic electroluminescence devices are shown below. In the evaluation results on the properties of the Examples and Comparative Examples shown in Table 2 and Table 3, a driving voltage at a current density of about 10 mA/cm$^2$, emission efficiency, and maximum external quantum efficiency (EQE) were measured. The driving voltage of a luminescence device was measured using a source meter (Keithley Instrument Co., 2400 series), and the maximum external quantum efficiency was measured using an external quantum efficiency measurement apparatus, C9920-2-12 of Hamamatsu Photonics Co. For the evaluation of the maximum external quantum efficiency, luminance/current density was measured using a brightness photometer of which wavelength sensitivity was calibrated, and the maximum external quantum efficiency was converted by assuming angular luminance distribution (Lambertian) introducing a perfect diffusion reflecting surface.

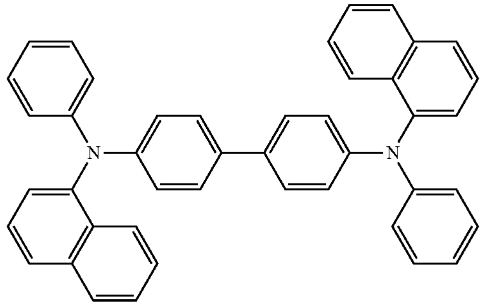

NPD

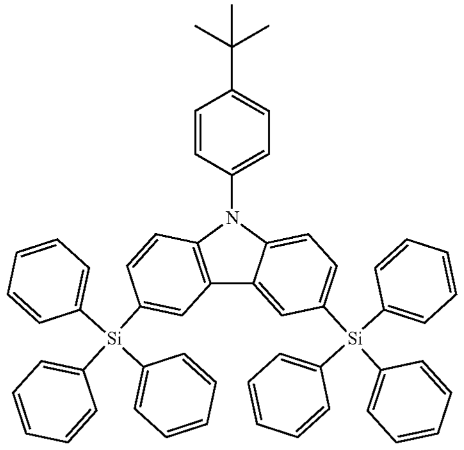

CzSi

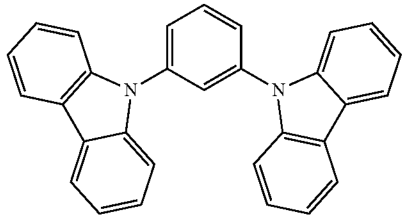

mCP

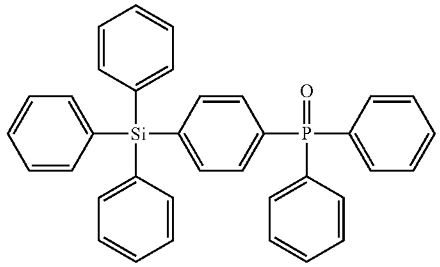

TSPO1

-continued

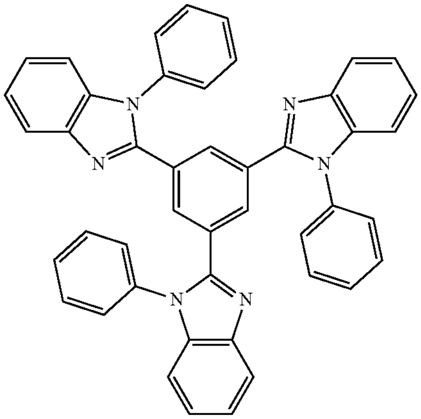

TPBi

-continued

H-1-1

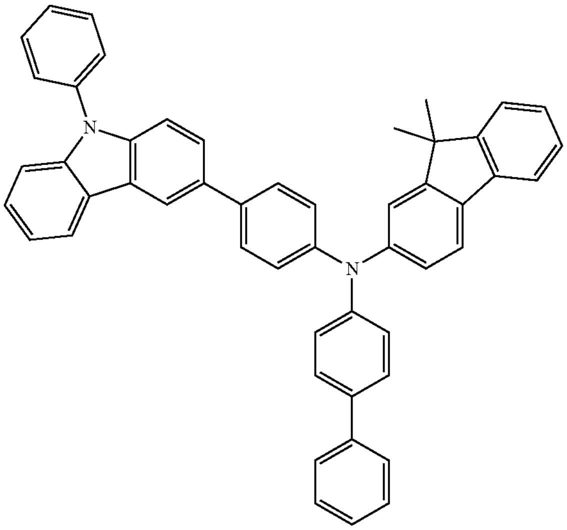

TABLE 2

| | Hole transport layer material | Dopant in emission layer | Driving voltage (V) | Emission efficiency (Cd/A) | Maximum external quantum efficiency (%) | Emission color |
|---|---|---|---|---|---|---|
| Example 1 | H-1-1 | Compound 1 | 4.6 | 24.6 | 23.8 | Blue |
| Example 2 | H-1-1 | Compound 2 | 4.5 | 25.8 | 25.4 | Blue |
| Example 3 | H-1-1 | Compound 3 | 4.6 | 24.8 | 23.9 | Blue |
| Example 4 | H-1-1 | Compound 7 | 4.5 | 24.8 | 23.4 | Blue |
| Example 5 | H-1-1 | Compound 8 | 4.7 | 23.5 | 22.7 | Blue |
| Example 6 | H-1-1 | Compound 10 | 4.6 | 22.9 | 21.8 | Blue |
| Example 7 | H-1-20 | Compound 1 | 4.7 | 24.3 | 22.3 | Blue |
| Example 8 | H-1-20 | Compound 2 | 4.6 | 25.4 | 24.1 | Blue |
| Example 9 | H-1-20 | Compound 3 | 4.5 | 24.6 | 23.5 | Blue |
| Example 10 | H-1-20 | Compound 7 | 4.6 | 24.6 | 22.3 | Blue |
| Example 11 | H-1-20 | Compound 8 | 4.7 | 23.4 | 23.6 | Blue |
| Example 12 | H-1-20 | Compound 10 | 4.7 | 22.9 | 22.4 | Blue |
| Comparative Example 1 | H-1-1 | Compound C-1 | 5.6 | 16.0 | 15.7 | Blue |
| Comparative Example 2 | H-1-1 | Compound C-2 | 5.0 | 19.9 | 17.9 | Blue |
| Comparative Example 3 | H-1-20 | Compound C-1 | 5.8 | 15.2 | 14.9 | Blue |
| Comparative Example 4 | H-1-20 | Compound C-2 | 4.9 | 20.1 | 18.7 | Blue |
| Comparative Example 5 | H-1-20 | Compound C-3 | 4.9 | 21 | 19.9 | Blue |
| Comparative Example 6 | H-1-1 | Compound C-3 | 5.3 | 20 | 19 | Blue |

TABLE 3

| | Hole transport layer material | Dopant in emission layer | Driving voltage (V) | Emission efficiency (Cd/A) | Maximum external quantum efficiency (%) | Emission color |
|---|---|---|---|---|---|---|
| Comparative Example 7 | NPD | Compound 1 | 5.2 | 20.0 | 19.3 | Blue |
| Comparative Example 8 | NPD | Compound 2 | 5.2 | 19.3 | 18.7 | Blue |
| Comparative Example 9 | NPD | Compound 3 | 5.2 | 19.6 | 19.2 | Blue |
| Comparative Example 10 | NPD | Compound 7 | 5.1 | 19.2 | 18.9 | Blue |

TABLE 3-continued

| | Hole transport layer material | Dopant in emission layer | Driving voltage (V) | Emission efficiency (Cd/A) | Maximum external quantum efficiency (%) | Emission color |
|---|---|---|---|---|---|---|
| Comparative Example 11 | NPD | Compound 8 | 5.2 | 18.9 | 18.5 | Blue |
| Comparative Example 12 | NPD | Compound 10 | 5.1 | 19.1 | 18.6 | Blue |

Referring to the results of Table 1 to Table 3, it could be found that the Examples of the organic electroluminescence devices using the fused polycyclic compounds according to embodiments as the materials for an emission layer showed lower driving voltage values and relatively higher emission efficiency when compared to the Comparative Examples.

The Example Compounds could show TADF properties by using multiple resonance phenomenon by aromatic rings forming a fused ring, include three boron atoms and one oxygen atom, and show multiple resonance in a broad plate type skeleton. Accordingly, the organic electroluminescence devices of the Examples could show improved emission efficiency when compared to the organic electroluminescence devices of the Comparative Examples. In comparison to the bond dissociation energy (BDE) of Comparative Compound C-2, in which $R_1$ is an amine group, it could be confirmed that the fused polycyclic compound according to an embodiment limits the substituent of a benzene ring adjacent to an oxygen atom and excludes a carbon-nitrogen bond to improve the bond dissociation energy (BDE). The fused polycyclic compound according to an embodiment introduces an aryl substituent which has high steric hindrance at an oxygen atom side, and thus, protects the p orbital of a boron atom in a molecule and extends distance among molecules to reduce intermolecular interaction. Accordingly, the organic electroluminescence devices of embodiments may achieve a low driving voltage and high efficiency.

When comparing the results of the Comparative Examples of Table 3 and the results of the Examples of Table 2, it could be found that the organic electroluminescence devices according to embodiments include the fused polycyclic compound of an embodiment in an emission layer and include an amine compound of an embodiment as a hole transport material, at the same time, thereby showing lower driving voltage values and relatively higher emission efficiency.

The organic electroluminescence device of an embodiment includes the fused polycyclic compound of an embodiment and may show improved emission efficiency. The organic electroluminescence device of an embodiment includes the fused polycyclic compound of an embodiment as a material for an emission layer, and may achieve high emission efficiency in a blue light wavelength region.

The organic electroluminescence device according to an embodiment shows excellent efficiency.

The fused polycyclic compound according to an embodiment may be used as a material for an emission layer of an organic electroluminescence device, and by using the same, the efficiency of the organic electroluminescence device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An organic electroluminescence device, comprising:

a first electrode;

a second electrode facing the first electrode; and a plurality of organic layers disposed between the first electrode and the second electrode, wherein the plurality of organic layers comprises:

at least one organic layer that comprises a fused polycyclic compound represented by Formula 1, and at least one organic layer that comprises an amine compound represented by Formula H-1:

[Formula 1]

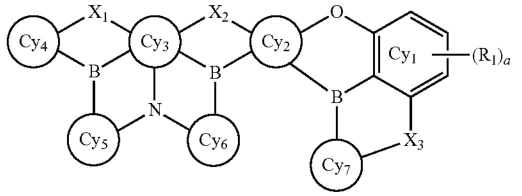

wherein in Formula 1, $Cy_2$ to $Cy_7$ are each independently a substituted or unsubstituted aromatic hydrocarbon ring, or a substituted or unsubstituted aromatic heterocycle, $X_1$ to $X_3$ are each independently $N(Ar_1)$, O, S, or Se, $Ar_1$ is a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_1$ is a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a is an integer 1 to 3, and an atom in $R_1$ that is bonded to $Cy_1$ is not nitrogen:

[Formula H-1]

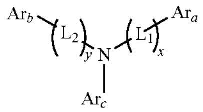

wherein in Formula H-1, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, x and y are each independently an integer from 0 to 10, $Ar_a$ and $Ar_b$ are each independently a substituted or unsubstituted aryl group of 6 to 30 ring-forming carbon atoms, or a substituted or unsubstituted heteroaryl group of 2 to 30 ring-forming carbon atoms, and $Ar_c$ is a substituted or unsubstituted aryl group of 6 to 30 ring-forming carbon atoms.

2. The organic electroluminescence device of claim 1, wherein the plurality of organic layers comprises:

a hole transport region disposed on the first electrode;

an emission layer disposed on the hole transport region; and an electron transport region disposed on the emission layer, and the emission layer comprises the fused polycyclic compound represented by Formula 1.

3. The organic electroluminescence device of claim 2, wherein the emission layer emits delayed fluorescence.

4. The organic electroluminescence device of claim 2, wherein the emission layer is a delayed fluorescence emission layer comprising a first compound and a second compound, and the first compound comprises the fused polycyclic compound represented by Formula 1.

5. The organic electroluminescence device of claim 2, wherein the electron transport region comprises:

a hole transport layer disposed on the first electrode; and an electron blocking layer disposed on the hole transport layer, and the hole transport layer comprises the amine compound represented by Formula H-1.

6. The organic electroluminescence device of claim 1, wherein the fused polycyclic compound represented by Formula 1 is represented by Formula 2:

[Formula 2]

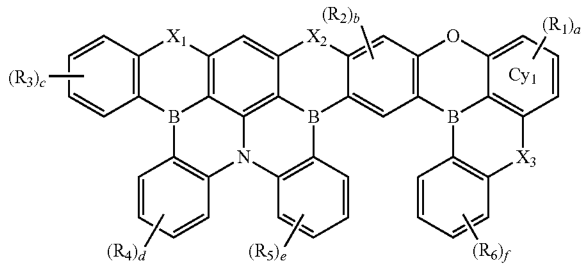

wherein in Formula 2, $R_2$ to $R_6$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, b is an integer from 0 to 2, c to f are each independently an integer from 0 to 4, and $X_1$ to $X_3$, $R_1$, and a are the same as defined in Formula 1.

7. The organic electroluminescence device of claim 6, wherein the fused polycyclic compound represented by Formula 2 is represented by Formula 3:

[Formula 3]

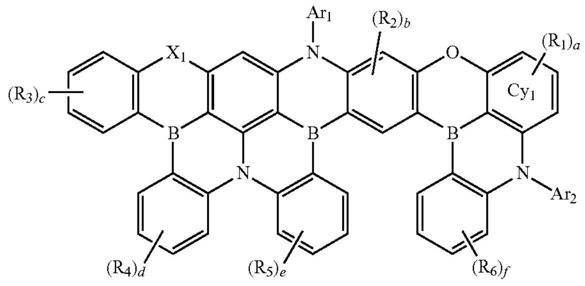

wherein in Formula 3, $Ar_1$ and $Ar_2$ are each independently a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $R_1$ to $R_6$, and a to f are the same as defined in Formula 1 and Formula 2.

8. The organic electroluminescence device of claim 6, wherein the fused polycyclic compound represented by Formula 2 is represented by Formula 4:

[Formula 4]

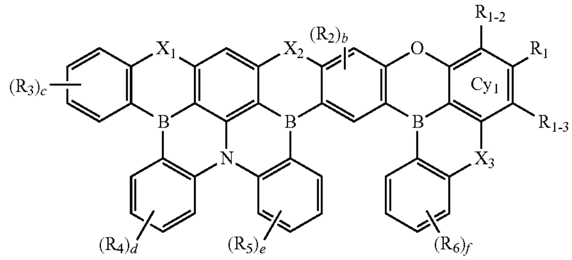

wherein in Formula 4, $R_1$ is a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_{1-2}$ and $R_{1-3}$ are each independently a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, an atom in $R_1$ that is bonded to $Cy_1$ is not nitrogen, an atom in $R_{1-2}$ that is bonded to $Cy_1$ is not nitrogen, an atom in $R_{1-3}$ that is bonded to $Cy_1$ is not nitrogen, and $X_1$ to $X_3$, $R_2$ to $R_6$, and b to f are the same as defined in Formula 1 and Formula 2.

9. The organic electroluminescence device of claim 8, wherein $R_1$ is a substituted or unsubstituted aryl group of 6 to 60 ring-forming carbon atoms, or a substituted or unsubstituted heteroaryl group of 2 to 60 ring-forming carbon atoms.

10. The organic electroluminescence device of claim 9, wherein $R_1$ is a group represented by one of Formula 6-1 to Formula 6-3:

6-1

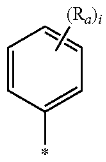

6-2

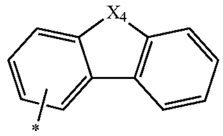

6-3

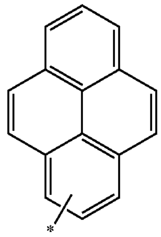

wherein in Formula 6-1 to Formula 6-3, $R_a$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, i is an integer from 0 to 5, $X_4$ is $N(R_{10})$, O, S or $C(R_{11})(R_{12})$, $R_{10}$ to $R_{12}$ are each independently a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and

* represents a binding site to a neighboring atom.

11. The organic electroluminescence device of claim 1, wherein in Formula 1, if $X_1$ to $X_3$ are each independently $N(Ar_1)$, then $Ar_1$ is a substituted or unsubstituted aryl group of 6 to 60 ring-forming carbon atoms.

12. The organic electroluminescence device of claim 7, wherein the fused polycyclic compound represented by Formula 3 is represented by Formula 5:

[Formula 5]

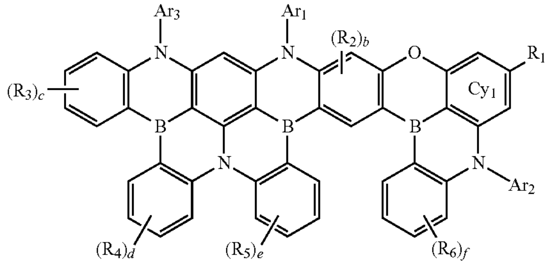

wherein in Formula 5, $Ar_3$ is a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $Ar_1$, $Ar_2$, $X_1$, $R_1$ to $R_6$, and b to f are the same as defined in Formula 1, Formula 2, and Formula 3.

13. The organic electroluminescence device of claim 1, wherein the fused polycyclic compound represented by Formula 1 comprises at least one selected from Compound Group 1:

[Compound Group 1]

1

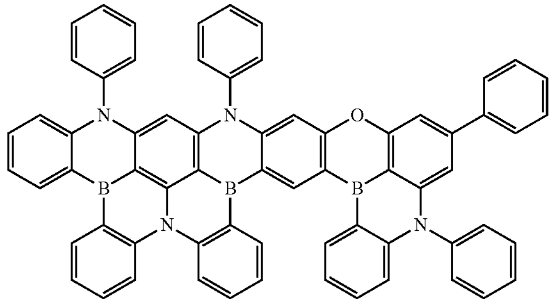

2

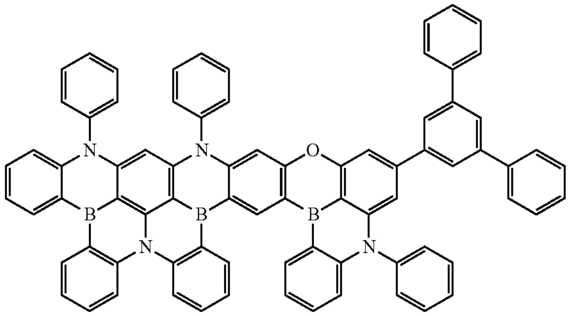

-continued
3
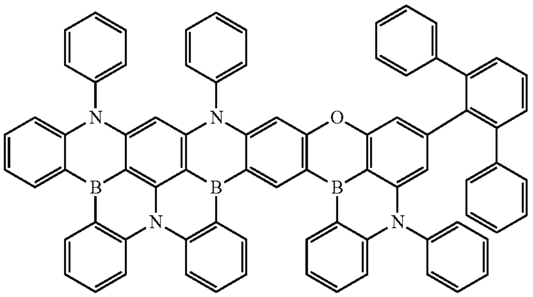
4
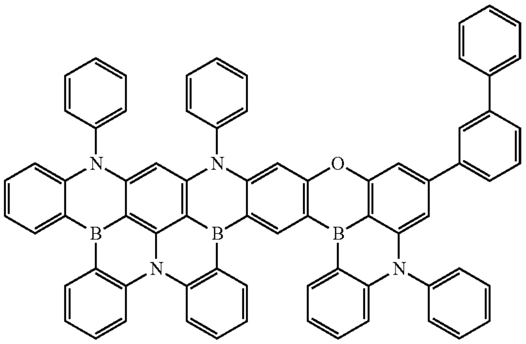
5
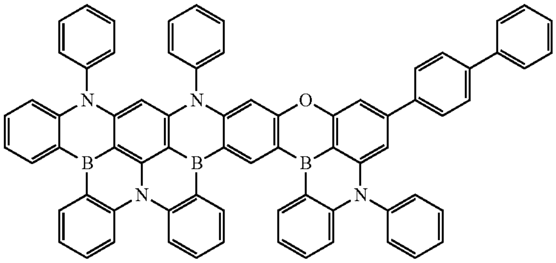
6
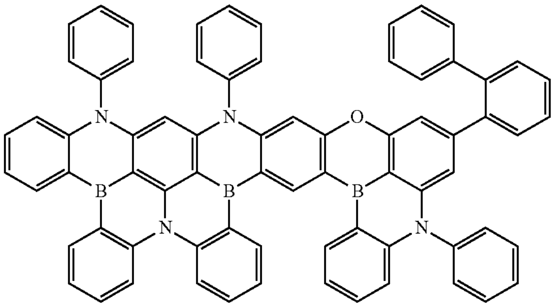
7
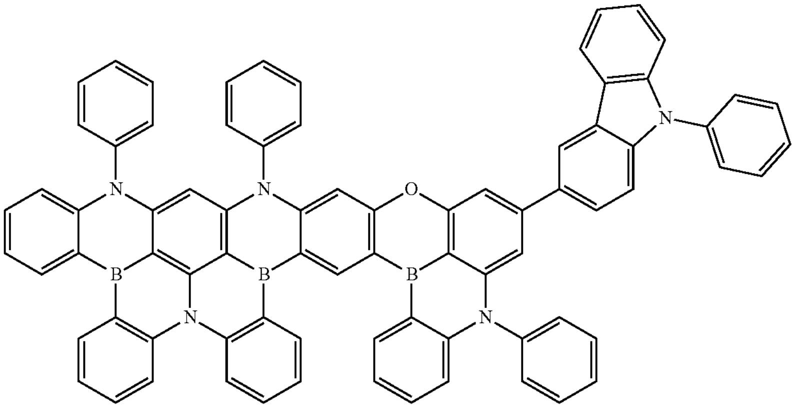
8
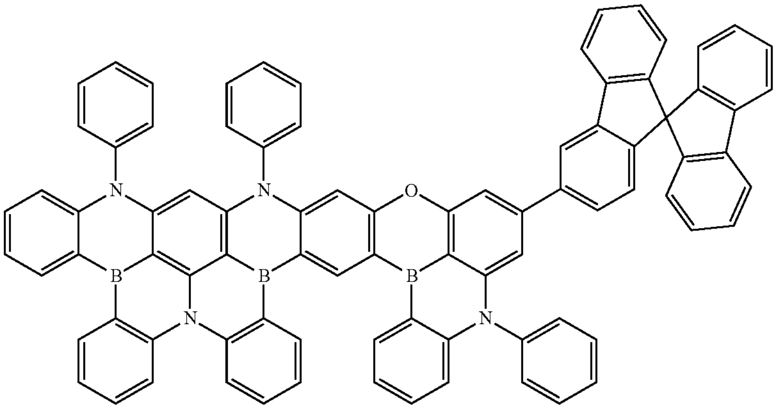

-continued
9
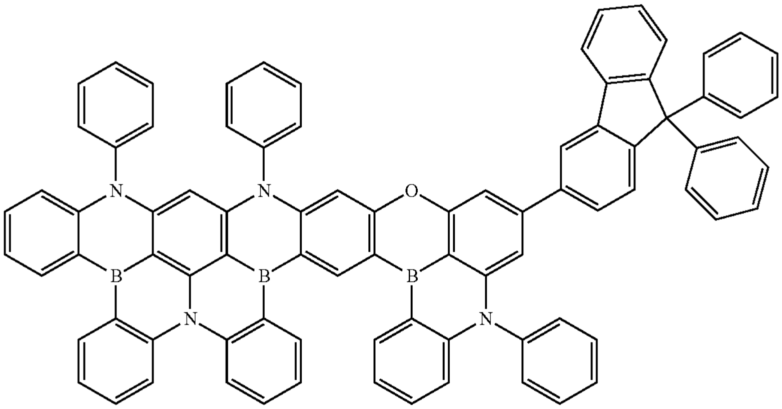
10
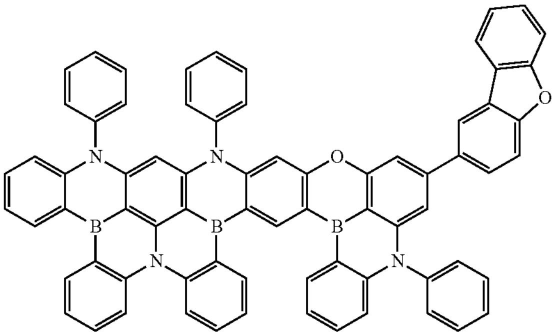
11
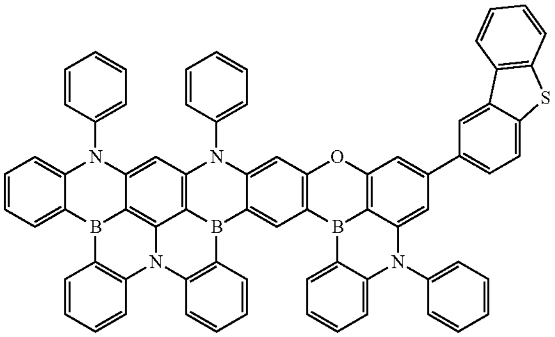
12
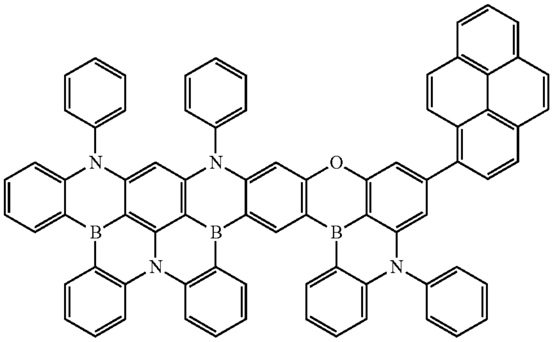
13
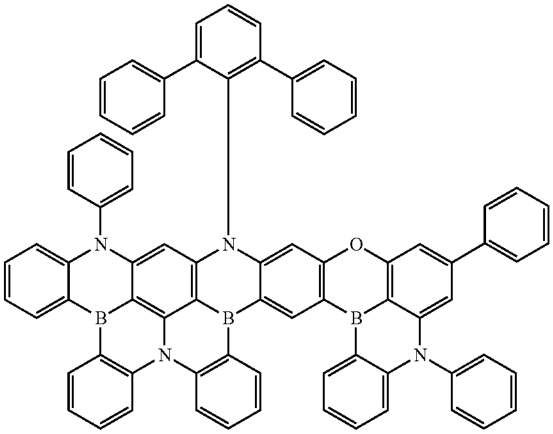

-continued
14
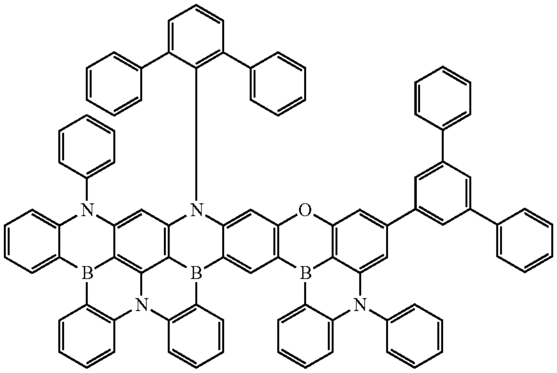
15
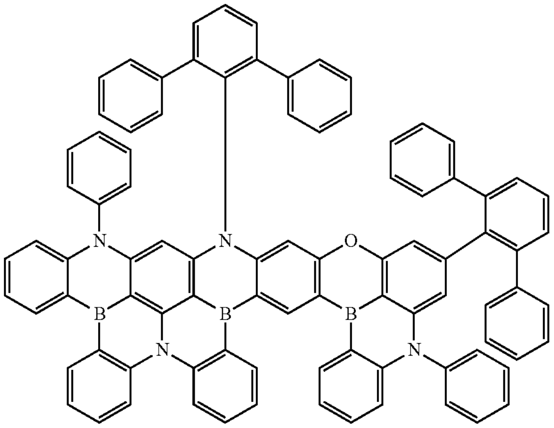
16
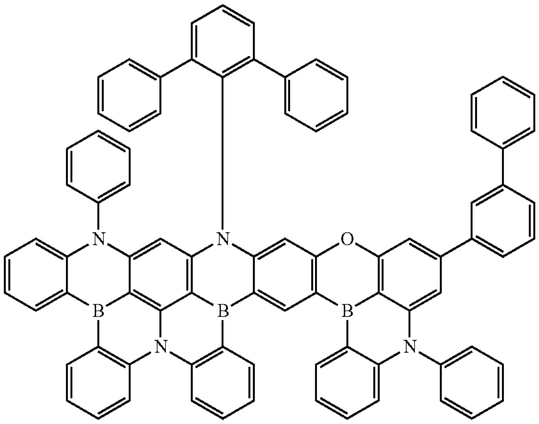
17
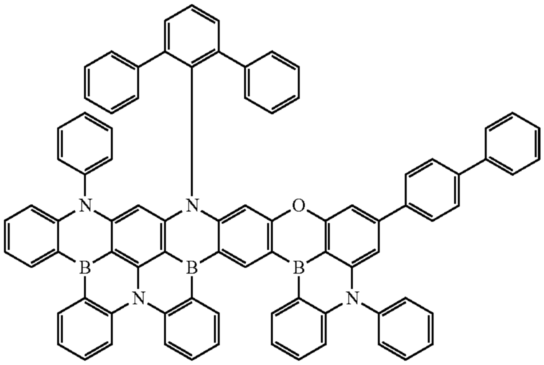
18
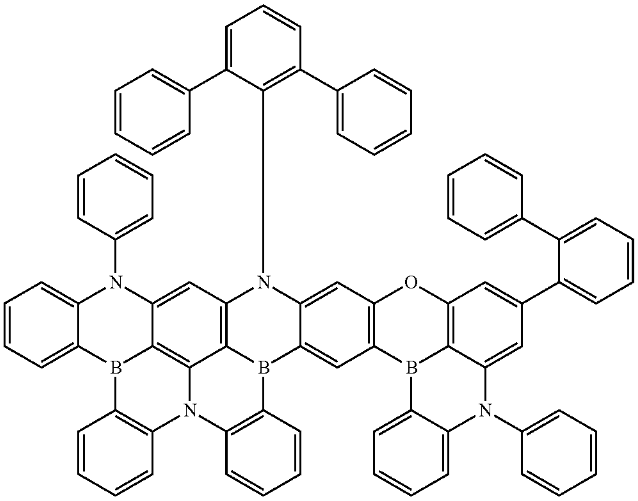

-continued
19
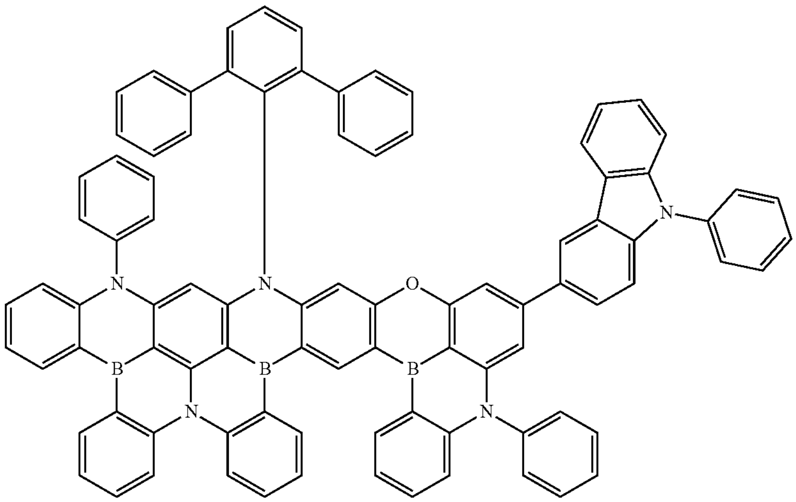
20
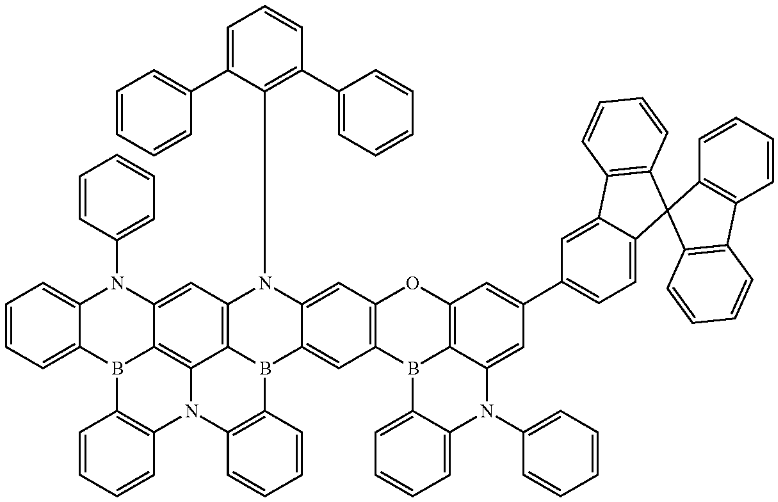
21
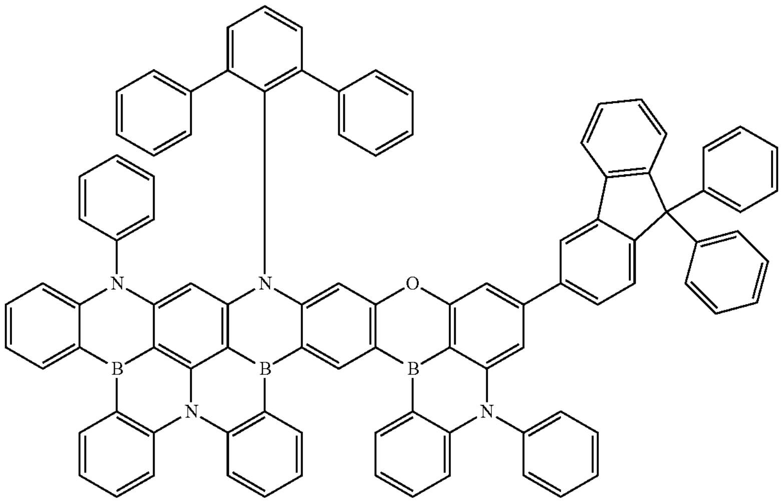

-continued
22
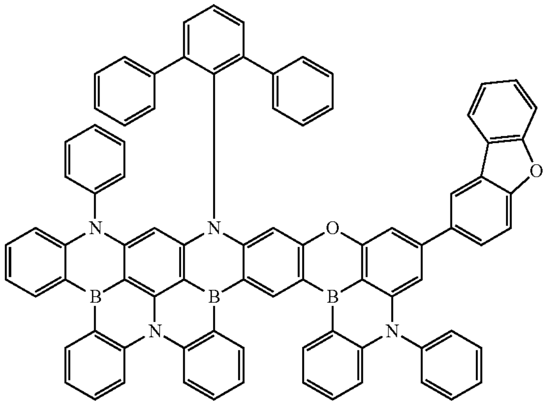
23
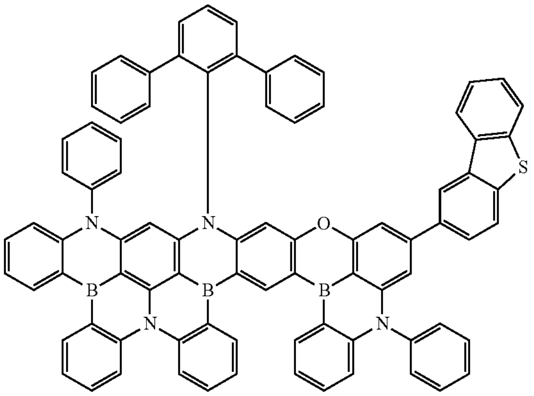
24
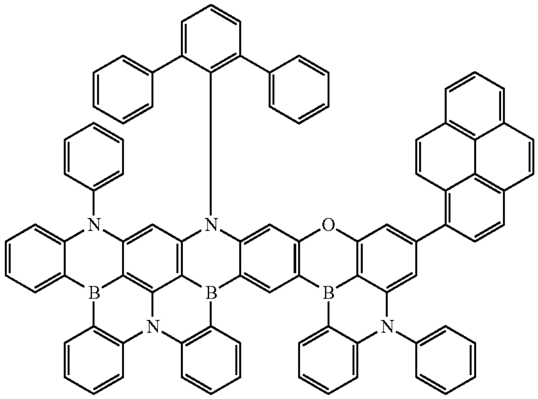
25
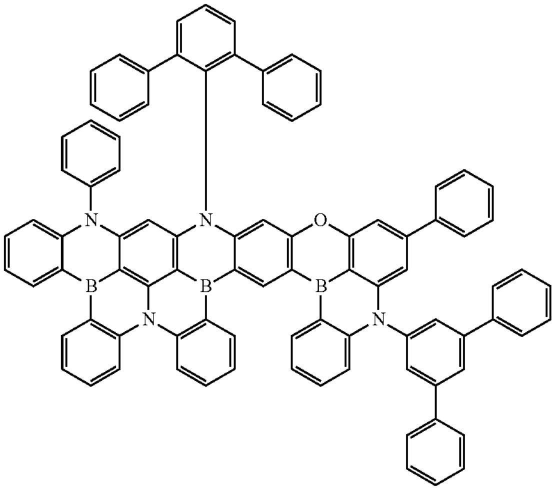
26
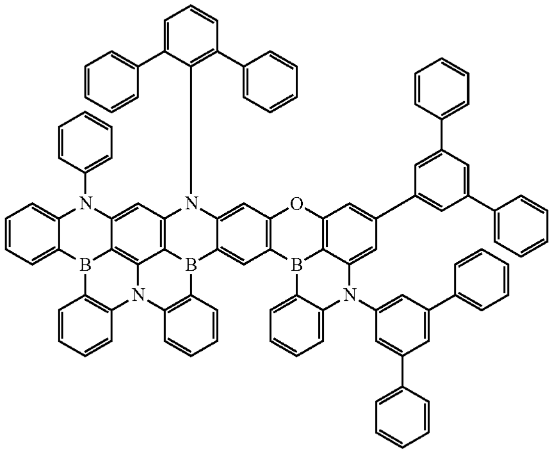
27
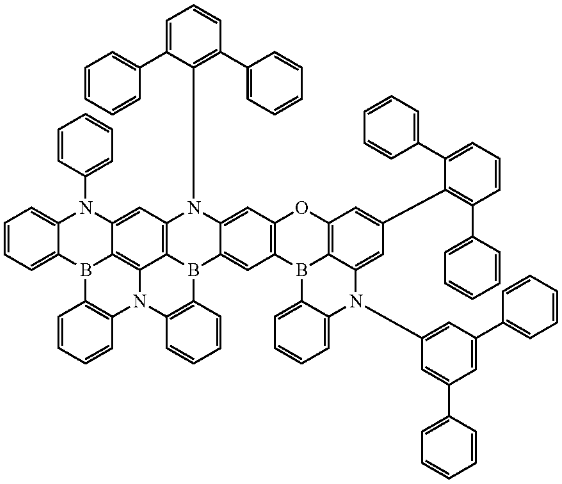

-continued
28
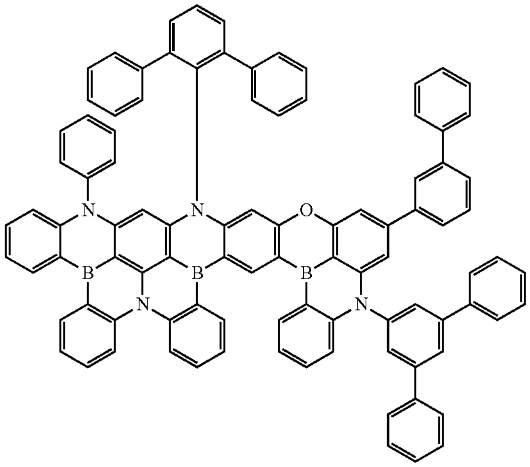
29
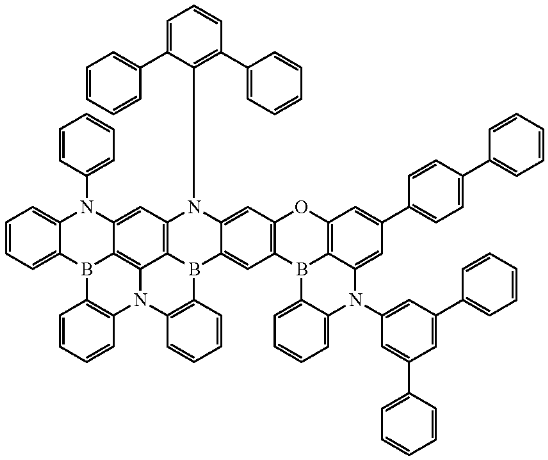
30
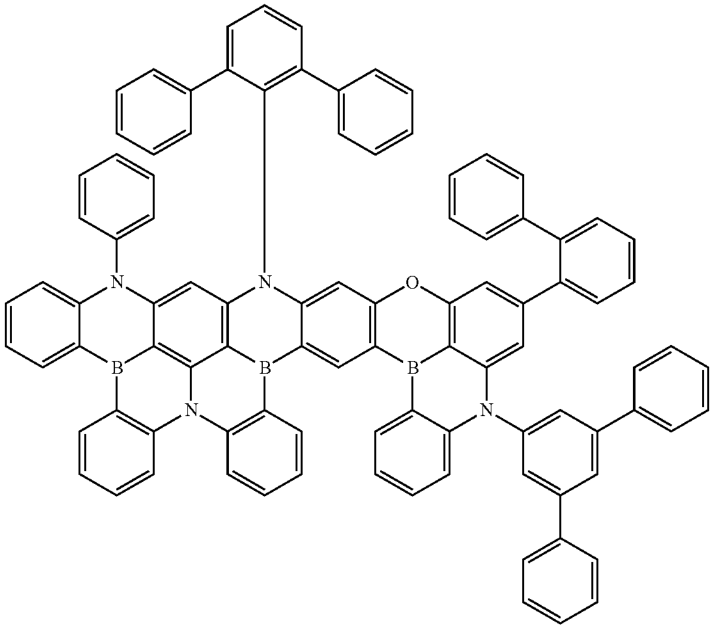

-continued
31
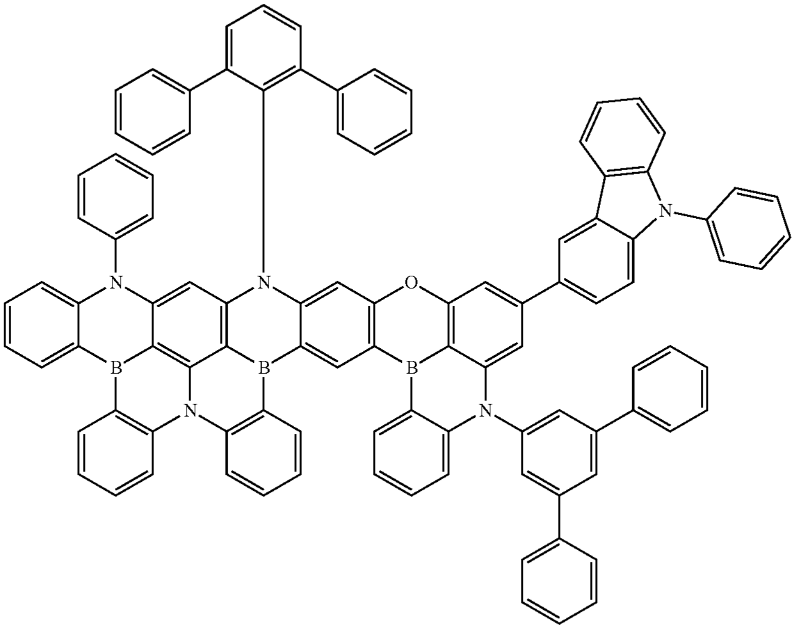
32
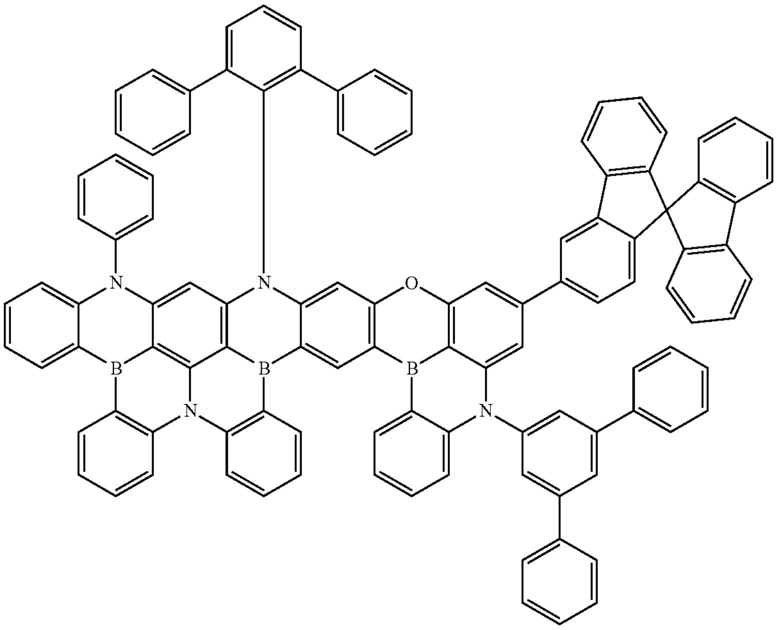

-continued
33
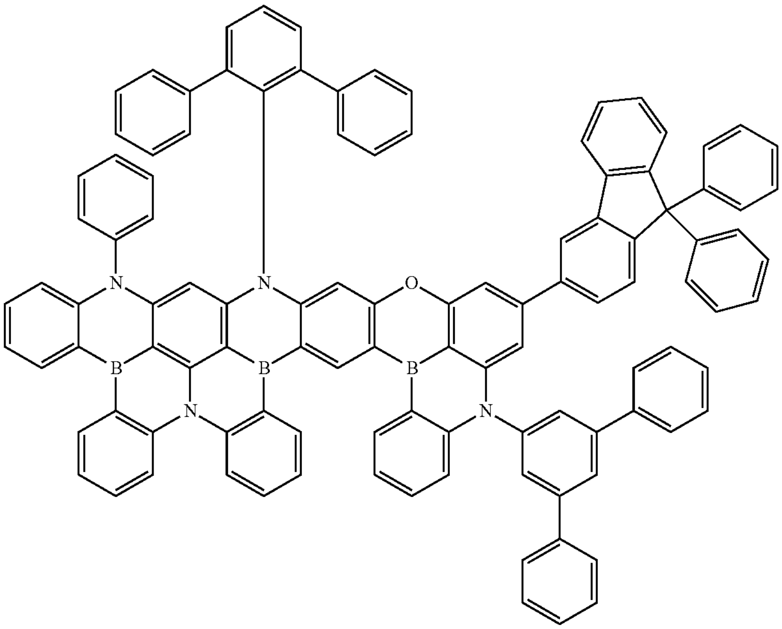
34
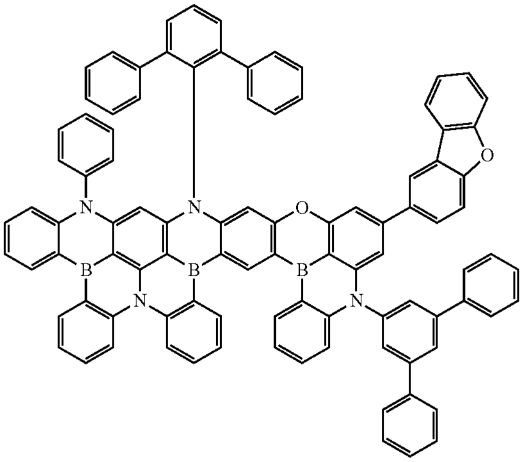
35
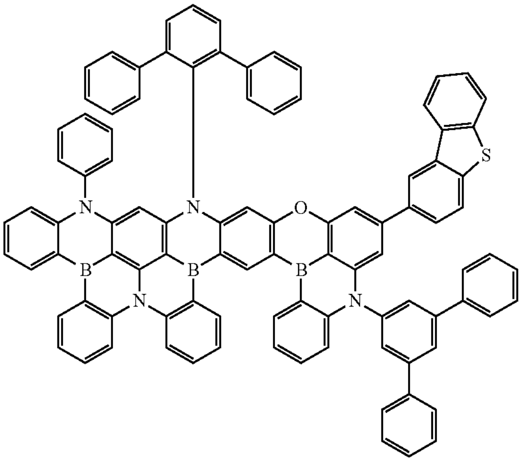

-continued

36

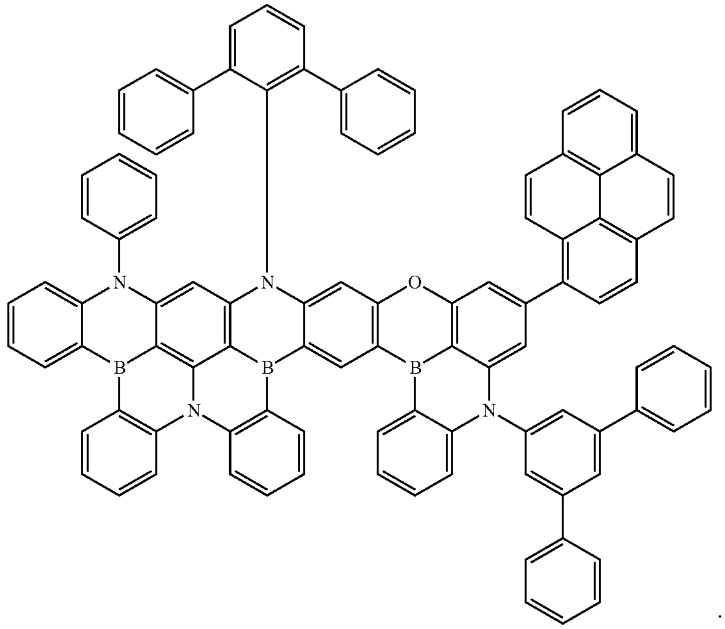

14. An organic electroluminescence device, comprising:

a first electrode;

a hole transport region disposed on the first electrode;

an emission layer disposed on the hole transport region;

an electron transport region disposed on the emission layer; and a second electrode disposed on the electron transport region, wherein the emission layer comprises a fused polycyclic compound represented by Formula 1:

[Formula 1]

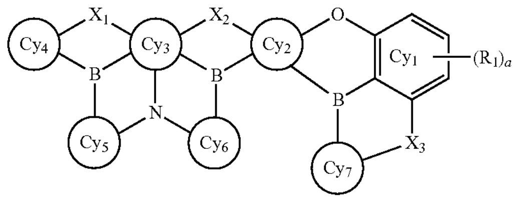

wherein in Formula 1, $Cy_2$ to $Cy_7$ are each independently a substituted or unsubstituted aromatic hydrocarbon ring, or a substituted or unsubstituted aromatic heterocycle, $X_1$ to $X_3$ are each independently $N(Ar_1)$, O, S, or Se, $Ar_1$ is a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_1$ is a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a is an integer of 1 to 3, an atom in $R_1$ that is bonded to $Cy_1$ is not nitrogen, and a bond dissociation energy between at least one $R_1$ and $Cy_1$ is equal to or greater than about 2.5 eV.

15. The organic electroluminescence device of claim 14, wherein the emission layer is a delayed fluorescence emission layer comprising a host and a dopant, and the dopant comprises the fused polycyclic compound represented by Formula 1.

16. The organic electroluminescence device of claim 14, wherein the fused polycyclic compound represented by Formula 1 is represented by Formula 2:

[Formula 2]

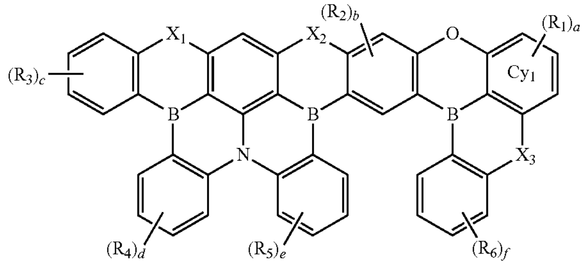

wherein in Formula 2, $R_2$ to $R_6$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, b is an integer from 0 to 2, c to f are each independently an integer from 0 to 4, and $X_1$ to $X_3$, $R_1$, and a are the same as defined in Formula 1.

17. The organic electroluminescence device of claim 16, wherein the fused polycyclic compound represented by Formula 2 is represented by Formula 3:

[Formula 3]

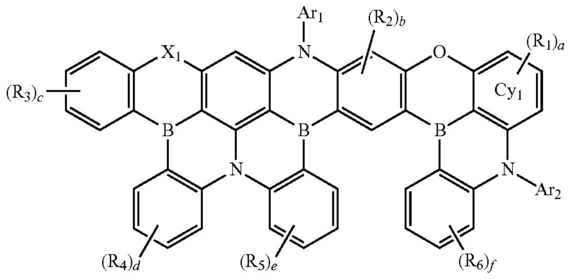

wherein in Formula 3, $Ar_1$ and $Ar_2$ are each independently a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $R_1$ to $R_6$, and a to f are the same as defined in Formula 1 and Formula 2.

18. The organic electroluminescence device of claim 15, wherein the fused polycyclic compound represented by Formula 2 is represented by the following Formula 4:

[Formula 4]

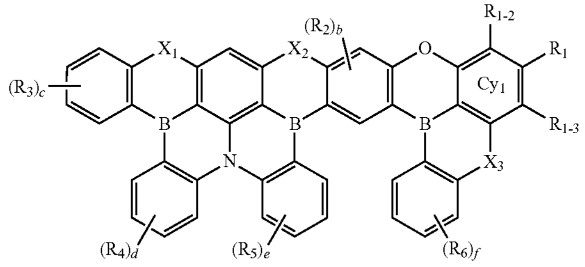

wherein in Formula 4, $R_1$ is a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_{1-2}$ and $R_{1-3}$ are each independently a hydrogen atom, a deuterium atom, a halogen atom, a cyano group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, an atom in $R_1$ that is bonded to $Cy_1$ is not nitrogen, an atom in $R_{1-2}$ that is bonded to $Cy_1$ is not nitrogen, an atom in $R_{1-3}$ that is bonded to $Cy_1$ is not nitrogen, and $X_1$ to $X_3$, $R_2$ to $R_6$, and b to f are the same as defined in Formula 1 and Formula 2.

19. The organic electroluminescence device of claim 14, further comprising an encapsulating layer disposed on the second electrode, wherein the encapsulating layer comprises at least one organic layer and at least one inorganic layer.

20. The organic electroluminescence device of claim 19, wherein the at least one inorganic layer comprises at least one selected from silicon nitride, silicon oxynitride, silicon oxide, titanium oxide, and aluminum oxide, and the at least one organic layer comprises at least one selected from an acrylic compound, an epoxy-based compound, and a photopolymerizable organic compound.

* * * * *